United States Patent
Fonseka et al.

(10) Patent No.: US 9,362,955 B2
(45) Date of Patent: *Jun. 7, 2016

(54) ENCODING AND DECODING USING CONSTRAINED INTERLEAVING

(71) Applicants: John P Fonseka, Plano, TX (US); Eric Morgan Dowling, Escazu (CR)

(72) Inventors: John P Fonseka, Plano, TX (US); Eric Morgan Dowling, Escazu (CR)

(73) Assignee: Trellis Phase Communications, LP, Plano, TX (US)

( * ) Notice: Subject to any disclaimer, the term of this patent is extended or adjusted under 35 U.S.C. 154(b) by 385 days.

This patent is subject to a terminal disclaimer.

(21) Appl. No.: 13/987,516

(22) Filed: Aug. 2, 2013

(65) Prior Publication Data

US 2015/0039963 A1 Feb. 5, 2015
US 2015/0143195 A9 May 21, 2015

Related U.S. Application Data

(63) Continuation of application No. 12/926,539, filed on Nov. 24, 2010, now Pat. No. 8,537,919.

(60) Provisional application No. 61/344,675, filed on Sep. 10, 2010.

(51) Int. Cl.
*H04L 27/00* (2006.01)
*H03M 13/29* (2006.01)
(Continued)

(52) U.S. Cl.
CPC ........ *H03M 13/2909* (2013.01); *H03M 13/253* (2013.01); *H03M 13/256* (2013.01);
(Continued)

(58) Field of Classification Search
CPC .......... H03M 13/271; H03M 13/3746; H03M 13/275; H03M 13/2771; H03M 13/1154; H03M 13/6331; H03M 13/098; H03M 13/1102; H03M 13/253; H03M 13/256; H03M 13/2742; H03M 13/2948; H03M 13/4115; H03M 13/152; H03M 13/255; G06F 11/1048
USPC ........... 375/259, 265, 267, 295; 714/752, 755
See application file for complete search history.

(56) References Cited

U.S. PATENT DOCUMENTS 4,713,817 A 12/1987 Wei
5,258,987 A 11/1993 Wei
(Continued)

OTHER PUBLICATIONS

J. Yu, M.-L. Boucheret, R. Vallet, A. Duverdier and G. Mesnager, "Interleaver design for serial concatenated convolutional codes", IEEE Commun. Letters, vol. 8, No. 8, pp. 523-525, Aug. 2004.
(Continued)

*Primary Examiner* — Khanh C Tran

(57) ABSTRACT

Serially-concatenated codes are formed in accordance with the present invention using a constrained interleaver. The constrained interleaver cause the minimum distance of the serial concatenated code to increase above the minimum distance of the inner code alone by adding a constraint that forces some or all of the distance of the outer code onto the serially-concatenated code. This allows the serially-concatenated code to be jointly optimized in terms of both minimum distance and error coefficient to provide significant performance advantages. These performance advantages allow a noise margin target to be achieved using simpler component codes and a much shorter interleaver than was needed when using prior art codes such as Turbo codes. Decoders are also provided. Both encoding and decoding complexity can be lowered, and interleavers can be made much shorter, thereby shortening the block lengths needed in receiver elements such as equalizers and other decision-directed loops. Also, other advantages are provided such as the elimination of a error floor present in prior art serially-concatenated codes. That allows the present invention to achieve much higher performance at lower error rates such as are needed in optical communication systems.

66 Claims, 17 Drawing Sheets

(51) Int. Cl.
*H03M 13/25* (2006.01)
*H03M 13/27* (2006.01)
*H03M 13/37* (2006.01)
*H03M 13/00* (2006.01)
*H03M 13/09* (2006.01)
*H03M 13/11* (2006.01)
*H03M 13/41* (2006.01)

(52) U.S. Cl.
CPC ........ *H03M13/271* (2013.01); *H03M 13/2742* (2013.01); *H03M 13/2771* (2013.01); *H03M 13/2906* (2013.01); *H03M 13/2918* (2013.01); *H03M 13/2927* (2013.01); *H03M 13/2933* (2013.01); *H03M 13/2945* (2013.01); *H03M 13/2948* (2013.01); *H03M 13/3746* (2013.01); *H03M 13/6331* (2013.01); *H03M 13/098* (2013.01); *H03M 13/1102* (2013.01); *H03M 13/1154* (2013.01); *H03M 13/4115* (2013.01)

(56) References Cited

U.S. PATENT DOCUMENTS

| | | | |
|---|---|---|---|
| 5,329,551 | A | 7/1994 | Wei |
| 5,535,228 | A | 7/1996 | Dong et al. |
| 5,548,615 | A | 8/1996 | Wei |
| 5,654,986 | A | 8/1997 | Lim |
| 6,034,996 | A | 3/2000 | Herzberg |
| 6,115,427 | A | 9/2000 | Calderbank et al. |
| 6,266,795 | B1 | 7/2001 | Wei |
| 6,351,832 | B1 | 2/2002 | Wei |
| 6,473,878 | B1 | 10/2002 | Wei |
| 6,516,037 | B1 | 2/2003 | Wei |
| 6,769,091 | B2 | 7/2004 | Classon |
| 6,857,087 | B2 | 2/2005 | Crozier et al. |
| 6,889,355 | B1 | 5/2005 | Calderbank et al. |
| 7,197,690 | B2 | 3/2007 | Shen et al. |
| 7,243,294 | B1 * | 7/2007 | Divsalar ............... H03M 13/258 714/755 |
| 7,584,400 | B2 * | 9/2009 | Gray ..................... H03M 13/03 714/755 |
| 7,827,472 | B2 | 11/2010 | Crozier et al. |
| 8,086,943 | B2 | 12/2011 | Divsalar et al. |
| 8,255,763 | B1 * | 8/2012 | Yang ..................... H04L 1/0065 714/755 |
| 8,583,982 | B2 * | 11/2013 | Kim ...................... H03M 13/29 714/752 |
| 2001/0047502 | A1 | 11/2001 | Hattori et al. |
| 2004/0025102 | A1 | 2/2004 | Yokokawa et al. |
| 2004/0246888 | A1 | 12/2004 | Peron |
| 2005/0166132 | A1 | 7/2005 | Shen et al. |
| 2005/0216819 | A1 | 9/2005 | Chugg et al. |
| 2006/0031737 | A1 | 2/2006 | Chugg et al. |
| 2007/0130494 | A1 | 6/2007 | Divsalar et al. |
| 2007/0288834 | A1 | 12/2007 | Crozier et al. |
| 2009/0125780 | A1 * | 5/2009 | Taylor ............... H03M 13/1137 714/752 |
| 2011/0078533 | A1 * | 3/2011 | Zhou .................. H03M 13/253 714/752 |
| 2013/0246884 | A1 * | 9/2013 | Lee ....................... H04L 1/0009 714/755 |
| 2014/0126674 | A1 * | 5/2014 | Petrov ............... H03M 13/1165 375/340 |
| 2014/0129895 | A1 * | 5/2014 | Petrov ............... H03M 13/1142 714/752 |

OTHER PUBLICATIONS

H.R. Sadjadpour, N.J.A. Sloane, G. Nebe and M. Salehi, "Interleaver design for turbo codes", in proc. ISIT, pp. 453, Jun. 2000.
H.R. Sadjadpour, N.J.A. Sloane, M. Salehi and G. Nebe, "Interleaver design for turbo codes", IEEE Journal of selected areas in Commun., vol. 19, pp. 831-837, May 2001.
M. Sikora and J. Costello, Jr., "Serial concatenation with simple block inner codes", in proc. ISIT, pp. 1803-1807, Jul. 2006.
S. Benedetto and G. Montrosi, "Iterative decoding of serially concatenated convolutional codes", Electronics Letters, vol. 32, No. 13, pp. 1186-1188, Jun. 1996.
S. Benedetto, D. Divsalar, G. Montrosi and F. Pollara, "A soft-input soft-output APP module for iterative decoding of concatenated codes", IEEE Commun. Letters, pp. 22-24. Jan. 1997.
J. Hagenauer, E. Offer, and L. Papke, "Iterative decoding of binary block and convolutional codes", IEEE Trans. Inform. Theory, vol. 42, pp. 429-445, Mar. 1996.
D. M. Rankin and T. A. Gulliver, "Single parity check product codes", IEEE Trans. on Commun., vol. 49, pp. 1354-1362, Aug. 2001.
X.R. Ma and Y.Y. Xu, "Iterative decoding of parallel and serial concatenated single parity check product codes", Electronics Letters, vol. 42, No. 15, pp. 869-870, Jul. 2006.
L. Ping, S. Chan and K.L. Yeung, "Efficient soft-in-soft-out sub-optimal decoding rule for single parity check codes", Electronics Letters, vol. 33, No. 19, pp. 1614-1616, Sep. 1997.
D. Rankin and A. Gulliver, "Randomly interleaved SPC product codes", in Proc. ISIT, pp. 88, 2000.
D.M. Rankin, T.A. Gulliver and D.P. Taylor, "Parallel and serial concatenated single parity check product codes", EURASIP Journal on Applied Signal Processing, pp. 775-783, Jan. 2005.
N. Seshadri and C.-E. W. Sundberg, "List Viterbi decoding algorithms with applications," IEEE Trans. on Commun., vol. 42, pp. 313-323,Feb./Mar./Apr. 1994.
S. Benedetto and G. Montrosi, "Unveiling of turbo codes: Some results on parallel concatenated coding schemes", IEEE Trans. on Inform Theory, vol. 42, pp. 409-428, Mar. 1996.
U. Wachsmann, R. F. H. Fischer and J. B. Huber, "Multilevel Codes: Theoretical concepts and practical design rules", IEEE Trans. on Inform Theory, vol. 45, 1361-1391, Jul. 1999.
A. G. Amat, G. Montrosi and S. Benedetto, "Design and Decoding of optimal high-rate convolutional codes", IEEE Trans. Inform. Theory, vol. 50, pp. 267-881, May 2004.
R.M. Tanner, D. Sridhara, A. Sridharan, T.E. Fuja, D. J. Costello, "LDPC block and convolutional codes based on circulant matrices", IEEE Trans. on Inform. Theory, vol. 50, pp. 2966-2984, Dec. 2004.
M. Esmeili and M. Gholami, "Geometrically-structured maximum-girth LDPC block and convolutional codes", IEEE Journal on Selected Areas in Communications, vol. 27, pp. 831-845, Aug. 2009.
J. Kang, Q. Huang, L. Zhang, B. Zhou and S. Lin, "Quasi-cyclic LDPC codes: An algebraic construction", IEEE Trans. on Commun., vol. 58, pp. 1383-1396, May 2010.
Y. Han and W.E. Ryan, "Low-floor decoders for LDPC codes", IEEE Trans. on Commun., vol. 57, pp. 1663-1673, Jun. 2009.
M. Lentmaier, A. Sridharan, D.J. Costello, Jr. and K. Zigangiro, "Iterative decoding threshold analysis for LDPC convolutional codes," IEEE Trans Inf. Theory, vol. 56, No. 10, Oct. 2010, pp. 5274-5289.
Fred Daneshgaran et al., "Interleaver Design for Serially Concatenated Convolutional Codes: Theory and Application," IEEE Trans. Information Theory, vol. 50, No. 6, Jun. 2004.
R.G. Maunder and L. Hanzo, "Evolutionary Algorithm Aided Interleaver Design for Serially Concatenated Codes," IEEE Trans. Comm vol. 59 No. 7, Jul. 2011.

* cited by examiner

| 1 | 2 | 3 | 4 | 5 | 6 |
| --- | --- | --- | --- | --- | --- |
| 7 | 8 | 9 | 10 | 11 | 12 |
| 13 | 14 | 15 | 16 | 17 | 18 |

Step 1

| 3 | 5 | 2 | 1 | 6 | 4 |
| --- | --- | --- | --- | --- | --- |
| 11 | 10 | 7 | 12 | 8 | 9 |
| 15 | 17 | 18 | 13 | 16 | 14 |

Step 2

| 15 | 10 | 2 | 13 | 8 | 9 |
| --- | --- | --- | --- | --- | --- |
| 11 | 17 | 18 | 1 | 16 | 4 |
| 3 | 5 | 7 | 12 | 6 | 14 |

Step 3

FIG. 9

ENCODING AND DECODING USING CONSTRAINED INTERLEAVING

This patent application is a continuation of co-pending U.S. patent application Ser. No. 12/926,539 filed Nov. 11, 2010, which claims priority to U.S. provisional patent application No. 61/344,675, entitled "Encoding and decoding using constrained interleaving," filed Sep. 10, 2010.

BACKGROUND OF THE INVENTION

1. Field of the Invention

This invention relates generally to communication encoders, decoders, transmitters, receivers, and systems. More particularly, aspects of the invention relate a family of encoders and a family of decoders that make use of constrained interleaving with various forms of serially concatenated codes.

2. Description of the Related Art

Various forms of concatenated codes are known in the art. Turbo codes are widely used and represent parallel concatenated codes. In the literature, interleaver design has been discussed with both parallel and serial concatenation but mainly in connection with parallel concatenated codes. For example, see [1] J. Yu, M.-L. Boucheret, R. Vallet, A. Duverdier and G. Mesnager, "Interleaver design for serial concatenated convolutional codes", IEEE Commun. Letters, Vol. 8, No. 8, pp. 523-525, August 2004; [2] F. Daneshgaran, M. Laddomada and M. Mindin, "Interleaver design for serially concatenated convolutional codes: Theory and application", IEEE Trans. On Inform Theory, vol. 50, No. 6, pp. 1177-1188, June 2004; [3] H. R. Sadjadpour, N. J. A. Sloane, G. Nebe and M. Salehi, "Interleaver design for turbo codes", in proc. ISIT, pp. 453, June 2000; and [4] H. R. Sadjadpour, N. J. A. Sloane, M. Salehi and G. Nebe, "Interleaver design for turbo codes", IEEE Journal of selected areas in Commun., vol. 19, pp. 831-837, May 2001, as supplied on the IDS herewith.

The above design approaches start from uniform interleaving and modify the uniform interleaver's probability distribution according to various rules. A "uniform Interleaver" is defined by a randomization operation of the form Output=Rand(Input) where Input and Output represent respective vectors of N elements, and Rand is a function that pseudo randomly permutes the order of the elements in the vector Input. In most cases, the prior art uniform interleaver is a "bit interleaver" and the elements of Input and Output represent bits. That is, the uniform interleaver is used to randomize the order of a set of input bits to create a randomized-ordered set of output bits.

While uniform interleaving or its variants as referenced above may be the best ways to construct interleavers for use with parallel concatenated codes, it would be desirable to have a different form of interleaving that takes advantage of correlations that exist in coded bits that have been formed via serial concatenation encoding. Unlike parallel concatenation, where interleaving is performed on pure uncorrelated information bits which are usually independent, in the case of serial concatenation, the interleaver is used on the coded bits of the outer code which are correlated due to the outer code. It would be desirable to have an interleaving technique for use with serial concatenation that exploits the correlation of the coded bits introduced by the outer code. It would be desirable if interleavers designed to exploit that correlation were able to have much shorter interleaver lengths while being able to perform as well or better than much longer interleavers that are designed using prior art approaches that amount to variants of uniform interleaving.

FIG. 1 shows a prior art turbo encoder. As can be seen from the parallel structure of FIG. 1, Turbo encoders are based on parallel concatenation. The message bits are replicated and processed on three (or in general, more) paths. The first path has no coding, the second path encodes the message bits with Encoder #1 which is usually a convolutional code, and the third path uniform interleaves the message bits and then encodes the interleaved message bits with Encoder #2. Three times as many bits are produced using this parallel approach, resulting in a rate ⅓ code. Code puncturing can be optionally used to increase the rate of the concatenated code. Turbo codes are usually decoded using an iterative decoder structure similar to the one shown in FIG. 5 with the constrained interleavers/deinterleavers replaced with uniform interleavers/deinterleavers. The soft decoder of FIG. 5 uses the well known BJCR algorithm or some other type of soft decoding algorithm in its soft decoding blocks.

FIG. 2 shows the serial structure of a prior art serial concatenated encoder. The message bits are first encoded by an outer encoder, then the outer-encoded bits are sent through a uniform interleaver, and the interleaved outer-encoded bits are next passed through an inner encoder. In general, more than two component codes can be concatenated together, but, without loss of generality, the discussion herein focuses on embodiments that make use of two serially concatenated component codes. The concepts presented herein can be extrapolated to these higher order cases by induction. In many practical cases the outer code is a block code or a nonrecursive convolutional code and the inner code is a recursive convolutional code. Serial concatenated codes are also usually decoded using an iterative decoder structure similar to the one shown in FIG. 5 with the constrained interleavers/deinterleavers replaced with uniform interleavers/deinterleavers.

It is known that serially concatenated codes and parallel concatenated codes can both be designed to achieve interleaver gain. "Interleaver gain" is defined as a reduction in the bit error rate as the interleaver length, N, is increased. This occurs because certain dominant error coefficients in the probability of error expression are reduced as N is increased. It is known in the art that serially concatenated codes can be designed to perform better than parallel concatenated codes with similar parameters. Serial concatenation can employ component codes that are block and/or convolutional codes. General design rules of serially concatenated codes are well known. It is generally advantageous to use an outer code that has a high minimum Hamming distance and to employ a recursive inner code. However, it is also known that even though the traditional method of serial concatenation is done using recursive inner codes, block codes can also be effectively used for the inner code as well; for example, see [5] M. Sikora and J. Costello, Jr., "Serial concatenation with simple block inner codes", in proc. ISIT, pp. 1803-1807, July 2006. Serially concatenated codes can be decoded using iterative soft decoding of inner and outer codes (using a structure similar to that shown in FIG. 5 but with a uniform interleaver such as one that may be implemented using a randomization function with a uniform distribution or e.g., see [1]-[4]).

More background information on serial concatenated codes that supports the discussion in the above paragraph can be found in: [6] S. Benedetto, D. Divsalar, G. Montorsi and F. Pollara, "Serial concatenation of interleaved codes: Performance analysis, design and iterative decoding", IEEE Trans., Inform. Theory, vol. 44, pp. 909-926, May 1998 [7] S. Benedetto, D. Divsalar, G. Montrosi and F. Pollara, "Analysis, design, and iterative decoding of double serially concatenated codes with interleavers", IEEE Journal on Selected Areas in Commun., vol. 16, No. 2, pp. 231-244. February 1998; [8] S.

Benedetto and G. Montrosi, "Iterative decoding of serially concatenated convolutional codes", Electronics Letters, vol. 32, No. 13, pp. 1186-1188, June 1996; [9] S. Benedetto, D. Divsalar, G. Montrosi and F. Pollara, "A soft-input soft-output APP module for iterative decoding of concatenated codes", IEEE Commun. Letters, pp. 22-24. January 1997; and [10] J. Hagenauer, E. Offer, and L. Papke, "Iterative decoding of binary block and convolutional codes", IEEE Trans. Inform. Theory, vol. 42, pp. 429-445, March 1996; all of which are included on the IDS submitted herewith. For further background information on both serial and parallel concatenated codes, also see S. Lin and D. Costello, Jr., *Error Control Coding: Fundamentals and Applications*, $2^{nd}$ Ed., Pearson Prentice-Hall, 2004.

Multi-dimensional SPC codes are also well known in the art. It is known that uniform interleaving can be applied in some cases to improve the performance of these codes, but not in other cases such as 2-dimensional SPC codes. See for example: [11] D. M. Rankin and T. A. Gulliver, "Single parity check product codes", IEEE Trans. On Commun., vol. 49, pp. 1354-1362, August 2001; [12] X. R. Ma and Y. Y. Xu, "Iterative decoding of parallel and serial concatenated single parity check product codes", Electronics Letters, vol. 42, No. 15, pp. 869-870, July 2006; [13] L. Ping, S. Chan and K. L. Yeung, "Efficient soft-in-soft-out sub-optimal decoding rule for single parity check codes", Electronics Letters, vol. 33, No. 19, pp. 1614-1616, September 1997; [14] D. Rankin and A. Gulliver, "Randomly interleaved SPC product codes", in Proc. ISIT, pp. 88, 2000; and [15] D. M. Rankin, T. A. Gulliver and D. P. Taylor, "Parallel and serial concatenated single parity check product codes", EURASIP Journal on Applied Signal Processing, pp. 775-783, January 2005.

It would be desirable to improve the performance of 2-dimensional SPC codes using an inventive constrained interleaver. It would be desirable to be able to use shorter interleavers to provide the same or improved performance over SPCs that currently use uniform interleavers.

In both parallel and serially concatenated codes, the design objective traditionally has been to focus on the interleaver gain that affects the error coefficient as opposed to the minimum distance of the resulting concatenated code. This makes sense when it is tolerable to employ long interleavers. However, due to the increase in the complexity, memory requirements and delay caused by long interleavers, in practice it is preferable to avoid making the size of the interleaver too large. While it would be desirable to consider the minimum distance of the overall code for short to moderate interleaver sizes, it is conventional wisdom that the joint consideration of both the minimum distance and the interleaver design is too difficult to handle [6]. It would be desirable to develop a technique to improve bit error rate performance by introducing an interleaver constraint that has the effect of jointly optimizing or otherwise jointly considering both the minimum distance and the reduction of dominant error coefficients. It would be desirable to have a new technology that used such interleaver constraints to design more efficient encoders and decoders for various forms of serially concatenated codes.

SUMMARY OF THE INVENTION

The present invention provides a family of encoders, decoders, transmitters, receivers, and methods, apparatus and systems employing the same. Aspects of the present invention subject an interleaver to a selected constraint. The constraint is selected to cause a measure of minimum distance in a serial concatenated code to increase above that of the same serially concatenated code if uniform interleaving were used instead of the constrained interleaving. The net effect of a constrained interleaver is to improve the bit error rate performance over traditionally interleaved serial concatenated codes at a given interleaver length. This allows much shorter interleavers to be used and allows new types of serial concatenated codes to be constructed that would not have their performance benefits if prior art uniform interleaving were applied.

A first aspect of the present invention relates to encoder and transmitter apparatus, methods and systems. An outer encoder is configured to transform a sequence of input bits to a sequence of outer encoded bits. The sequence of outer-encoded bits is encoded in accordance with an outer code. A constrained interleaver is configured to implement a permutation function to permute the order of the outer-encoded bits to produce a constrained-interleaved sequence of outer-encoded bits. An inner encoder is configured to transform the constrained-interleaved sequence of outer-encoded bits to a sequence of inner-encoded bits. The sequence of inner-encoded bits is encoded in accordance with an inner code. The sequence of inner-encoded bits constitutes a serially-concatenated sequence of bits that incorporates coding from both the inner code and the outer code in accordance with a serially-concatenated code that has a minimum distance of $d_{sc}$, the outer code has a minimum distance of $d_o$ and the inner code has a minimum distance of $d_i$. The constrained interleaver's permutation function implements a constraint in order to enforce $d_i < d_{sc} \leq d_0 d_i$. The distances $d_{sc}$, $d_0$ and $d_i$ can be representative of Hamming distances. In some embodiments, Euclidian distances can also be considered. While some prior art approaches may have achieved distances in the range of $d_i < d_{sc} \leq d_0 d_i$, $d_{sc}$ would have been much closer to $d_i$ than $d_0 d_i$, and this would have been due to properties of the component codes as opposed to a property of the interleaver or any constraint met by the interleaver.

In transmitter embodiments, a signal mapper is also provided that is configured to map the sequence of inner-encoded bits to a transmission signal. The signal mapper can be selected such that a measure of Euclidian distance in the serially concatenated code is greater than a corresponding measure of Euclidian distance of the serially concatenated code when implemented with a uniform interleaver.

As discussed in further detail herein, the constraint implemented by the constrained interleaver is chosen to preserve a distance provided by the outer code. The advantage of this distance is generally destroyed by a uniform interleaver, i.e., the distance of the outer code does not improve the distance of the prior art serially concatenated codes which is usually $d_{sc} = d_i$. In many embodiments of the present invention, the interleaver constraint is selected to enforce $d_{sc} = d_0 d_i$. In some alternative embodiments, the permutation function implemented by the constrained interleaver is constrained to enforce a minimum distance $d_{sc} < d_0 d_i$ such that a measure of bit error probability at least one specified signal to noise ratio is less than the measure of bit error probability at the at least one specified signal to noise ratio for a second constraint that enforces $d_{sc} = d_0 d_i$. The measure of bit error probability at the at least one specified signal to noise ratio is a function of at least one error coefficient and the reduction of the measure of the bit error probability using the constraint is caused by a reduction in an effect of the at least one error coefficient.

Constrained interleaving can be used in serially concatenated codes of various types, for example, where the outer code is a block code or a non-recursive convolutional code, or where the inner code is a non-recursive convolutional code or where the inner code is a recursive convolutional code. The permutation function of the constrained interleaver can be implemented efficiently at runtime using a stored vector of pointers in accordance with table lookup processing. That is, the reordering operation of the constrained interleaver (and/or constrained deinterleaver) is implemented by incrementing through the pointer array which encodes the reordering rule of the constrained interleaver or deinterleaver.

As is discussed herein, especially when inner recursive convolutional codes are used, additional constraints can be added to force $d_{sc} < d_o d_i$. However, these additional constraints lower the total number of allowable interleaver combinations and lower the interleaver gain. For a given application to include a particular set of codes and a particular signal mapping policy, numerical simulations can be used to determine if the additional constraints would improve the overall coding gain.

Constrained interleaving can also be applied to parallel concatenation (such as turbo codes). However, this can only guarantee that the second constituent code can spread the error events. As a result, it cannot guarantee the product of the distances for the concatenation. However, due to the improvement in the second constituent code, the constrained interleaving methods, apparatus, and systems presented herein can improve performance of parallel concatenated codes over uniform interleaving. In the case of the parallel concatenated codes, the additional constraints described in the above paragraph and in later in the description of the preferred embodiments can also be used. This provides a means to improve interleavers such as those disclosed in U.S. Pat. No. 6,857,087 due to a higher interleaver gain and due to having a target overall minimum distance to control the design.

Another aspect of the present invention involves a receiver and decoder methods, apparatus, and systems. In this patent application, the term "function instantiation" should be given a particular meaning. "Function instantiation" means an embodiment of a function implemented in hardware or software. In the case of software, a given function may be written as a piece of software, but this piece of software might be called many times using different sets of input parameters. Each call to the single function would involve a "function instantiation." In hardware, a given module that implements a function and is passed input parameters to implement the function differently can have multiple function instantiations even though only one hardware functional unit can be located in a given device.

An aspect of the present invention involves a decoder or receiver that decodes a serial concatenated code formed via constrained interleaving similar to the one discussed above, i.e., where the outer code has a minimum distance of $d_o$, the inner code has a minimum distance of $d_i$, and the permutation function implemented by a constrained interleaver function instantiation is constrained to preserve a distance provided by the outer code to enforce $d_i < d_{sc} \leq d_o d_i$.

In various exemplary receiver apparatus and method embodiments, a signal conditioning unit is coupled to receive a received signal and operative to produce therefrom a vector of bit metrics. The received signal is a received version of a transmitted signal that was serially-concatenated encoded by a serially-concatenated encoder that coupled an outer encoded bit stream via a first constrained interleaver to an inner encoder.

A first soft decoder function instantiation is provided that is operative to soft decode its input to generate a vector of extrinsic information. The first soft decoder function instantiation decodes in accordance with the inner code and the input is initially the vector of bit metrics and subsequently an interleaved vector of inner-code soft-decoded extrinsic information. A first constrained deinterleaver function instantiation is operative to deinterleave the vector of bit metrics in accordance with an inverse permutation function that is the inverse of a permutation function employed by the first constrained interleaver. The first constrained deinterleaver function instantiation produces a deinterleaved vector of bit metrics. A second constrained deinterleaver function instantiation is provided that is operative to deinterleave the vector of inner-code soft-decoded extrinsic information in accordance with the inverse permutation function. The second constrained deinterleaver function instantiation produces a deinterleaved vector of inner-code soft-decoded extrinsic information. A second soft decoder function instantiation is operative to soft decode the deinterleaved vector of inner-code soft-decoded extrinsic information using the deinterleaved vector of bit metrics to generate a vector of outer-code soft-decoded extrinsic information. The second soft decoder function instantiation decodes in accordance with the outer code. A stopping criterion function instantiation is operative to determine whether a measure of the outer-code soft-decoded extrinsic information has successfully passed a convergence test. Preferably when the convergence test fails, a constrained interleaver function instantiation is operative to interleave the vector of outer-code soft-decoded extrinsic information in accordance with the permutation function. The interleaver function instantiation produces an interleaved vector of outer-code soft-decoded extrinsic information. The inventive decoder or receiver method or apparatus applies iterative decoding to iteratively apply the first and second soft decoders until the convergence test has been met, and once the convergence test has been met, to then provide a decoded bit sequence produced by the second soft decoder function instantiation.

A second class of decoder or receiver embodiments decode the same kind of signal as discussed in the receiver/decoder embodiment discussed above. In this second class of embodiments, a list Viterbi decoder function instantiation is provided that is operative to provide a $p^{th}$ decoded sequence estimate. The list Viterbi decoder decodes in accordance with a list Viterbi algorithm based upon the inner code and p is a positive integer that is incremented as p=1, 2, . . . MaxList, where MaxList≤1 is a predefined maximum number of sequence estimates that will be output from the list Viterbi decoder. An outer code match detector function instantiation is provided that is operative to determine whether the $p^{th}$ decoded sequence estimate has successfully passed a convergence test that is based on a measure of the outer code. The receiver apparatus couples as an output the first decoded sequence estimate sequence that successfully passes a convergence test. One preferred embodiment uses parallel processing to generate the different Viterbi list sequences in parallel. In a preferred embodiment for sequential based processor embodiments, the list Viterbi decoder sequentially outputs one of the decoded sequence estimates at a time and stops decoding as soon as the match detector indicates that the convergence test has been satisfied at some value of p<MaxList.

BRIEF DESCRIPTION OF THE FIGURES

The various novel features of the present invention are illustrated in the figures listed below and described in the detailed description that follows.

FIG. 9 illustrates a constrained interleaving example using the flow chart of FIG. 6, where q=3 and m=6.

DETAILED DESCRIPTION OF THE PREFERRED EMBODIMENTS

In this patent application, various forms of serial concatenation are considered. For example, when two block codes are serially concatenated, this is referred to as SC-BC (serially concatenated block codes). When the inner code is a convolutional code, this is referred to as SCCC (serial concatenation with a convolutional code). The acronym IRCC is also used, and this stands for inner recursive convolutional code. An IRCC is a recursive convolutional code that is used as an inner code in a concatenated encoder. When the inner code is specifically a recursive convolutional code, i.e., when an IRCC is used in a serial concatenated code, this is referred to SC-IRCC (serial concatenation with an inner recursive convolutional code). As it turns out, the constrained interleavers designed for these various types of serially concatenated codes preferably require different sets of constraints to achieve the best performance. Hence the encoder and decoder designs for these various code types are described separately. Also, the term SC-CI is used to describe any of the above concatenated codes when a constrained interleaver is employed as shown in FIG. 3 and FIG. 4.

Figure 3:
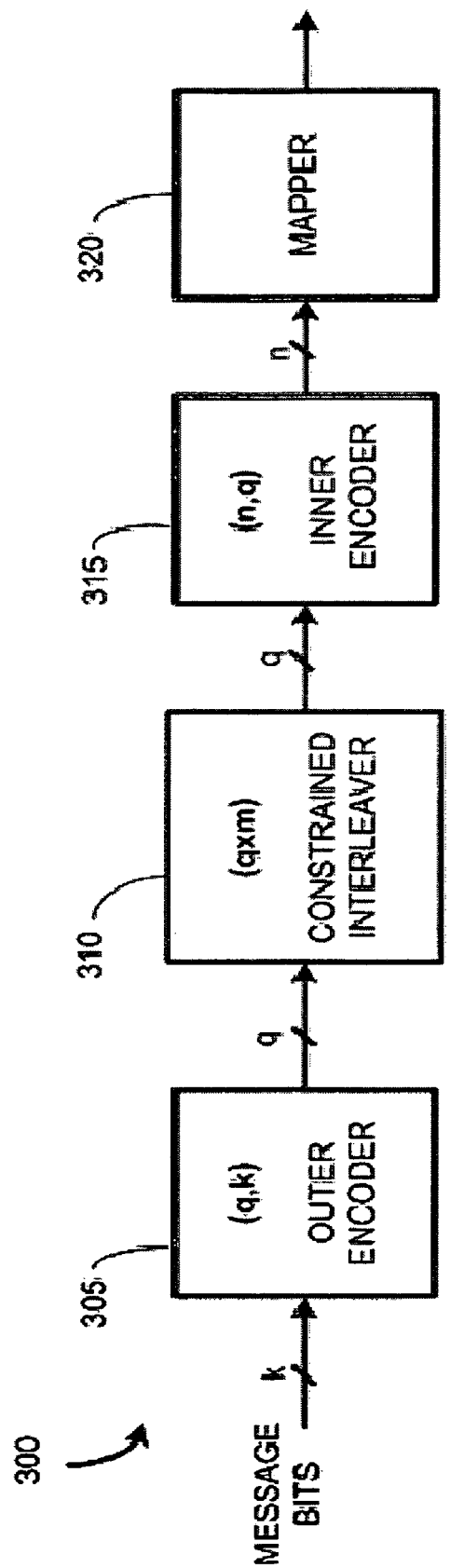
FIG. 3 is a block diagram of an embodiment of an encoder that generates a serially concatenated block code (SC-BC) using a constrained interleaver and block encoders to implement both the inner and outer codes.
Figure 4:
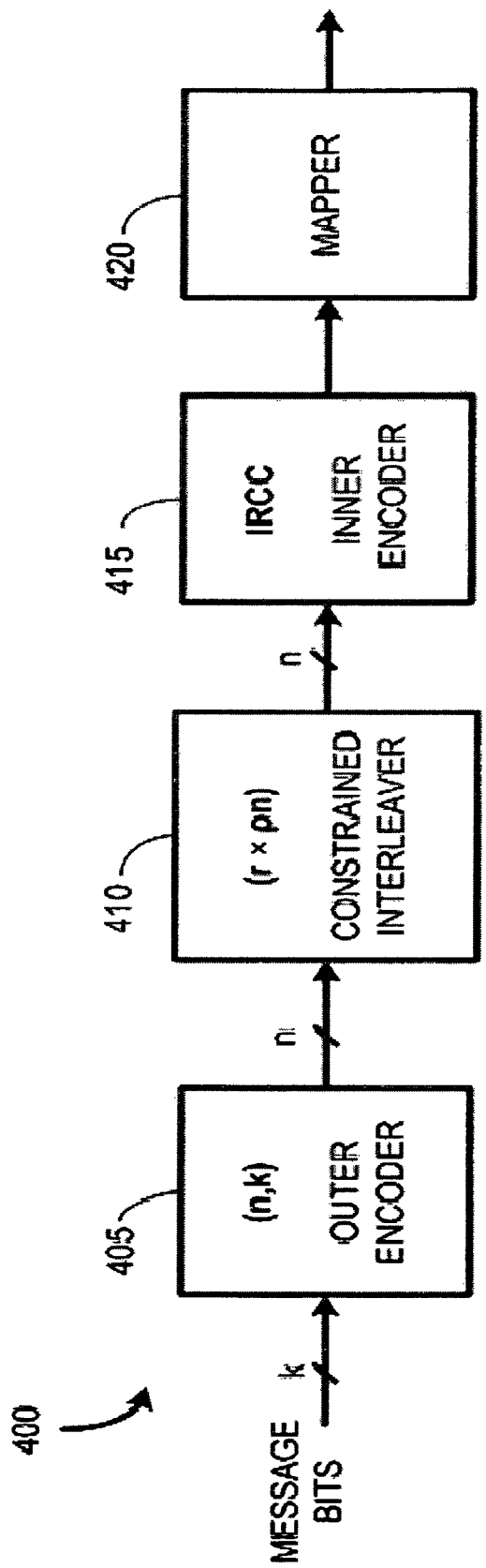
FIG. 4 is a block diagram of an embodiment of an encoder that generates a serially concatenated code with an inner recursive convolutional code (SC-IRCC) using a constrained interleaver and a recursive convolutional code as the inner code.

FIG. 3 illustrates an embodiment of a serial concatenated encoder and transmitter designed in accordance with the present invention. In general, more than two component codes can be concatenated together, but, without loss of generality, the discussion herein focuses on embodiments than make use of two serially concatenated component codes. The concepts presented herein can be extrapolated to these higher order cases by induction. FIG. 3 is an embodiment that makes use of an outer encoder 305 and an inner encoder 315 which are both block encoders. The message bit stream at the input can be considered to be a sequence of k-bit blocks which are each processed first by the outer encoder 305. The outer encoder 305 encodes according to a systematic (q, k) outer code with minimum distance $d_o$. The outer-encoded bits can be viewed as a sequence of q-bit codewords which are fed into a constrained interleaver 310. The operation of the inventive constrained interleaver 310 is discussed hereinbelow in further detail in connection with FIG. 8. The output bit stream of the constrained interleaver 310 is fed to the inner coder 315 which implements an (n, q) inner code with minimum distance $d_i$. The inner coder 315 preferably implements a systematic code. Even though systematic codes are considered here by way of example, the constrained interleaving technique presented here will work equally well with non-systematic component block codes too.

The constrained interleaver 310 can be viewed a permutation function that is applied to a vector of bits to produce an output vector of bits whose order has been altered relative to the input vector in accordance with the permutation function. Constrained interleaving differs from uniform interleaving because the permutation function is selected to meet a set of constraints that are designed to jointly improve or optimize the minimum distance and dominant error coefficients of the serially concatenated code that is output from the block 315 (or 415 as discussed below). As is discussed in connection with FIG. 8, the constrained interleaver 315 may be designed or implemented using a data structure that not only includes this bit vector, but also includes a set of memory pointers that allow hardware or software to treat the bit vector as a rectangular array. In a preferred embodiment, this rectangular array is of size (q×m) where the array elements correspond to outer-encoded bits. This allows the constrained interleaver to interleave m codewords of the outer code, or equivalently mq outer coded bits. The output of the constrained interleaver is coupled to the inner encoder 315 which applies a (n,q) block code. That is, the constrained-interleaved bits are fed into the inner encoder 315 and the output of the inner encoder 315 is a codeword of the (mn, mk) serially concatenated (block) code. In other words, there are mk input bits each serially concatenated coded frame and there are $M_{SC-BC}$=mn serially concatenated output bits each frame, where, as previously discussed, the subscript SC-BC stands for "serial concatenated block code." The constrained-interleaved SC-BC is generated as per FIG. 3 or its variants or equivalents.

The portion of the transmitter 300 minus the mapper 320 constitutes an encoder embodiment 300 that can be implemented independently of a mapper 320. In a transmitter embodiment, the bits of the (mn, mk) serially concatenated code are additionally coupled to the mapper 320. The mapper 320 maps the encoded bits onto a signal constellation selected for the specific embodiment. For example, the mapper can generate a binary phase shift keyed (BPSK) signal, a quadrature phase-shift keyed (QPSK) signal (either of which can be further subjected to a spreading signal in spread spectrum embodiments), a quadrature amplitude modulated (QAM) signal, a modulated optical signal, a magnetic recording channel signal, an orthogonal frequency division multiplexed (OFDM) signal or the like to be transmitted via wire, fiber optic, or wireless means. The output of the mapper is the transmitted signal, and thus the mapper 320 may generally also include frequency up-shifting, amplification, antenna and other components needed to transmit the mapped signal to a remote station, for example, as discussed in connection with FIG. 7.

It is noted that in OFDM embodiments, the mapper 320 can be a mapper that maps the concatenated encoded signal to a plurality of carriers. Alternatively, a separate transmitter 300 can be implemented for each subcarrier or for subsets of subcarriers. In such cases the mapper 320 may be implemented as a sub-portion of a larger mapper such as a fast Fourier transform unit that collects coded bits from a plurality of encoders like the encoder 300 and maps them in bulk onto a set of carriers.

In certain types of embodiments, the mapper 320 is an 8PSK mapper, a QAM mapper, a multidimensional code mapper are used in multidimensional trellis coded modulation applications, or any other kind of mapper used in trellis coded modulation. It is known that non-recursive convolutional codes and block codes behave in a similar manner in serial concatenation. That is, the inner coder 315 can be implemented as a finite-length, non-recursive, trellis encoder. In such applications, the performance of the serially concatenated code with inner non-recursive code will have a performance lower bound similar to serial concatenated codes based on block codes (as discussed in further detail below). Hence an inventive concept is to improve upon trellis coded modulation schemes by replacing the trellis code with the encoder of FIG. 3 where inner coder is implemented as a non-recursive trellis encoder and the outer code is then used to improve the performance of the trellis encoded modulation scheme. The constrained interleaver 310 will be relatively short. This modified trellis coded modulated signal can be sent over a channel or mapped onto one or more subcarriers in an OFDM embodiment.

Since constrained interleaving in some way controls the merging event, the best mapping policy for the mapper 320 constrained interleaving can differ with that of the same system 300 if the constrained interleaver 310 is implemented as uniform interleaver (i.e., no constrained need be satisfied as discussed below). The best mapping policy will depend on the component codes and the operating error rates. For example, if the code is used at very low error rates, the mapper should be selected to maximize the minimum Euclidean distance. However, if the application targets moderate error rates, then different terms other than the minimum distance terms may dominate the error rates. Hence, the mapping policy can be different from the one that generates the maximum minimum distance. A numerical search can be performed to find a mapping rule for the mapper 320 that minimizes the error rate for the application based on the operating conditions and parameters where the system will operate.

FIG. 4 illustrates a second type of embodiment of a serial concatenated encoder and transmitter designed in accordance with the present invention. In general, more than two component codes can be concatenated together, but, without loss of generality, the discussion herein focuses on embodiments that make use of two serially concatenated component codes. The concepts presented herein can be extrapolated to these higher order cases by induction. A characterizing feature of the embodiment of FIG. 4 is that it makes use of an inner encoder 415 that encodes its input bit stream in accordance with an IRCC as shown in FIG. 4. The embodiment of FIG. 4 makes use of an outer encoder 405 that encodes k-bit blocks of the message bits according to an (n,k) block code. As is discussed below, alternative embodiments can be formed where the outer encoder 405 is implemented as a non-recursive convolutional encoder. In still other embodiments the outer encoder 405 can implement a recursive convolutional code. In general, any kind of code can be used by the outer encoder 405, but block codes and non-recursive convolutional codes are believed to be the preferred embodiments at this time. However, in a broader family of embodiments of which FIG. 4 is one example, the inner encoder 415 is always implemented as an IRCC. If block 415 of FIG. 4 is altered in a way that the IRCC is replaced with a non-recursive convolutional code, this is referred to as an SCCC and such embodiments are also contemplated and discussed below.

Focusing specifically on the embodiment of FIG. 4, the message bit stream at the input can be considered to be a sequence of k-bit blocks which are each processed first by the outer encoder 405 which encodes according to a systematic (n,k) outer code with minimum distance $d_0^f$. The outer-encoded bits can be viewed as a sequence of n-bit codewords which are fed into a constrained interleaver 410. The operation of the inventive constrained interleaver 410 is discussed hereinbelow in further detail in connection with FIG. 13. As discussed in more detail below, the implementation of the constrained interleaver 410 is different than the implementation of the constrained interleaver 310. That is, the constrained interleavers 310 and 410 implement different sets of constraints in order to improve bit error rate performance in the presence of the different types of inner codes implemented by the inner encoders 315 and 415. The constraints are designed to jointly increase the concatenated code's minimum distance and to reduce the effect of dominant error coefficients. The bit error rate performance is a function of both the minimum distance of the concatenated code and the error coefficients as is discussed in further detail below.

The output bit stream of the constrained interleaver 410 is fed to the inner coder 415 which implements the IRCC with a minimum distance $d_f^i$. The constrained interleaver 410 can also be viewed as a permutation function that operates on a vector of bits, but this time the length of the vector is rρn where n is defined as above, r corresponds to the number or rows in the constrained interleaver 415, and ρ corresponds to the number of codewords of the outer code per row in the constrained interleaver 415. Conceptually, the bit vector that the constrained interleaver 415 permutes can be viewed as rectangular array is of size (r×ρn) where the array elements correspond to outer-encoded bits, loaded into the array in row-major order. Equivalently, this rectangular array can be viewed as an array of size (r×ρ) where the array elements correspond to n-bit codewords. This allows the constrained interleaver to interleave rρn outer coded bits. The output of the constrained interleaver is coupled to the inner encoder 415 which encodes according to the IRCC. That is, the constrained-interleaved bits are fed into the inner encoder 415 and the output of the inner encoder 415 is a valid coded sequence of the SC-IRCC, i.e., a constrained-interleaved serially concatenated code that employs an IRCC.

As is discussed in connection with FIG. 13, the constrained interleaver 415 may be implemented as a data structure that not only includes this bit vector, but also includes a set of memory pointers that allow hardware or software to treat the bit vector as a rectangular array. At runtime, the pointer arrays (table lookup addressing) may be used to allow the permutation to be rapidly implemented according to a predetermined pseudo randomization. Likewise, bits along columns can be efficiently accessed using pointer arrays that point to the column elements of each column. That is, the array structure of the constrained interleaver is a mathematical concept and may be implemented in various efficient ways in hardware and/or software. Vectors of pointers can be used to point to rows, to point to elements down a column of an array, or can be used to store a reordering rule for the entire permutation function implemented by an interleaver such as a constrained interleaver. In all cases, table lookup processing is used to speed up interleaver operations for use in real time operation.

The length of the concatenated coded sequence at the output of the IRCC 415 will preferably be $M_{SC\text{-}IRCC}=(r\rho n+\eta)/R_i$, where $\eta$ is the memory size of the inner code, $R_i$ is the rate of the IRCC, and $\eta$ number of bits are added at the end of each rρn-length frame to terminate the frame, i.e. to force the final state of the IRCC to the zero state. The subscript SC-IRCC refers to a serially concatenated (SC) code that uses IRCC as shown in FIG. 4. It should be noted that the overall rate of the SC-IRCC output from the encoder 415 will be approximately (ignoring the effects of $\epsilon$) $R=R_0 * R_i$ where $R_o=k/n$ which is the rate of the (n,k) outer code of the outer encoder 405 and $R_i$ is the rate of the IRCC.

Figure 7:
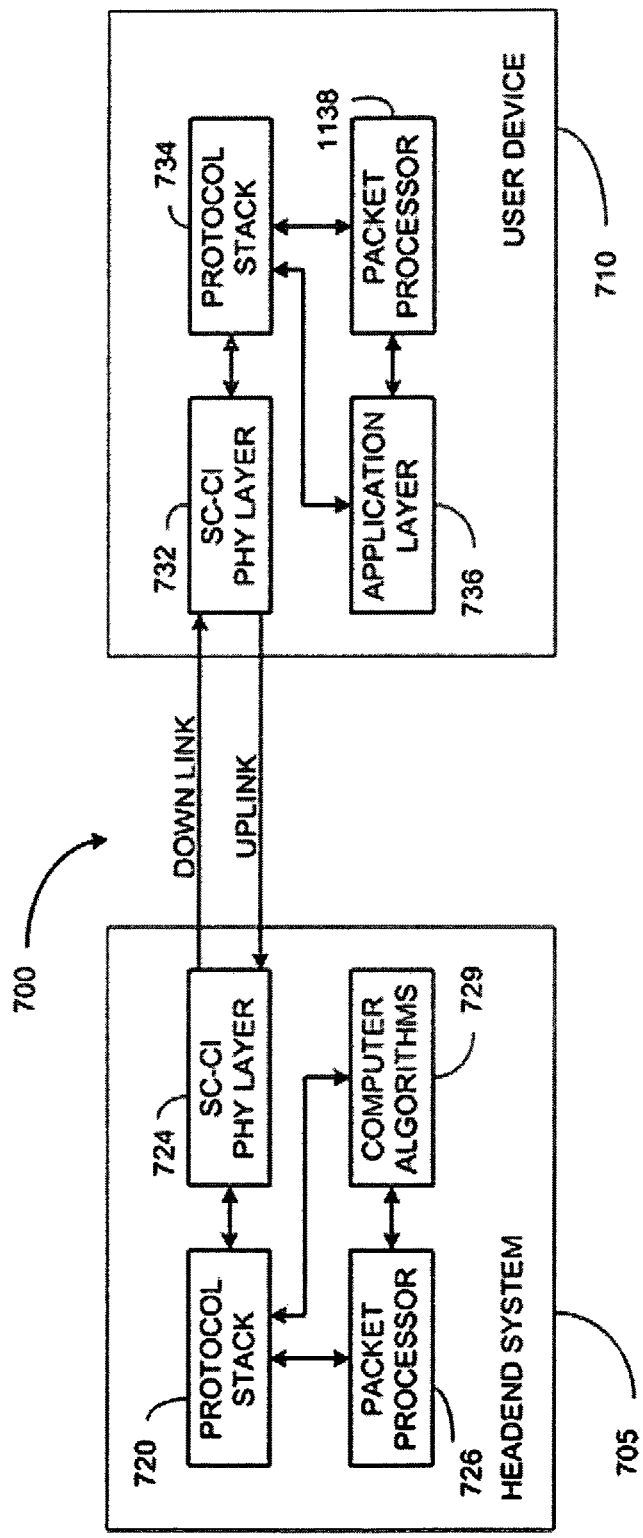
FIG. 7 is a block diagram of an exemplary communication system and method including two transmitters and two receivers that make use of the serial concatenation coding with constrained interleaving in order to communicate between communication endpoint stations.

The above paragraph describes an SC-IRCC encoding operation that uses constrained interleaving. This encoding can be implemented independently of the mapping operation described below. In a transmitter embodiment, the $M_{SC\text{-}IRCC}$ output bits from the inner encoder 415 are additionally sent to a mapper 420 which can be implemented similarly to any of the embodiments of the mapper 320 discussed above. The output of the mapper 420 is an SC-IRCC transmitted signal. FIG. 7 describes transmitters, receivers, and systems that make use of either the SC-BC or SC-IRCC transmitted signals as generated by respective the mapper 320 or 420.

As previously mentioned, the inner code can be selected to be a trellis code which corresponds to a non-recursive convolutional code (possibly a multidimensional trellis code) and the mapper 320 can be selected, for example to be a QAM mapper. In such cases, the outer code 305 and the constrained interleaver 310 can be selected to produce an improved form of trellis coded modulation. While a trellis coded modulation may be improved by using the target trellis code as the inner code in the inner encoder 315, and designing the transmitter 300 to improve the performance of this trellis code, it may be more desirable to instead build an improved trellis coded modulation scheme with a different inner code. For example, it is known that SC-IRCC performs better than serial concatenation with non-recursive convolutional codes. Therefore, the transmitter 400 can be used with a QAM mapper for example to generate a new coded modulation scheme that uses a selected SC-IRCC instead of a non-recursive trellis code. This modified coded modulation signal can be sent over a channel or mapped onto one or more subcarriers in an OFDM embodiment. The design and implementation of such coded modulation schemes using the transmitter apparatus 400 is contemplated for certain embodiments of the present invention.

Figure 5:
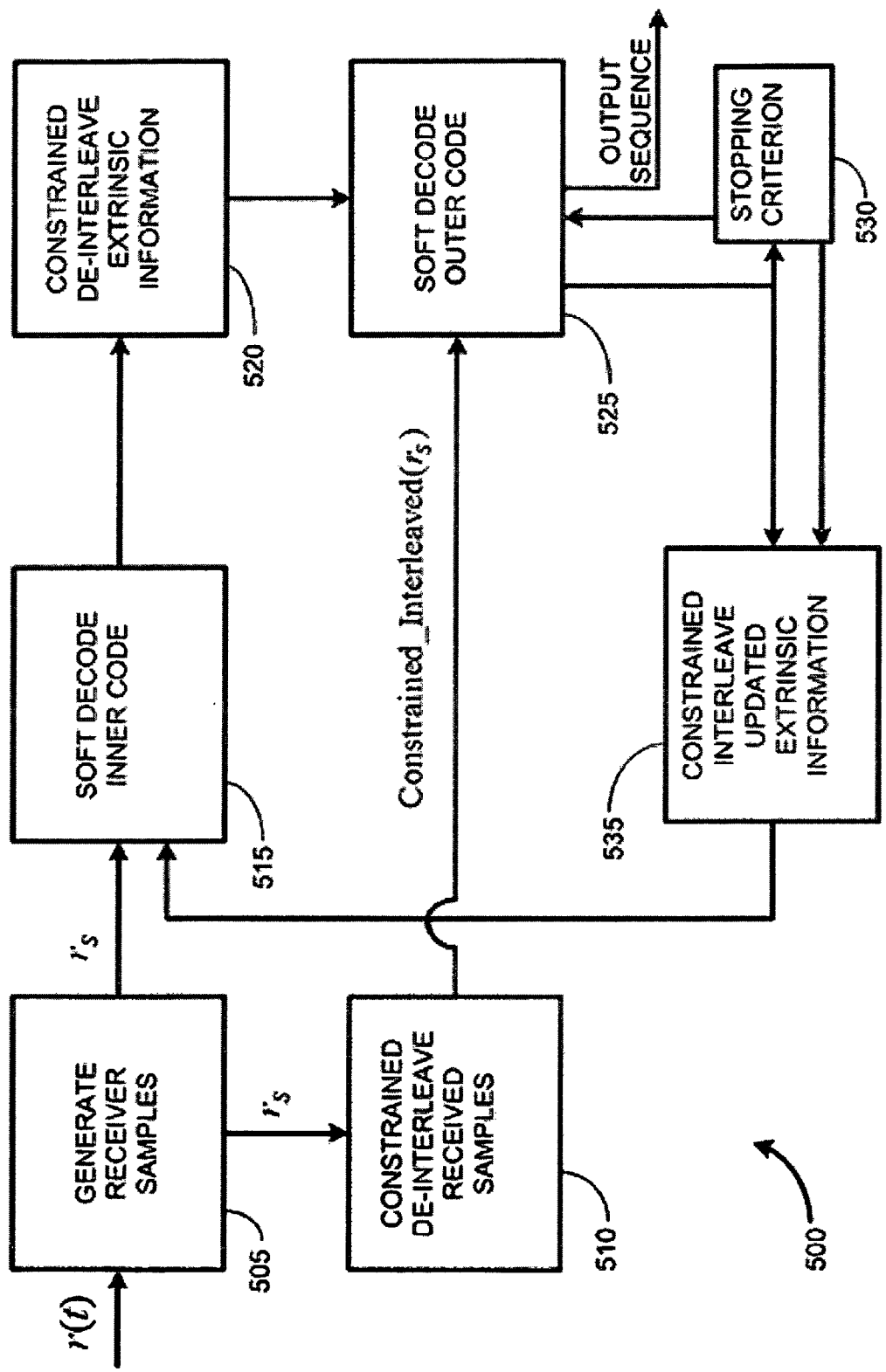
FIG. 5 is a block diagram of an embodiment of a soft iterative decoder that makes use of constrained interleaving and constrained deinterleaving to decode SC-BCs or SC-IRCCs that have been generated in accordance with constrained interleaving.

FIG. 5 shows a receiver method and apparatus for a receiver 500 used to receive and decode a signal r(t) which was generated in accordance with either of FIG. 3 or FIG. 4 or any of their variants or equivalents. For example, assuming one of the mappers 320 or 420 were used and the transmitted signal was transmitted across a communication channel, then the signal r(t) represents the received version of the transmitted signal as observed at the receiver 500. Block 505 processes or otherwise demodulates r(t) to generate an initial vector $r_S$, which preferably corresponds to a vector of bit metrics. As is known in the art, a bit metric is a logarithm of a ratio of the probability that a given bit is a one divided by the probability the same bit is a zero. The length of the vector $r_S$ is $M_{SC\text{-}BC}$ when r(t) is originated from the transmitter or encoder of FIG. 3, and is of length $M_{SC\text{-}IRCC}$ when r(t) is originated from the transmitter or encoder of FIG. 4. Note that if non-binary modulation such as QAM is being used, each symbol will de-map to a given set of bits, each of which will be represented by their respective bit metrics in the vector $r_S$. The bit metrics are preferably used by the component codes for a-posteriori probability (APP) decoding.

The portion of the receiver 500 minus the demodulator block 505 corresponds to a decoder structure which may be implemented or used independently of the demodulator block 505. In pure decoder method or apparatus embodiments which are contemplated herein, the receiver 500 minus the block 505 is referred to as the decoder 500. Any discussion herein of the receiver 500 that does not explicitly involve the block 505 also describes the decoder 500 for embodiments where just a decoder is implemented.

The receiver 500 is preferably configured as follows. The receiver block 505 can include any combination of a demodulator, signal conditioning, and bit detector of any variety, to include a soft bit detector that provides bit metrics as are known in the art. However, an aspect of the present invention is to implement the receiver block 505 using shorter block lengths than can be used by prior art systems. For example, if a current standard requires a length N=2000 interleaver, the equalizer, channel estimator, or joint channel estimator/decoder would need to operate on data blocks on the order of length N=2000. If an SC-BC or SC-IRCC is used with a constrained interleaver can achieve the same bit error rate performance, then the equalizer, channel estimator, or joint channel estimator/decoder used in block 505 would be able to operate on data blocks, for example, on the order of length N=200. Likewise, any decision-directed loops in the receiver block 505 would be implemented with the shorter block length. Decision directed loops include a decision feedback equalizer, or decision directed timing recovery loops, for example.

The output of the block 505 couples to an inner code soft in soft out (SISO) decoder 515 for soft decoding and a constrained deinterleaver 510. The inner code soft decoder 515 implements a known soft decoding algorithm such as the BCJR algorithm, a soft output Viterbi algorithm (SOVA), or uses a soft decoding method available for the decoding of LDPC codes, for example. Such algorithms are known to generate extrinsic information which is indicative of the reliability of the soft decoded results. If the soft decoder 515 (or 525) involves an iterative soft decoder like the BCJR algorithm, then one forward and one backward pass through the BCJR algorithm is made for each pass through the overall iterative decoder structure 500. If the soft decoder 515 (or 525) is an LDPC decoder, then as discussed below, it may be desirable to only run one LDPC iteration between variable and check nodes instead of multiple LDPC iterations per pass through the overall iterative decoder 500.

The inner code soft decoder 515 couples its extrinsic information output to a constrained deinterleaver which deinterleaves the extrinsic information received from the inner code soft decoder 515. An outer code soft decoder 525 is coupled to receive the deinterleaved extrinsic information from the constrained deinterleaver 520 and the deinterleaved bit metric (or other type of sample) sequence from the constrained deinterleaver 510. The outer code soft decoder 525 also implements a known soft decoding algorithm such as the BJCR algorithm, the SOVA, or an LDPC decoder, for example. In general, the same or different soft decoding algorithms can be used in the blocks 515 and 525; however the block 515 will operate to soft decode the inner code while the block 525 will operate to soft decode the outer code. The outer code soft decoder 525 couples its output extrinsic information to a stopping criterion block 530. If the stopping criterion block 530 determines that another iteration is needed, the outer code soft decoder 525 also couples its output extrinsic information to a constrained interleaver 535. The output of the constrained interleaver 535 is coupled as an input to the inner code soft decoder 515. If the stopping criterion block 530 determines that another iteration is not needed, then the outer code soft decoder 525 outputs the decoded output sequence and iterations are halted.

The receiver 500 and the decoder 500 operate slightly differently depending on whether the coding is performed as SC-BC or SC-IRCC, i.e., according to FIG. 3 or FIG. 4 respectively. In both cases, the implementation of the soft decoders 515 and 525 and the stopping criterion checker 530 can be implemented using prior art methods so the detailed operation of these blocks is not described herein as it is well known to those skilled in the art. Because the operation of the receiver 500 is different for the SC-BC and SC-IRCC cases, the operation of each case is described separately below.

For the case where receiver 500 is configured to decode an SC-BC, i.e., the inner code is a block code, the soft decoding of the inner code in the block 515 may be performed according to the following actions: 1) Arrange the received symbols in a (n×m) array by feeding the received samples or metrics along columns. Soft decode each column separately using the inner code. All m columns can optionally be decoded in parallel to speed up the decoding. For each of the q message bits of each n-codeword, the soft decoding process will generate q elements of extrinsic information. Once the soft decoding of all m codewords is complete, a (q×m) array of extrinsic information that corresponds to the constrained interleaved bits will available. It should be noted that different memory organizations such as list structures and other data structures may be used that hold the interleaved locations of m n-bit inner codewords. All such equivalent data structures are contemplated, but to keep the discussions herein focused, the array implementation is described herein by way of example.

For the case where receiver 500 is configured to decode an SC-IRCC, i.e., the inner code is an IRCC, the inner code can be soft decoded by feeding in all of the $M_{SC\text{-}IRCC}$ bit metrics into the inner decoder 515. Soft decoding of the IRCC can be done by either using the BCJR of the SOVA or some other soft decoding algorithm as discussed above. After the decoding of the inner code, an r×ρn array of extrinsic information corresponding to the constrained interleaved bits will be available. The decoded extrinsic information may be mapped explicitly (or implicitly via memory indirection) to the r×ρn array in column-major order. Alternatively, an output vector of extrinsic information may be left in vector form and inverse-permuted as described below.

The constrained deinterleavers 510, 520 perform the inverse operation of the respective constrained interleaver 310 or 410 or 535 depending on whether an SC-BC or an SC-IRCC is being decoded in the receiver 500. Once the constrained interleaver is constructed as discussed in connection with FIG. 8 and FIG. 13, the constrained interleaver can be viewed as having applied a particular permutation function that is constrained to preserve certain coding properties as discussed below. That is, the constrained interleavers 310 and 410 merely rearrange the bits of the length $M_{SC\text{-}BC}$ or $M_{SC\text{-}IRCC}$ vector of bits. The constrained deinterleaver then simply performs the inverse permutation that was performed by the corresponding constrained interleaver. If a bit vector X is permuted to a bit vector Y by the constrained interleaver, then any of the deinterleavers 510, 520 rearrange the bits in vector Y to restore the original bit ordering of the vector X. As discussed above, once the permutation is known, such permutation functions and inverse permutation functions can be implemented using lookup tables that can be incremented through to access a sequence of pointers that directly provide the desired reordering rule.

Next the outputs of the deinterleavers 520 and 510 are coupled to the outer code soft decoder 525. The outer code soft decoder 525 uses the de-interleaved extrinsic information and the de-interleaved received bit metrics to soft decode the outer code. Again, a standard known soft decoding algorithm like the BJCR algorithm or the SOVA can be used. When decoding a SC-BC, the codewords of the outer code can be soft decoded by individually decoding each of the m outer block codewords separately. Optionally these individual block codewords can be decoded in parallel to speed up the decoding. If the outer code is an IRCC, the outer code can be soft decoded by processing the received metrics or samples and the soft information coupled to the outer code soft decoder 525 by the deinterleavers 510 and 520. The soft decoding performed by the outer code soft decoder can be based upon the BJCR algorithm, the SOVA, or some other known soft decoding algorithm. In both the SC-BC and SC-IRRC cases, the extrinsic information output of outer code soft decoder 525 is analyzed in block 530 to see if a convergence/stopping criterion has been met. If the stopping criterion has been met, decoding stops and the decoded output sequence is coupled to an output from the outer code soft decoder 525.

If the stopping criterion has not been met, the extrinsic information output of the outer code soft decoder 525 is then constrained interleaved again in block 535 using the respective type of constrained interleaving as described in connection with FIG. 8 and FIG. 13, depending on whether the receiver 500 is decoding an SC-BC or an SC-IRCC. The above decoding process is repeated until convergence is met or until it reaches the highest allowable number of iterations. It is noted that the deinterleaving operation 510 need only be performed on the first iteration of this decoding process because the sequence $r_S$ does not change from one iteration to the next.

Figure 6:
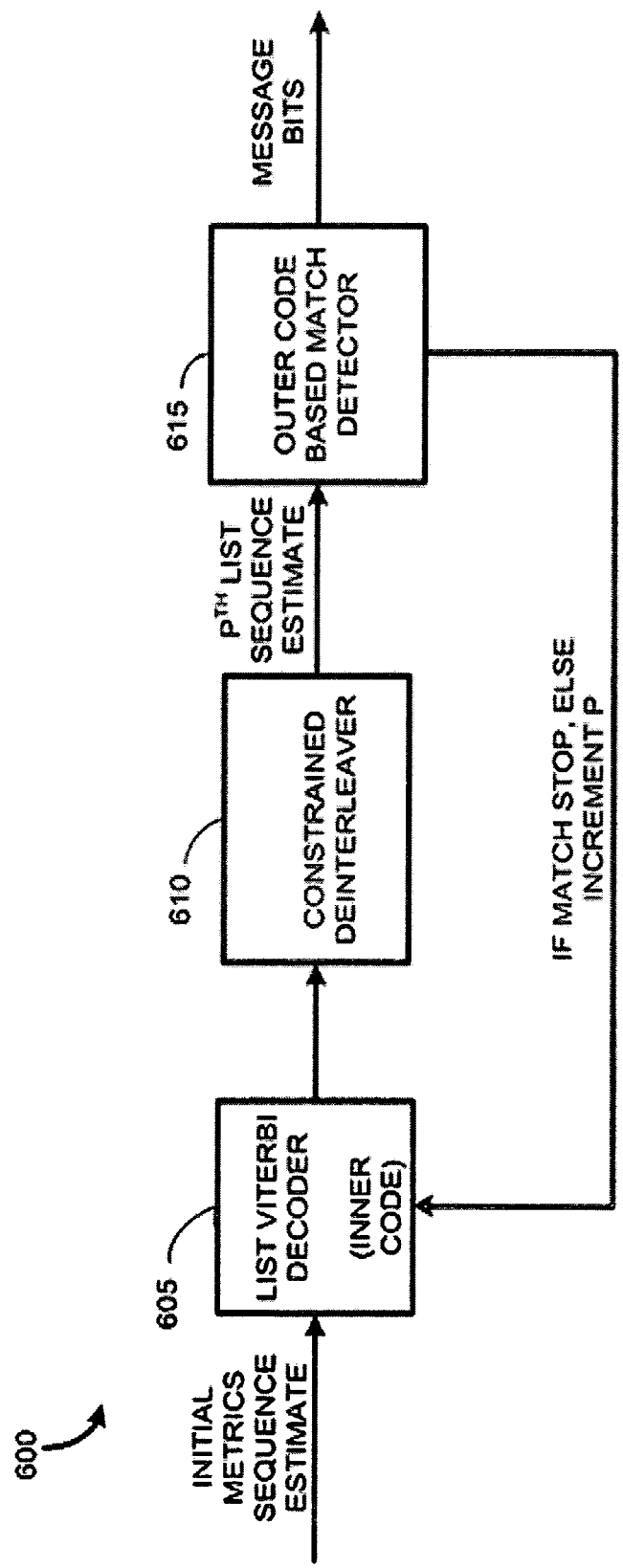
FIG. 6 is a block diagram of an embodiment of list Viterbi decoder based decoder system used to decode a serially concatenated code as produced by one of the encoders of FIG. 3 or FIG. 4 or their variants or equivalents.

FIG. 6 illustrates an alternative decoding method 600 and a decoding apparatus 600 for efficiently decoding a constrained-interleaved SC-IRCC where the outer code is a block code similar to the embodiment shown in FIG. 3. The block 505 can be added to the decoder 600 to create a receiver 600. The embodiment of FIG. 6 is based on the list Viterbi algorithm (LVD) which is less computationally complex to implement than the BJCR algorithm or many other iterative decoding algorithms used for serially concatenated codes. List Viterbi decoding is well known to those skilled in the art, see for example: [16] N. Seshadri and C.-E. W. Sundberg, "List Viterbi decoding algorithms with applications," IEEE Trans. on Commun., vol. 42, pp. 313-323, February/March/April 1994. Also see the references cited therein. Therefore, the detailed implementation of the LVD itself will not be described herein.

Returning to FIG. 6, an initial metrics sequence estimate is output from a receiver portion like the block 505 of FIG. 5. The initial metrics may be measured at the bit or symbol level and measure distance away from a set of constellation point values which can be binary or M-ary in general. The initial metrics are fed to an LVD block 605. The LVD 605 is preferably configured to sequentially output an ordered list of probable decoded sequences starting from the most probable sequence which is the decoded sequence that would be obtained from normal Viterbi decoding. The LVD output sequence is then sent through a constrained deinterleaver 610 and then coupled to an outer block code based match detector 615 where it is used to check to see if the current sequence generated by the LVD corresponds to valid codewords of the outer code. If the current sequence does not match the outer code, then the next sequence in the list is produced by the LVD and is similarly checked until a match is found or a maximum list length is reached. The checking of some or all $r\rho$ codewords can be optionally done in parallel. If no match is found, the sequence with the lowest error metric is selected to be the decoded output sequence. An alternative embodiment is to allow the LVD 605 to output a list of sequences and to then use the block 615 to identify the most probable list sequence using the outer code matching process described above.

Again consider trellis coded modulation embodiments where the transmitter 320 is implemented with an inner code that corresponds to a non-recursive trellis code. Many prior art trellis coded modulation systems use a non-recursive convolutional code (in many cases a multi-dimensional trellis code. It is noted that a traditional trellis code is a nonrecursive convolutional code followed by a mapper similar to the mapper 320. These codes can be analyzed in terms of their Euclidean distance. In presence of a mapper a serially concatenated code produced by the transmitter 300 where the inner code corresponds to a non-recursive trellis code can be analyzed in terms of Euclidean distance instead of the Hamming distance. Such an analysis is presented towards the end of this patent application. The transmitter 300 can be implemented with a non-recursive trellis code in the inner encoder 315 with the mapper 320 to generate a modified type of trellis encoded modulation in accordance with an aspect of the present invention. This can significantly improve the bit error rate performance of known trellis codes (including multi-dimensional codes), because the outer code 305 and the constrained interleaver 310 can be configured to improve the minimum Euclidian distance of the concatenation while keeping the error coefficient low as is discussed in further detail below.

For example, if a single parity check (SPC) code is used in the outer code with a known trellis code in the inner encoder 315, the minimum Euclidean distance can be increased by a factor 2 thereby targeting a performance gain close to 3 dB (a more powerful outer code could be used if further gain is required or desired, or to enable a simpler trellis code to be selected as the inner code). The actual gain can be lower due to the reduction in the error rate and increase in the error coefficient, but this loss will be made small by the use of the constrained interleaver of a relatively small length. In order to achieve this performance improvement the receiver can be configured in accordance with either FIG. 5 or FIG. 6 or some variation or equivalent thereof. If the receiver is implemented as per FIG. 5, the receiver will soft decode the trellis code and the outer code and run iterations between the two decoders. If the receiver is implemented as per FIG. 6, the receiver will use LVD decoding of the inner trellis code and find the list item that matches the outer code.

FIG. 7 shows a higher level systems architecture 700 into which any of the SC-CI (serial concatenation with constrained interleaving) techniques described herein may be used. A headend system 705 transmits via a downlink channel to user device 710. The user device 710 transmits back to the headend system 705 via an uplink channel. The headend system comprises a protocol stack 720 which includes a physical layer 724. The physical layer or a coding layer just above the physical layer implement SC-BC or SC-IRCC using constrained interleaving in accordance with the present invention. The headend system also may include a control and routing module to connect to external networks, databases, and the like. The headend system also contains a computer control module 729 which comprises processing power coupled to memory. The computer control module 729 preferably implements any maintenance functions, service provisioning and resource allocation, auto-configuration, software patch downloading and protocol version software downloads, billing, local databases, web page interfaces, upper layer protocol support, subscriber records, and the like.

The user terminal 710 similarly includes a physical layer interface 732, a protocol stack 734 and an application layer module 736 which may include user interface devices as well as application software. The user terminal 710 also may optionally include a packet processor 738 which can be connected to a local area network, for example. The user 710 terminal may also act as an IP switching node or router in addition to user functions in some embodiments.

Another type of embodiment replaces the headend system 705 with another user device 710 in which case direct peer-to-peer communications is enabled. In many applications, though, the headend can act as an intermediary between two user devices to enable indirect peer-to-peer communications using the same headend-to/from-user device uplink/downlink architecture illustrated in FIG. 7. Also, a plurality of networked headends may be employed to the same effect, for example, in a cellular communication system (where the headends are implemented as cellular base stations).

In a preferred embodiment as directly illustrated by FIG. 7, at least one of the uplink and the downlink channels is implemented using one or more of the SC-CI family of encoding/modulation/demodulation and decoding schemes. For example, one or more transmitter and receiver structures such as described with FIGS. 3-6 may be used to implement one or both of the physical layer interfaces 724, 732. In some types of embodiments, the PHYS 724, 732 may also include echo cancellation, cross-talk cancellation, equalization, and other forms of signal conditioning or receiver pre-processing. Also, the transmitted data sequences can be chipped sequences that result by point-wise multiplying bipolar data sequences by bipolar spread spectrum pseudorandom noise type sequences. For example, this could correspond to the CDMA mode in the DOCSIS 2.0 specification. Also, the physical layer channel could be a CDMA wireless channel as well. Many current wireless CDMA systems such as 3G cellular systems use Turbo codes like generated using the structure of FIG. 1 or a variant or equivalent. These systems could be improved using the system architecture of FIG. 7 with the SC-CI coding/decoding implemented in the physical layer.

Likewise, SC-CI in accordance with the present invention could be implemented on each subcarrier in an OFDM or OFDMA system to improve a technology such as WiMAX. Alternatively, the headend 705 and the user station 710 can be implemented as nodes in a network where the physical layer devices 724, 732 implement a backbone communication connection between nodes. In such embodiments, the backbone communication connection could involve an SC-CI encoded signal transmitted over cable, microwave, optical, or other means.

Another aspect of the present invention contemplated by FIG. 7 is the provision of services by a communication services provider. The communication service provider provides a communication service such as, for example, a cellular communications service to a set of subscribers, a wireless data service, or supplies a backbone optical communication service to support a network such as the Internet. The service provider implements FIG. 7 or any of its variants or equivalents described above. The service provider employs the PHYS 724, 732 in support of the service. In some cases the service also provides the user devices 710 to the subscribers. This allows the service to be implemented more efficiently and economically that was available with prior art coding technologies.

At this point the basic implementation of technology involving constrained interleaving has been described. Still to be discussed is how and why the constraints are determined and what advantages they provide over prior art uniform interleaving. This discussion is technical in nature and is provided below. Several examples are provided along with performance results in order to help understand the underlying concepts.

To understand the benefits and reasoning behind constrained interleaving, again consider FIG. 3 but consider the constrained interleaver 310 to be a standard unconstrained uniform interleaver. As is shown, two general component codes are used to include: a systematic (q,k) outer code with minimum distance $d_o$, and a systematic (n,q) inner code with minimum distance $d_i$. In serial concatenation with uniform interleaving, m codewords of the outer code, or equivalently mq outer coded bits, are uniformly interleaved and fed into the inner code to form a (mn, mk) serially concatenated code. Following the analysis and the notations of [6], the input-output weight enumerating function (IOWEF) of the serially concatenated code can be written as $$C(W, H) = \sum_{l=0}^{N} \frac{[A(W, l)]^m [B(l, H)]^m}{\binom{N}{l}} = \sum_{w} \sum_{h} c_{w,h} W^w H^h \quad (1)$$

where, $$A(W, L) = 1 + \sum_{i=d_0}^{q} \sum_{u=1}^{k} a_{i,u} W^u L^i \quad (2)$$

and $$B(L, H) = 1 + \sum_{j=d_i}^{n} \sum_{v=1}^{q} b_{j,v} L^v H^j \quad (3)$$

are the weight enumerating functions of the outer and inner codes respectively expressed using the sets of coefficients $a_{i,u}$ and $b_{j,v}$ which are inherent to the two respective codes, and N=qm is the size of the interleaver. Assuming BPSK transmission of coded bits over an additive white Gaussian noise (AWGN) channel with power spectral density $N_0/2$, the bit error probability $P_{be}$ that follows from the IOWEF in (1) is $$P_{be} \leq \sum_{w} \sum_{h} \frac{w}{mk} c_{w,h} Q\left(\sqrt{\frac{2RhE_b}{N_0}}\right) \quad (4)$$

where $E_b$ is the bit energy, R=k/n is the rate of the code, and Q(.) is the standard Q-function.

It follows from equations (1)-(3) that serial concatenation with uniform interleaving has a minimum distance $d_i$. That is, the minimum distance of the serially concatenated code is the same as the minimum distance of the inner code alone. Further, the error coefficient in equation (1) that corresponds to the coded weight $d_i$ of the concatenation resulting from an interleaver with weight $d_0$ is $$\frac{\left[m \sum_{u=1}^{k} a_{d_0, u} W^u \right] [m b_{d_i, d_0} H^{d_i}]}{\binom{mq}{d_0}}. \quad (5)$$

Focusing on the dependence on m, it is seen from equation (5) that the error coefficient related contribution from the above term to the error rate in equation (4) is in the form $$\frac{\lambda_1}{m^{(d_0-1)}} Q\left(\sqrt{\frac{2Rd_i E_b}{N_0}}\right) \quad (6)$$

which achieves interleaver gain for $d_0 \geq 2$, where $\lambda_1$ is a constant that depends on the inner and outer codes. Therefore, even though the minimum weight of the concatenation is still $d_i$, the impact of the minimum weight codewords on the error rate decreases fast with increasing m. This is why traditionally the minimum distance is not the focus when designing serially concatenated codes. Similarly, the term in equation (1) that corresponds to codewords of the concatenation with weight $d_0 d_i$ that result from codewords of the outer code with weight $d_0$ is $$\frac{\left[m \sum_{u=1}^{k} a_{d_0, u} W^u \right] \left[\binom{m}{d_0} b_{d_i, 1}^{d_0} H^{d_i d_0}\right]}{\binom{mq}{d_0}} \quad (7)$$

and its contribution to the bit error probability is $$\lambda_2 Q\left(\sqrt{\frac{2Rd_i d_0 E_b}{N_0}}\right) \quad (8)$$

where $\lambda_2$ is a constant that is dependent on the inner and outer codes.

It is seen that error coefficient of the contribution from equation (8) on $P_{be}$ cannot be lowered by increasing m or, in other words, the terms with weight $d_0 d_i$ do not achieve interleaver gain. Hence, the contribution of the codewords with weight $d_0 d_i$ of the concatenation generated by codewords with weight $d_0$ of the outer code acts as a lower bound for the overall error probability of the concatenated code with uniform interleaving.

Note further that it is possible to have codewords with weight $d_0 d_i$ of the concatenation generated by codewords with weight greater than $d_0$ of the outer code, and, these all achieve interleaver gain. However, the advantage of increasing the interleaver size of the uniform interleaver will ultimately be limited by the codewords with weight $d_0 d_i$ generated by codewords with weight $d_0$ of the outer code.

With uniform interleaving, the impact of the term that corresponds to the weight $d_i$ of the concatenation in equation (6) decreases the fastest with increasing m, while the impact of the term with the weight $d_0 d_i$ in equation (8) approaches a lower limit with increasing m. It can be shown that the all terms with weight lower than $d_0 d_i$ achieve interleaver gain, and further, the impact of m on the multiplicity gradually decreases as the weight increases until the impact disappears when the weight reaches $d_0 d_i$. As it has been mentioned in the literature [6], there are terms in equation (4) that have higher weights than $d_0 d_i$ with increasing error coefficients with m which can degrade performance at lower signal to noise ratio (SNR) values and higher values of m.

Summarizing the above observations, it is noticed that with uniform interleaving with shorter interleaver sizes, the performance is dominated by the variation in equation (6) and similar variations with lower weights. However, the impact of these codewords can be lowered by increasing the size of the interleaver. The impact of the term in equation (8) that corresponds to weight $d_0 d_i$ codewords of the concatenation does not achieve interleaver gain and hence, cannot be lowered by increasing the size of the interleaver. In addition, as discussed in [6], there are other terms with weight higher than $d_0 d_i$ that can have increasing error coefficients that can make significant contributions to the error rate at lower to moderate SNR values despite their higher distances.

The above observations suggest that it would be desirable to design interleavers that could eliminate the contributions from equation (6) and similar variations from all other codewords with weight less than $d_0 d_i$. If this could be done without significantly increasing the error coefficient of equation (8), attractive $P_{be}$ variations which are dominated by equation (8) could result at reasonably low values of m.

Constrained interleaving is designed to achieve good performance at smaller interleaver sizes. Constrained interleaving uses interleaver constraints to ensure that the minimum distance of the concatenated code is maintained at $d_0 d_i$ which the maximum achievable minimum distance of the concatenation. Disregarding the impact of the error coefficient, this increase in minimum distance would provide a gain of $10 \log_{10} (d_0)$ dB. The constrained interleaver is further designed to maximize the actual gain in light of the effects of the error coefficients. The minimum distance of the concatenation is maintained at $d_0 d_i$ by designing the constrained interleaver to ensure that coded bits of every outer codeword are fed into different codewords of the inner code after interleaving. Constrained interleaving removes contributions from all codewords with weight lower than $d_0 d_i$ in equation (1). In addition, constrained interleaving preferably uniformly randomizes the interleaver among all interleavers that satisfy the above constraint. In this way, constrained interleaving seeks to jointly maximize the minimum distance of the serially concatenated code while at the same time minimizing the error coefficient subject to this constraint. This combined approach allows much shorter interleavers do the job of what traditionally required a much longer uniform interleaver. Such optimizations to not appear to be possible for parallel concatenated codes, thus providing further reason to adopt serially concatenated codes in practical designs where lower coding delays are desired.

Using the constrained interleaver construction as discussed in connection with FIG. 3 and FIG. 8 below, constrained interleaving can be realized by randomly placing the mq coded bits from the outer code in a q by m rectangular array satisfying the constraint that coded bits from any single codeword from the outer code are placed in q different columns. The interleaved array can then be fed to the inner code along columns. Constrained interleaving is easier to implement for values of m that are integer multiples of q. However, with a slight modification, constrained interleaving can also be used with values of m that are non integer multiples of q.

In constrained interleaving, any weight l interleaver generated by a single non-zero codeword of the outer code will have all its l non-zero positions placed in different columns. Hence, the number of interleavers that satisfy this constraint can be found by realizing that it is allowed to select any set of l out of m columns for the l '1's in the interleaver and to place each of these '1's in any position of the selected column. Hence, the number of constrained interleavers with weight l generated by a single non-zero codeword of the outer code that satisfy the constraint can be written as $$N_l = \binom{m}{l}(q)^l \tag{9}$$

Compare equation (9) to the corresponding number of weight l uniform interleavers which is $$\binom{mq}{l}$$

regardless of the number of non-zero codewords of the outer code that generate the weight of the interleaver.

For example, when m=20, q=4 and l=2, the number of constrained interleavers is 3040 while the number of uniform interleavers is 3160. As one can expect the number of constrained interleavers has to be lower than the number of unconstrained uniform interleavers. However, as the above example shows, the ratio of the number of constrained interleavers to the number of uniform interleavers is not much different from unity. This ratio represents the factor by which the error coefficient is degraded. The number of interleavers, which is the denominator of equation (1), determines the error coefficients. The error coefficients of constrained interleaving are only slightly higher than those of uniform interleaving. The degradation in performance by the above ratio is more than offset by the beneficial action of the constraint, that is, by the complete elimination of the problematic lower order terms that dominate the net error coefficient at lower interleaver sizes, m.

The calculation of the number of possible constrained interleavers in the case of multiple non-zero codewords of the outer code is more complicated as it involves consideration of combinations that have multiple '1's in columns. These expressions are presented below for a specific example with a (4,3) single parity check outer code and a (7,4) inner Hamming code (see equations (10)-(26) and the discussion thereof below). It follows from equation (9) and equations (10)-(26) that the difference between the number of possible constrained interleavers and the uniform interleavers is not that significant, and further they both have the same order of dependence on m.

Constrained interleaving can perform significantly better than uniform interleaving at smaller interleaver sizes. A different way to view the benefits is that constrained interleaving with shorter interleaver sizes can approach the best performance uniform interleaving can achieve with very long interleavers. Even though the effects of the size of the interleaver and the delay associated with it are not generally considered in studies in information theory, they are important considerations in practical applications.

Next consider the implementation and operation of the constrained interleaver 310 when used with the (q,k) outer code and the (n,q) inner code to form the (mn, mk) serially concatenated block code in the SC-BC embodiment of FIG. 3. Consider the interleaving of mq coded bits of the outer code for the case when m is an integer multiple of q, that is, where m=ρq. In this case, the coded bits from exactly ρ codewords of the outer code are placed on a given row. The implementation of the constrained interleaver 310 thus guarantees that the maximum achievable minimum distance for the concatenation is preserved. The constrained interleaver is then further designed to maximize the number of possible constrained interleaver combinations given by equations similar to equation (9). In particular, the implementation needs to ensure that bits on every row and any column of the q by m array can be separately uniformly randomized while satisfying the maximum-minimum-distance constraint. Hence, the permutation function implemented by the constrained interleaver can be constrained in accordance with the following three actions:

1. Feed-in the coded bits of the outer code into the interleaver array row by row. (Note that each row will have exactly ρ codewords and all coded bits from any single codeword of the outer code are in different columns)
2. Randomize the contents of each row separately.
   Rand_Row$_i$=RandRow$_i$(Row$_i$), i=1, 2, . . . q
   where Rand_Row$_i$ denotes the contents of the ith row after randomizing, and RandRow$_i$ denotes the uniform interleaving operation used to randomize the contents on the ith row.
3. Randomize contents of each column separately.
   Rand_Column$_j$=RandColumn$_j$(Column$_j$), j=1, 2, . . . m=ρq
   where Rand_Column$_j$ denotes the contents of the jth column after randomizing, and RandColumn$_j$ denotes the uniform interleaving operation used to randomize the contents on the jth column. The bits are then read out of the constrained interleaver in column-major order.

The above three actions ensure that coded bits from any single codeword are placed in separate columns, and any coded bit has the freedom to be placed anywhere in the array. Further, the above implementation ensures that rows and columns are completely randomized and thereby provide the maximum possible number of constrained interleavers.

Figure 8:
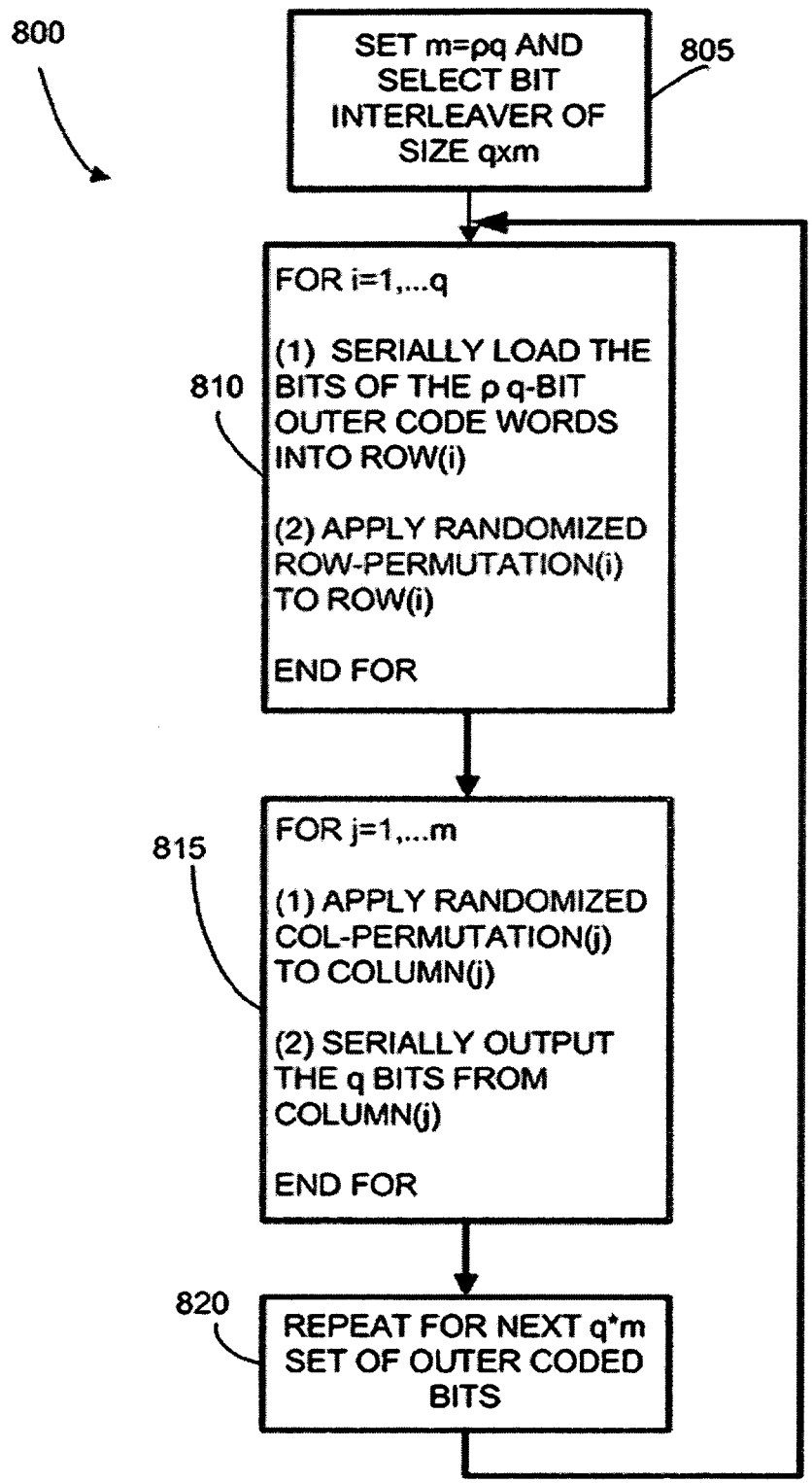
FIG. 8 is a flow chart that illustrates the operation of a constrained interleaver for operation with the block-code based encoder of FIG. 3.

Referring now to FIG. 8, a flow chart for a method 800 is presented that shows the operations performed in order to implement a constrained for a constrained interleaver designed for an SC-BC. The constraint is implemented to force the constrained interleaver's permutation function to rearrange the order of a set of N=qm bits. The method 800 performs the following operations or their equivalents. At 805 a q×m array of bits is arranged and at 810 the array loaded with a set of outer-encoded input bits. The array has q rows and m columns, and the bits are serially loaded into the array in row-major order with ρ q-bit outer code words per row, where ρ=m/q. Also at 810, an i$^{th}$ pseudo-random permutation function is applied to each row i, for i=1, 2, . . . q, wherein the i$^{th}$ pseudo-random permutation function pseudo-randomly rearranges the order of the bits in the i$^{th}$ row. At 815 a j$^{th}$ pseudo-random permutation function is applied to each column j, for j=1, 2, . . . , m, where the j$^{th}$ pseudo-random permutation function pseudo-randomly rearranges the order of the bits in the j$^{th}$ column. Also at 815, the bits of each pseudo-randomized column is out of the array in column major order.

It is important to understand that the constrained interleaver identifies a set of row and column permutation functions and applies these same row and column permutation functions to each block of data as the method 800 reaches 820 and loops back to 810. That is, the Rand(◦) function is only called the first time through for each row and column to determine the respective row and column permutations, and all subsequent data blocks are processed using this fixed set of row and column permutations determined on the first pass of the algorithm or off line at design time.

It is also important to realize that the method 800 may only be executed at design time and all subsequent passes of input data blocks through the constrained interleaver can use table lookup operations. That is, the overall length-N permutation function implemented by one pass through the method 800 can be hard coded as a stored vector of pointers that are used to implement the permutation function to process actual data blocks in accordance with table lookup processing as described in more detail below.

FIG. 9 illustrates the implementation of the constrained interleaver when q=3 and m=6 by following the above three actions by numbering the positions of the coded bits of the outer code 1 through 18.

It should be noted that any of the constrained interleavers and constrained deinterleavers shown in FIGS. 3-6 can be implemented in various ways. The above implementation of FIG. 8 is presented to mathematically understand how the constrained interleaver conceptually operates in order to implement the constraints that jointly improve performance by maximizing the minimum distance while reducing the adverse effect of the error coefficient. However, the actual implementation of the constrained interleaver in hardware or software at run time would likely be implemented using register-indirect or memory indirect addressing. That is, once the procedure of FIG. 8 has been performed once, the constraints will have been met, and a known permutation function, Rand_Constrained( ), will be known. Let X, Y∈B$^M$ where B$^M$ represents a vector space of M-element binary vectors, and M∈{M$_{SC-BC}$, M$_{SC-IRCC}$}. Thus let Y=Rand_Constrained(X) and X=DeRand_Constrained(Y). Then the permutation functions Rand_Constrained( ) and DeRand_Constrained( ), once known as per FIG. 8 or FIG. 13, can be implemented as simple table lookup operations. Likewise, the accessing of bits along rows or columns of the rectangular array can be done similarly using register or memory indirect addressing, i.e., via table lookup. For example, when decoding codewords stored in columns, the bits will be spread out in the bit vector, and instead of multiplying by the number of rows, it can be more efficient to use prestored addresses to locate the bits along a given column. All such tables (pointer vectors or matrices of pointers) can be implemented as hardware registers in a processor, as pointer vectors in memory, or can be hard coded into digital logic circuits. It is noted that because the constrained interleaver will be much shorter than a uniform interleaver, that such addressing tables become much more efficient to implement. For example, if a 1000 element array was needed in a turbo decoder, a 120-element hardware register array could be implemented with constrained interleaving to achieve roughly the same effect.

In an alternative embodiment, consider the case where m is not an integer multiple of q. In this case, once the m bits of any row are filled there would be remaining coded bits from the last codeword that should be placed in the next row. In order to ensure that coded bits from any single codeword of the outer code are placed in different columns, action 2 listed above needs to be modified just for the remaining bits of the last codeword of the previous row. Specifically, when randomizing the remaining bits of the last codeword of row i in row (i+1), all columns occupied by the coded bits of the last codeword in the in row i should be excluded. This exclusion ensures that all coded bits of the last codeword from the ith row are placed in different columns. This process should be continued when moving from one row to the next throughout the interleaving process. This adjustment is only required for the last codeword of the previous row and not for any other codewords. Due to this added constraint, the expression for the maximum number of constrained interleavers (like equation (9)) derived for values of m which are integer multiples of q are not exactly correct as they were derived assuming that all rows are randomized without any additional constraints. However, as m increases, the impact of the restriction on the last codeword becomes negligible. In order to keep the constrained interleaver design simple and to maintain the highest possible number interleavers, it is often preferable to employ values of m that are integer multiples of q, which in practice is not too difficult to enforce.

Next focus on a particular exemplary embodiment of the SC-BC of FIGS. 3, 5 and 8. In this example, consider the serial concatenation of an outer (4,3) single parity check (SPC) code with an inner (7,4) Hamming code considered in [6] to generate a (7m, 3m) rate 3/7 concatenated code. The concatenation of these codes with uniform and constrained interleaving can be compared by following the above analysis with the respective weight enumerating functions of the selected specific outer and inner codes $$A(W,L)=1+3WL^2+3W^2L^2+W^3L^4 \quad (10)$$

$$B(L,H)=1+L(3H^3+H^4)+L^2(3H^3+3H^4)+L^3(H^3+3H^4)+L^4H^7. \quad (11)$$

Following equations (1), (10) and (11), the IOWEF of the concatenated code with uniform interleaving along with an interleaver length N=4m can be written as $$C(W, H) = \quad (12)$$

$$1 + \frac{9m^2(W+W^2)(H^3+H^4)}{\binom{4m}{2}} + \frac{3m\binom{m}{2}(W+W^2)(3H^3+H^4)^2}{\binom{4m}{2}} +$$

$$\frac{\left[9\binom{m}{2}(W+W^2)^2 + mW^3\right]}{\binom{4m}{4}} + \frac{\left[9\binom{m}{2}(H^3+H^4)^2 + m(m-1)(3H^3+H^4)(H^3+H^4)\right]}{\binom{4m}{4}} +$$

other terms.

Even though it is not necessary to structure the uniform interleaver as a rectangular array, in order to compare uniform and constrained interleaving, without loss of generality, we assume that the same q by m array structure is used with uniform interleaving. In the case of uniform interleaving, no constraint is applied so that coded bits of the outer code can be randomly placed anywhere in the rectangular array making it equivalent to a uniform interleaver with size N=4m.

To first analyze the performance of the serially concatenated code with uniform interleaving, note that the first term in equation (12) corresponds to the all zero codeword. The second term corresponds to l=2 with two "1"s in the 4 by m array of coded bits of the outer code with both "1"s located in a single column of the interleaver array. Note also that the second term generates a codeword with minimum weight 3 of the concatenation. The third term of equation (12) corresponds to again l=2 but using two columns of the interleaver resulting in a distance of at least 6. The fourth term corresponds l=4 but still using only two columns and generating codewords with weight 6 and higher. Similar terms that generate codewords with weight 6 are not that significant due to a larger denominator and/or larger weight, as can be found by considering l=6 using only with two columns. Therefore, in this discussion only the first four terms of equation (12) are considered as the primary terms. Starting with equation (12) it can be seen that the coefficients $c_{w,h}$ of the dominant terms in equation (1) can be written as $$c_{1,3} = c_{1,4} = c_{2,3} = c_{2,4} = \frac{9m^2}{\binom{4m}{2}}; \quad (13)$$

$$c_{1,6} = \frac{27m\binom{m}{2}}{\binom{4m}{2}}; \quad (14)$$

$$c_{2,6} = \frac{27m\binom{m}{2}}{\binom{4m}{2}} + \frac{81\binom{m}{2}^2 + 3m(m-1)}{\binom{4m}{4}};$$

$$c_{3,6} = \frac{\left[18\binom{m}{2}+m\right]\left[9\binom{m}{2}+3m(m-1)\right]}{\binom{4m}{4}}; \quad (15)$$

$$c_{4,6} = \frac{9\binom{m}{2}\left[9\binom{m}{2}+3m(m-1)\right]}{\binom{4m}{4}}.$$

Considering the contributions from the lower weight terms in equation (1), specifically considering contributions corresponding to terms in equations (13), (14) and (15), $P_{be}$ can be written as $$P_{be} \leq \frac{3}{2(4m-1)}Q\left(\sqrt{\frac{6RE_b}{N_0}}\right) + \frac{3}{2(4m-1)}Q\left(\sqrt{\frac{8RE_b}{N_0}}\right) + \quad (16)$$

$$\frac{27(m-1)}{4(4m-1)}Q\left(\sqrt{\frac{12RE_b}{N_0}}\right) + \text{other terms with higher distances.}$$

The first term of equation (16) with the minimum argument of the Q function corresponds to l=2 using a single column of the interleaver array, second term corresponds to l=4 again using a single column of the array, and the third term corresponds to l=4 using two columns of the array each with weight 2. It is seen that the first two terms in equation (16), decrease with increasing m and achieve interleaver gain. However, the third term in equation (16) does not achieve interleaver gain. In fact the third term of equation (16) can be considered as a lower bound for $P_{be}$ as $$P_{be} > \frac{27(m-1)}{4(4m-1)} Q\left(\sqrt{\frac{12RE_b}{N_0}}\right) \quad (17)$$

To next analyze the performance of the same serially concatenated code but with constrained interleaving, note that by the design of the constraint, that the first two terms of equation (16) are eliminated. The number of constrained interleavers at different interleaver weights l can then be found by considering all possible combinations of obtaining that value of l subject to the constraint. For example, only a single codeword of the outer SPC can generate l=2 interleavers, and hence, the number of constrained interleavers is $$N_2 = (4)(4)\binom{m}{2} = 8m(m-1). \quad (18)$$

Using the above analysis, note that with this serially concatenated code, when m=4, uniform interleaving has 120 interleaver combinations and constrained interleaving has 96 combinations. The reduction of (120−96)=24 combinations from uniform interleaving is due to not allowing both "1"s to be in the same column. However, constrained interleaving eliminates the lower order terms that give the highest error coefficient at lower values of interleaver size, m, while at the same time increasing the minimum distance of the serially concatenated code. This provides a net coding gain, especially at shorter interleaver sizes.

The case l=4 when m≥4 can be obtained either from one codeword of weight 4 or from two codewords each with weight 2 of the outer code. When generated from a single codeword of the outer code, all four "1"s will be placed in 4 different columns, and the number of possible constrained interleavers is $$N_{4b} = \binom{m}{4}(4)^4 \quad (19)$$

and the resulting weight of the concatenation is at least 12. Similarly, case l=4 can also be generated from two different codewords each with weight 2 by placing the four "1"s either in 2 columns (each with two "1"s), or in three columns (one with two "1"s and two with one "1") or in four columns each (with one "1"), generating a total number of constrained interleavers $$N_{4a} = \binom{m}{4}(4)^4 + \binom{m}{3}(3)\binom{4}{2}(4)^2 + \binom{m}{2}\binom{4}{2}^2 \quad (20)$$

with a minimum weight of at least 6. Hence, it is clear that in constrained interleaving the number of possible interleavers can vary depending on how the weight of the interleaver is generated from the outer code.

Similarly, when l=6 and m≥6, the number of constrained interleavers can be found when it is generated by three weight 2 codewords of the outer code as $$N_{6a} = 4096\binom{m}{6} + 7680\binom{m}{5} + 4480\binom{m}{4} + 792\binom{m}{3} + 16\binom{m}{2} \quad (21)$$

and when it is generated by one weight 2 and one weight 4 codeword of the outer code as $$N_{6b} = 4096\binom{m}{6} + 7680\binom{m}{5} + 3456\binom{m}{4}. \quad (22)$$

Similarly, when l=8 and m≥8, the number of constrained interleavers can be found when it is generated by four weight 2 codewords of the outer code as $$N_{8a} = 65536\binom{m}{8} + 172032\binom{m}{7} + 162816\binom{m}{6} + \\ 66560\binom{m}{5} + 10896\binom{m}{4} + 384\binom{m}{3} + \binom{m}{2} \quad (23)$$

or when it is generated by one weight 4 and two weight 2 codewords of the outer code as $$N_{8b} = 65536\binom{m}{8} + 172032\binom{m}{7} + \\ 162816\binom{m}{6} + 65280\binom{m}{5} + 9744\binom{m}{4} \quad (24)$$

and when it is generated by two weight 4 codewords of the outer code as $$N_{8c} = 65536\binom{m}{8} + 172032\binom{m}{7} + \\ 138240\binom{m}{6} + 34560\binom{m}{5} + 1296\binom{m}{4}. \quad (25)$$

The number of interleavers with constrained interleaving can be used in equation (12) and by dropping the terms that are prevented by the constraint, the IOWEF of the concatenated code with constrained interleaving can be expressed as $$C_C(W, H) = 1 + \frac{3m\binom{m}{2}(W + W^2)(3H^3 + H^4)^2}{N_2} + \\ \frac{\left[9\binom{m}{2}(W + W^2)^2\right]\left[9\binom{m}{2}(H^3 + H^4)^2 + m(m-1)(3H^3 + H^4)(H^3 + 3H^4)\right]}{N_{4a}} + \quad (26)$$

-continued $$\frac{mW^3\left[9\binom{m}{2}(H^3+H^4)^2+m(m-1)(3H^3+H^4)(H^3+3H^4)\right]}{N_{4b}}+$$

other terms.

The new weight enumeration function in equation (26) along with equation (1) determines the error rate bound for serial concatenation with constrained interleaving.

Figure 1:
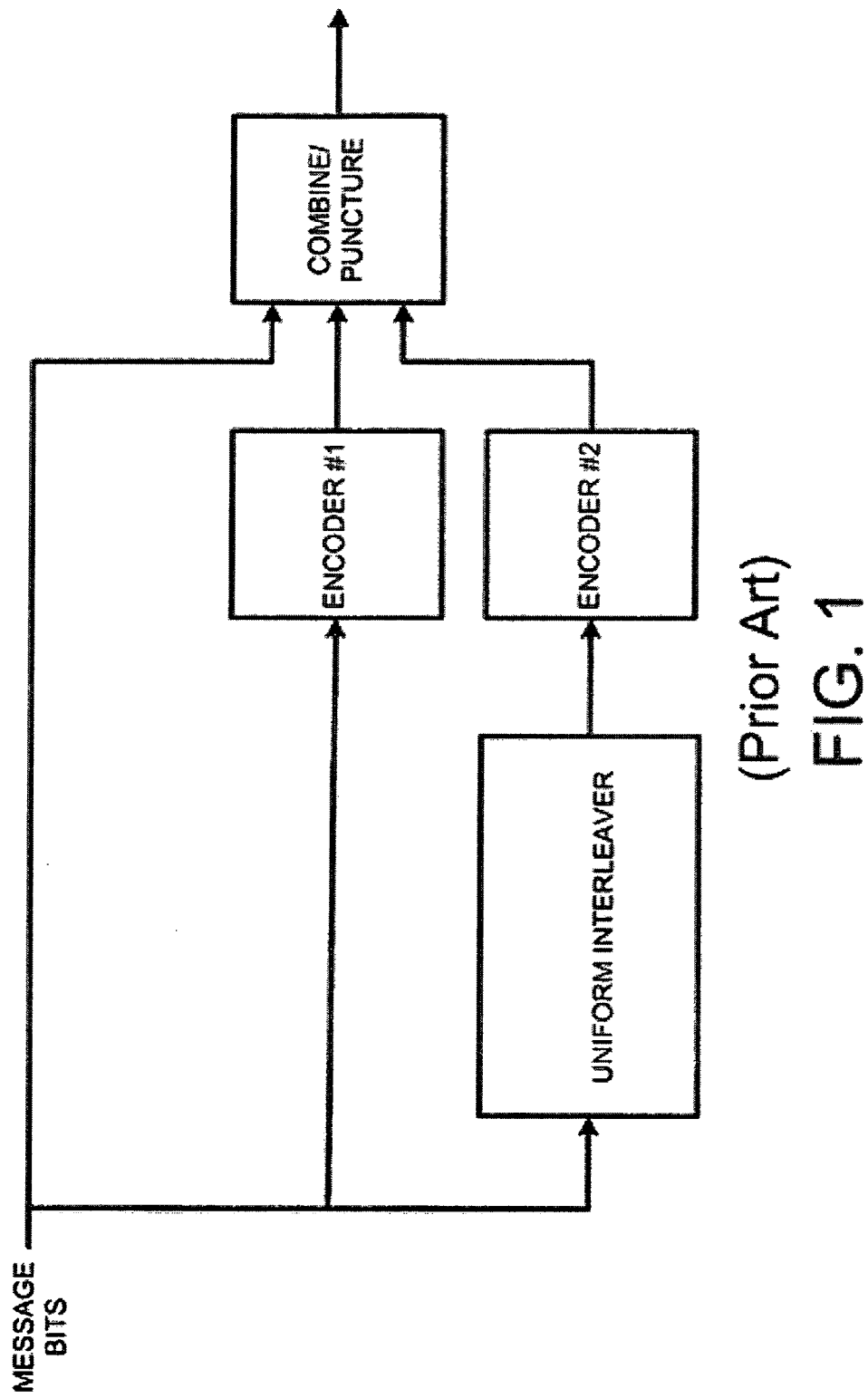
FIG. 1 illustrates a prior art turbo encoder that generates a parallel concatenated code.
Figure 10:
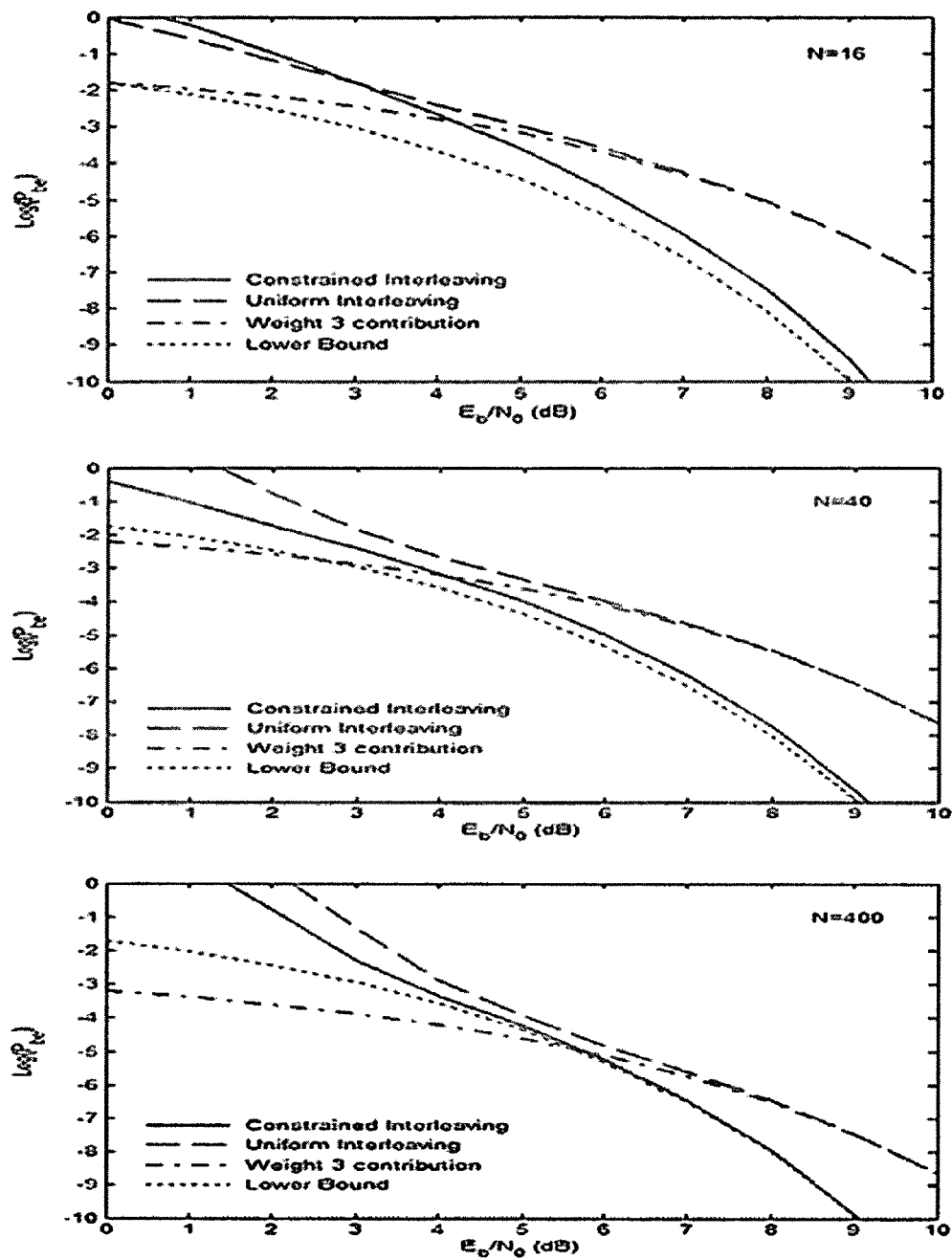
FIG. 10 shows three bit error rate performance curves that illustrate how constrained interleaving can reach the performance bound of uniform interleaving, but with a much shorter interleaver (e.g., N=16, N=40 and N=400) in an example involving serially concatenated block codes.

FIG. 10 illustrates how constrained interleaving can reach the performance bound of uniform interleaving, but with a much shorter interleaver. The uniform interleaving curves of FIG. 1 show the variations of the combined effect of the first two terms of equation (16) and the lower bound in equation (17) for different values of interleaver length, N=16, N=40 and N=400, along with the $P_{be}$ upper bound in equation (1) considering all codewords of weight up to 16 along with the error rate variations of constrained interleaving. It is seen from FIG. 10 that unless the uniform interleaver length is very large, the first two terms of equation (16) dominate the performance at moderate to higher SNR values. It is also noticed that $P_{be}$ cannot be lowered below the lower bound by increasing the length of the uniform interleaver, m. On the other hand, FIG. 10 indicates that constrained interleaving can approach the performance bound with a much smaller interleaver. Further, it is seen that at very low error probabilities, below about $10^{-7}$, constrained interleaving begins to perform significantly better than uniform interleaving because of the constraint's ability to overcome the error rate floor effects of uniform interleaving. This improvement in performance would be useful for applications that operate at low bit error rates such as in optical communication systems and in magnetic recording.

As discussed in the background section, SPC codes are well known. For example, it is known that a d-dimensional SPC code with an overall rate of $$\left(\frac{m-1}{m}\right)^d$$

and a minimum Hamming distance of $2^d$ can be generated by using (m,m−1) SPC codes along all of the d dimensions. Even though the minimum distance of the code can be increased by increasing the number of dimensions, it also increases the error coefficient of the code. Specifically, the bit error probability of a 2-dimensional (2-D) SPC can be approximately expressed as (see [11] as referenced in the background section herein):

$$P_{be}\approx\frac{(m-1)^2}{2}Q\left(\sqrt{\frac{8(m-1)^2E_b}{m^2N_0}}\right) \quad (27)$$

In the literature multi-dimensional SPC codes have been discussed by using uniform interleaving in between dimensions. It is found that interleaving can improve performance of multi-dimensional SPCs when the number of dimensions is above 2, however, in 2-D SPCs uniform interleaving cannot improve performance over the same scheme without interleaving. It is stated in [11] that this is due to the lowering of the minimum distance in case of uniform interleaving. Since both component codes of 2-D SPC have the same weight enumerating function given by $$D(W,L)=1+\sum_{iodd,i>0}\binom{p-1}{i}W^iL^{i+1}+\sum_{ieven,i>0}\binom{p-1}{i}W^iL^i \quad (28)$$

the weight enumerating function of the serial concatenation of them with uniform interleaving is given by $$C(W,H)=\sum_{l=0}^{m(m-1)}\frac{[D(W,l)]^{(m-1)}[D(l,H)]^m}{\binom{m(m-1)}{l}} \quad (29)$$

$$=\sum_w\sum_h c_{w,h}W^wH^h.$$

The lower weight terms (l=2 terms), equation (29) can be written as $$C(W,H)= \quad (30)$$

$$1+\frac{m(m-1)\binom{m-1}{2}^2W^2H^2}{\binom{m(m-1)}{2}}+\frac{m(m-1)^2\binom{m-1}{2}WH^2}{\binom{m(m-1)}{2}}+$$

$$\frac{(m-1)^3\binom{m-1}{2}\binom{m}{2}}{\binom{m(m-1)}{2}}W^2H^4+\frac{(m-1)^4\binom{m}{2}WH^4}{\binom{m(m-1)}{2}}+\text{other terms.}$$

It is seen from the second and third terms of equation (30) that uniform interleaving only achieves a minimum distance of 2. Further, it is seen from the second term of equation (30) that, with respect to the error coefficient, the numerator is in the order of $m^6$ and denominator is in order of $m^4$. Since the size of the interleaver is in the order of $m^2$, the second term does not achieve interleaver gain. This explains why 2-D SPC with uniform interleaving cannot perform better than 2-D SPC without interleaving which is given by equation (27).

Next consider 2-D SPC with constrained interleaving. Constrained interleaving of 2-D SPC can be performed by arranging (m−1) codewords of the first dimension, each m bits long, in a (m−1) by m array and interleaving by satisfying the constraint of constrained interleaving as previously discussed. With constrained interleaving, the second and third terms of equation (30) are thereby eliminated. Further, the denominator of the remaining fourth term of equation (30) is modified as $$N_2=\binom{m}{2}(m-1)^2. \quad (31)$$

Hence, the weight enumerating function of 2-D SPC with constrained interleaving can be derived from equation (29), by also considering the terms that become important after the fourth term in equation (29), as $$C_C(W, H) = 1 + \frac{(m-1)^3 \binom{m-1}{2}\binom{m}{2}}{(m-1)^2 \binom{m}{2}} W^2 H^4 + \frac{(m-1)^4 \binom{m}{2} W H^4}{(m-1)^2 \binom{m}{2}} = \quad (32)$$

$$1 + (m-1)\binom{m-1}{2} W^2 H^4 + (m-1)^2 W H^4 + \text{other terms}.$$

Since the interleaver size is in the order of $m^2$, the error coefficient of the bit error probability resulting from the second term of equation (32) is in the order of m. However, the rate and hence, the argument of the Q-function also increases with increasing m. Compared with the performance of 2-D SPC without interleaving given by equation (27) that has error coefficient in the order of $m_2$, constrained interleaving achieves an interleaver gain on the order of $1/m$. The contributions of the "other terms" of equation (32), which should also be considered at low SNR values, can be found by considering terms with $N_4$, $N_6$, etc. These values for the (m, m−1) SPC outer code considered in 2-D SPC can be found by modifying equations (19)-(25). For example, using the same notations, equations (19) and (20) would be modified as $$N_{4a} = \binom{m}{4}(m-1)^4 + 3\binom{m}{3}\binom{m-1}{2}(m-1)^2 + \binom{m}{2}\binom{m-1}{2}^2. \quad (33)$$

$$N_{4b} = \binom{m}{4}(m-1)^4 \quad (34)$$

Figure 11:
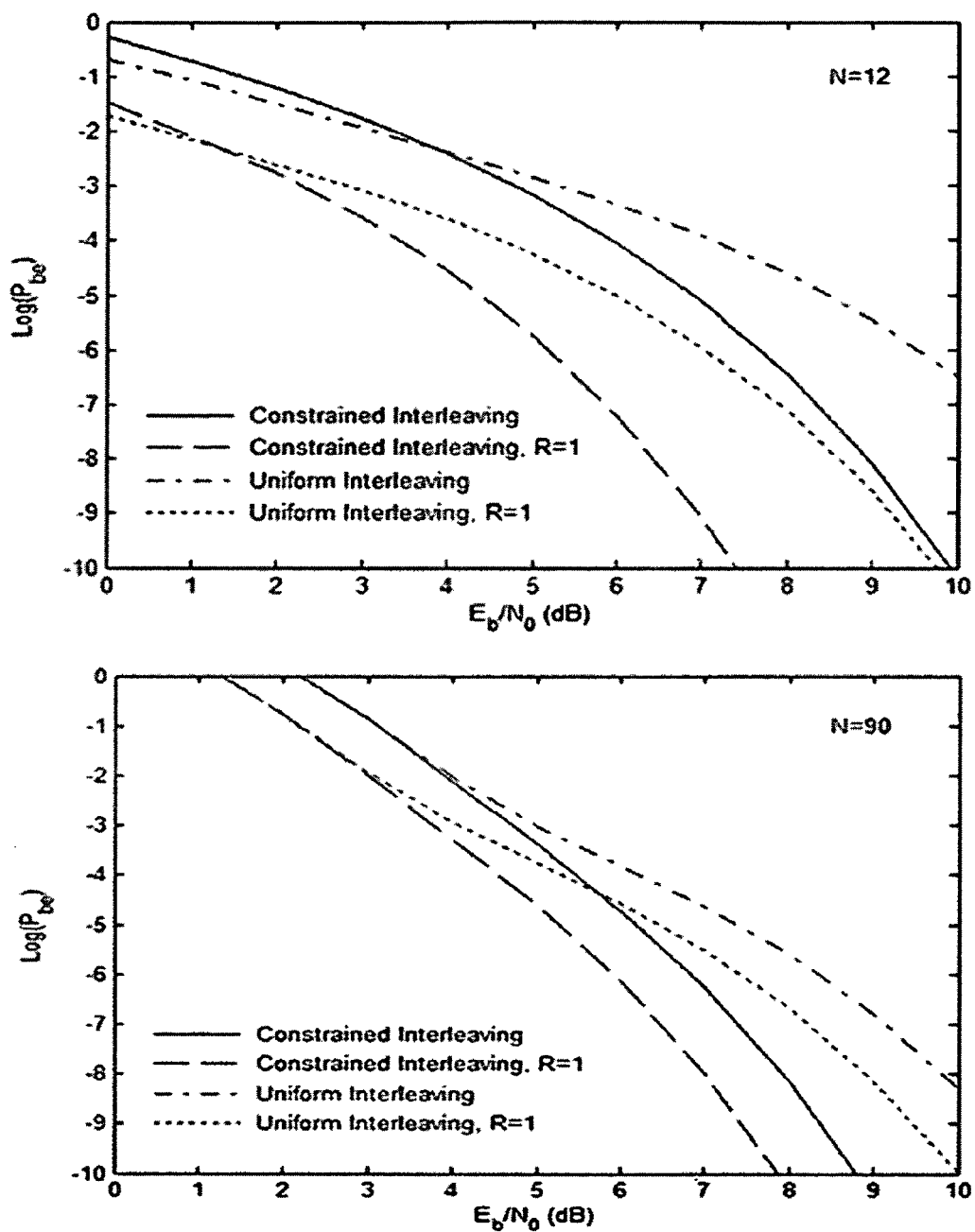
FIG. 11 shows bit error rate performance curves and error rate bounds of 2-D SPC codes with uniform interleaving and constrained interleaving along with that of without interleaving when the interleaver length is N=12 and N=90 in an example involving serially concatenated block codes.

FIG. 11 shows the error rate bounds of 2-D SPC codes with uniform interleaving and constrained interleaving along with that of without interleaving when the interleaver lengths are N=12 and N=90 by considering terms with weights up to 8 in the interleaver. Since the rate of the code varies with m, in order to observe the impact on interleaver length, the error rate variations when the rate r is fixed at 1 are also plotted. The results of FIG. 11 indicated that 2-D SPC codes can benefit significantly from constrained interleaving compared with both uniform interleaving and without interleaving.

Constrained interleaving can also improve performance in 3-D and higher dimensional SPCs as well. In case of 3-D SPCs, (m−1) separately constrained interleaved 2-D SPC coded bits (each with m(m−1) bits) are arranged in a (m−1) by m(m−1) array and are interleaved again according to constrained interleaving. By extending the analysis of 2-D SPC with constrained interleaving, it is possible to show that even with 3-D SPC (and similarly higher dimensional SPC), constrained interleaving can perform better than uniform interleaving.

At this point the SC-BC implementations and the theory behind them have been described. We now turn our attention to the SC-IRCC case. The analysis of convolutional codes differs from that of block codes due to the absence of a well defined block length. However, convolutional codes can be analyzed using the concept of equivalent block codes. Specifically, a rate R=p/n convolutional code with memory υ can be analyzed by considering its equivalent (N/R,N−pυ) block code and considering all of the N input bits (including the pυ termination bits) as in a single block. The weight enumeration function (WEF) of the concatenated code can be found by considering all possible error events and their concatenations within the block of N input bits.

FIG. 4 shows an embodiment of an SC-IRCC that uses a constrained interleaver 410 and an outer block code 405 which could be alternatively implemented by a non-recursive convolutional. In FIG. 4, the inner code 415 is implemented as an IRCC. In order to understand the advantages of the constrained interleaving with convolutional codes, we first review the analysis of SCCC (serial concatenation with convolutional codes) with uniform interleaving as presented in [6]. The observations with uniform interleaving are then used to motivate and develop constrained interleaving for use with SC-IRCC. That is, in FIG. 4, let us assume that no constraints are applied and the constrained interleaver 410 is an (unconstrained) uniform interleaver.

Adopting the same notation in [6], the performance of a SCCC over an additive white Gaussian noise (AWGN) channel with power spectral density $N_0/2$ can be bounded by considering all error events of different weights and their contributions to the bit error probability $P_{be}$ using the union bound. The resulting $P_{be}$ of the concatenated code can be bounded in terms of the standard Q-function as $$P_{be} \leq \sum_k c(h_k) N^{\alpha(h_k)} Q\left(\sqrt{\frac{2R h_k E_b}{N_0}}\right) \quad (35)$$

where $h_k$ is the weight of the kth error event of the concatenation, $\alpha(h_k)$ is the exponent of the interleaver size N, $c(h_k)$ is a constant dependent on the component codes and the weight $h_k$ but not on N, R is the rate of the code, and $E_b/N_0$ is the signal to noise ratio. The analysis of the performance in equation (35) focuses on the weights $h_k$, that determine the argument of the Q function, and their respective exponents, $\alpha(h_k)$, that determine the error coefficient and the interleaver gain of the respective weight $h_k$. The minimum value of $h_k$, $h_m$, of the concatenated code can be higher than the minimum free distance of the inner code, $d_f^i$, due to the influence of the outer code. Further, as stated in [6], generally, $h_m < 2d_f^i$. This implies that the distance of the outer code can sometimes improve the distance of the prior art serially concatenated codes in accordance with $d_f^i < d_{sc} < 2d_f^i$. However, this has nothing to do with the permutation function chosen for the interleaver, but has to do instead with the selection of the inner and the outer codes.

Serial concatenation of convolutional codes with uniform interleaving has been analyzed by considering: (a) the values of $h_m$ and its corresponding value of the exponent $\alpha(h_m)$, and (b) the maximum exponent of any weight, $\alpha_m = \text{Max}\{\alpha(h_k)\}$ [6]. The analysis of (a) determines the error rate variation in equation (35) at high SNR values while the analysis of (b) determines the impact of the interleaver size on any weight and checks if $\alpha(h_k)$ is negative for all values of $h_k$, thereby guaranteeing interleaver gain for all weights. Related to the analysis of (a), it has been shown that [6]

$$\alpha(h_m) \leq 1 - d_f^o \quad (36)$$

and hence, the minimum weight term achieves interleaver gain for $d_f^o \geq 2$, where $d_f^o$ is the minimum Hamming distance of the outer code. Related to the analysis of (b), it has been shown that the $\alpha(h_k)$ value corresponding to any weight $h_k$ is given by [6]

$$\alpha(h_k) = n_0 + n_i - l - 1 \quad (37)$$

where $n_0$ and $n_i$ are the number of error events concatenated on the trellises of the outer and inner codes respectively corresponding to a weight l interleaver that generates the weight $h_k$ sequence at the output of the concatenation. It is seen from equation (37) that the maximum $\alpha(h_k)$ value results from maximum possible $n_o$ and $n_i$ values at any given value of l. The important observations related to equation (37) are listed below.

(i) The interleaver weight $l \geq n_o d_f^o$.
(ii) In case of block or non-recursive inner convolutional codes, maximum $n_i=1$, or $n_i \leq 1$.
(iii) Since the input weight of an error event of an IRCC is at least 2, when the inner code is an IRCC, the maximum value of $n_i$ is $l/2$ for even l, and $[(l-3)/2+1]$ for odd values of l. Further, the minimum weight of the output of the IRCC with maximum $n_i$ requires the minimum weight of the error event generated by a weight 2 input of the inner code which is referred to as the effective minimum weight $d_{f,eff}^i$, and also by the minimum output weight of the inner code corresponding to a weight 3 input, $h_m(3)$.

With the above observations, it follows from equation (37) that inner block or non-recursive convolutional codes can have weights $h_k$ with positive $\alpha(h_k)$ values and hence, their contributions to the error rate in equation (35) increase with increasing interleaver size [1,2]. It is also seen that with recursive inner codes, when $d_f^o \geq 2$, $\alpha(h_k)$ is always negative guaranteeing interleaver gain for all weights $h_k$ in equation (35). Specifically, for IRCCs [6], $$\alpha_M = -\left\lfloor \frac{d_f^o + 1}{2} \right\rfloor \tag{38}$$

Hence, IRCCs are better than block or non-recursive convolutional codes when used as inner codes in serial concatenation with uniform interleaving [6]. Also, it is desirable to use an outer code with a higher, and preferably an odd, free minimum distance $d_f^o$. Further, the weight $h_k$ that corresponds to $\alpha_M$, denoted by $h(\alpha_M)$, is given by [6]:

$$h(\alpha_M) = \begin{cases} d_f^o d_{f,eff}^i / 2, & d_f^o \text{ even} \\ \left[ \frac{(d_f^o - 3)}{2} d_{f,eff}^i + h_m(3) \right], & d_f^o \text{ odd} \end{cases} \tag{39}$$

Finally, it is known that the outer code of a SCCC should preferably be a non-recursive convolutional code and not a recursive code, and also it is known that the behavior of block codes and non-recursive codes are similar when used as outer codes in serial concatenation [6].

The above observations about the bit error rate performance of SCCCs that use uniform interleaving of SCCC are next used to develop constrained interleaving techniques that operate with SC-IRCCs. Since block codes and non-recursive convolutional codes behave the same way, and since constrained interleaving is easier to implement with block outer codes, without loss of generality, for now we focus on SC-IRCCs embodiments that use an outer (n,k) block code with an IRCC as illustrated in FIG. 3. Due to the absence of a lower bound as in case of uniform interleaving with serially concatenated block codes, the goal of constrained interleaving of SC-IRCC is to improve performance over uniform interleaving at any given interleaver length, but not to try to approach any lower bound as was done with inner block codes. Further, due to the absence of fixed block lengths of convolutional codes, a different set of interleaver constraints are needed to optimize or improve the performance of SC-IRCCs.

Figure 12:
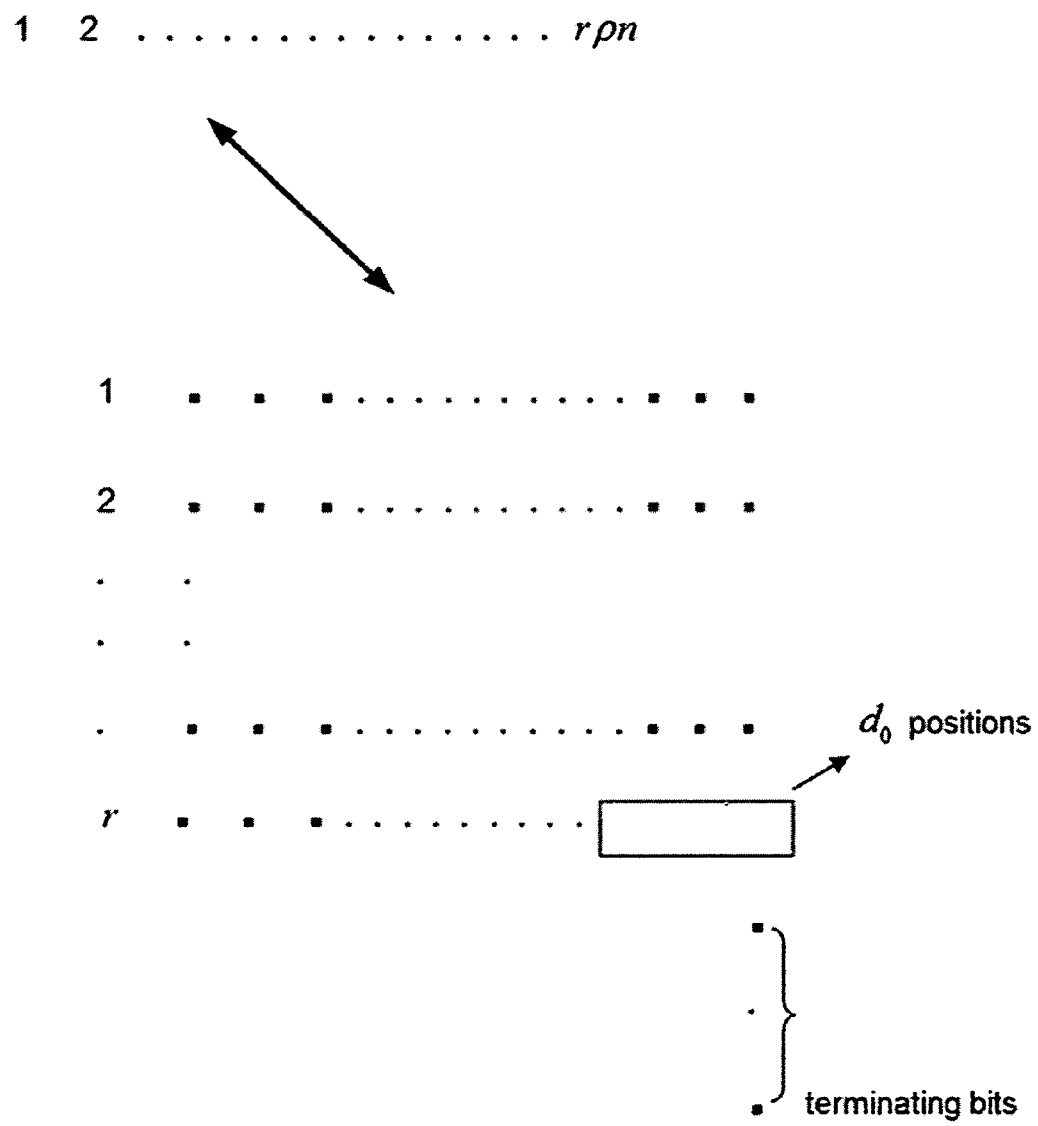
FIG. 12 illustrates the r×ρn constrained interleaver array structure of a constrained interleaver designed to operate in accordance with the flow chart of FIGS. 4 and 13.

Similar to constrained interleaving of SC-BCs, let us consider constrained interleaving of SC-IRCC in the form of a r by ρn array and feeding interleaved bits, with υ termination bits, into the inner code along columns as illustrated in FIG. 12. As shown in FIG. 12, this array holds the same information as a vector of rρn input bits (or bit metrics or extrinsic values). We consider the number of columns of the interleaver array to be an integer multiple of n, where as indicated above, n is the number of bits in each codeword. Hence, rρ number of codewords of the outer code will be fed into the interleaver with ρ codewords placed along each row. As with block codes, the objective here is to maintain the minimum weight of the concatenation at $d_o d_f^i$, where $d_o$ is the minimum distance of the outer block code (since the outer code is a block code in this discussion, we simply denote the minimum distance of the outer code by $d_o$ instead of $d_f^o$). In order to achieve this objective, it is necessary to ensure that each coded bit of the outer code gains at least a weight of $d_f^i$ when the interleaved bits are passed through the inner code. Hence, due to the trellis structure of the inner convolutional code, it is necessary to maintain enough spacing between the coded bits of each codeword of the outer code to maintain the minimum distance of the concatenation when the outer code is fed into the inner code. This suggests that the easiest way to constrained interleave SC-IRCC is to place all coded bits of the any codeword of the outer code along the same row of the interleaver.

Even though this prevents randomizing the contents of columns that was allowed with block inner codes, randomizing within rows and shuffling of the rows can still be allowed with IRCC. The value of r, that depends on the inner code, should be selected to maintain the minimum distance of the concatenation at $d_o d_f^i$. The constrained interleaver of SC-IRCC can be implemented by placing rρ number of codewords of the outer code into an Input_Block, applying uniform interleaving at the codeword level to the n-bit codewords in the Input_Block, and placing the randomized codewords into a length rρ vector of codewords, Rand_Input_Block. The memory structure is organized to then consider the Rand_Input_Block to be an r×nρ rectangular array of bits which constitutes the constrained interleaver array. A vector of r-element row pointers, *Rows, can be constructed where the $i^{th}$ element of *Rows, points to the beginning of the $i^{th}$ row of the constrained interleaver array. This allows the Rand_Input_Block to be manipulated in hardware or software as an r×ρn rectangular array of bits.

The constrained interleaver can be implemented or its permutation function can be designed by taking the actions summarized below:

1. Randomize the length-rρ Input_Block of codewords (CW's).
   Rand_Input_Block=Rand_CW (Input_Block),
   where Rand_Input_Block denotes a uniformly interleaved set of n-bit codewords of the outer code after randomizing, and Rand_CW denotes the uniform interleaving operation applied to randomize n-bit codewords as opposed to bits.
2. Randomize the contents of each row separately.
   Rand_Row$_i$=RandRow$_i$(Row$_i$), i=1, 2, . . . r
   where Rand_Row$_i$ denotes the contents of the ith row after randomizing, and RandRow$_i$ denotes the uniform interleaving operation used to randomize the contents of the ith row.

The bits are then read out of the interleaver in column-major order. It is noticed that by following the above actions, any codeword of the outer code has the freedom to be placed in any row, codewords have the freedom to get mixed up randomly, and coded bits of any codeword get placed along the same row of the interleaver thereby ensuring the highest possible minimum distance of $d_0 d_f^i$ while maximizing the number of interleavers.

Figure 13:
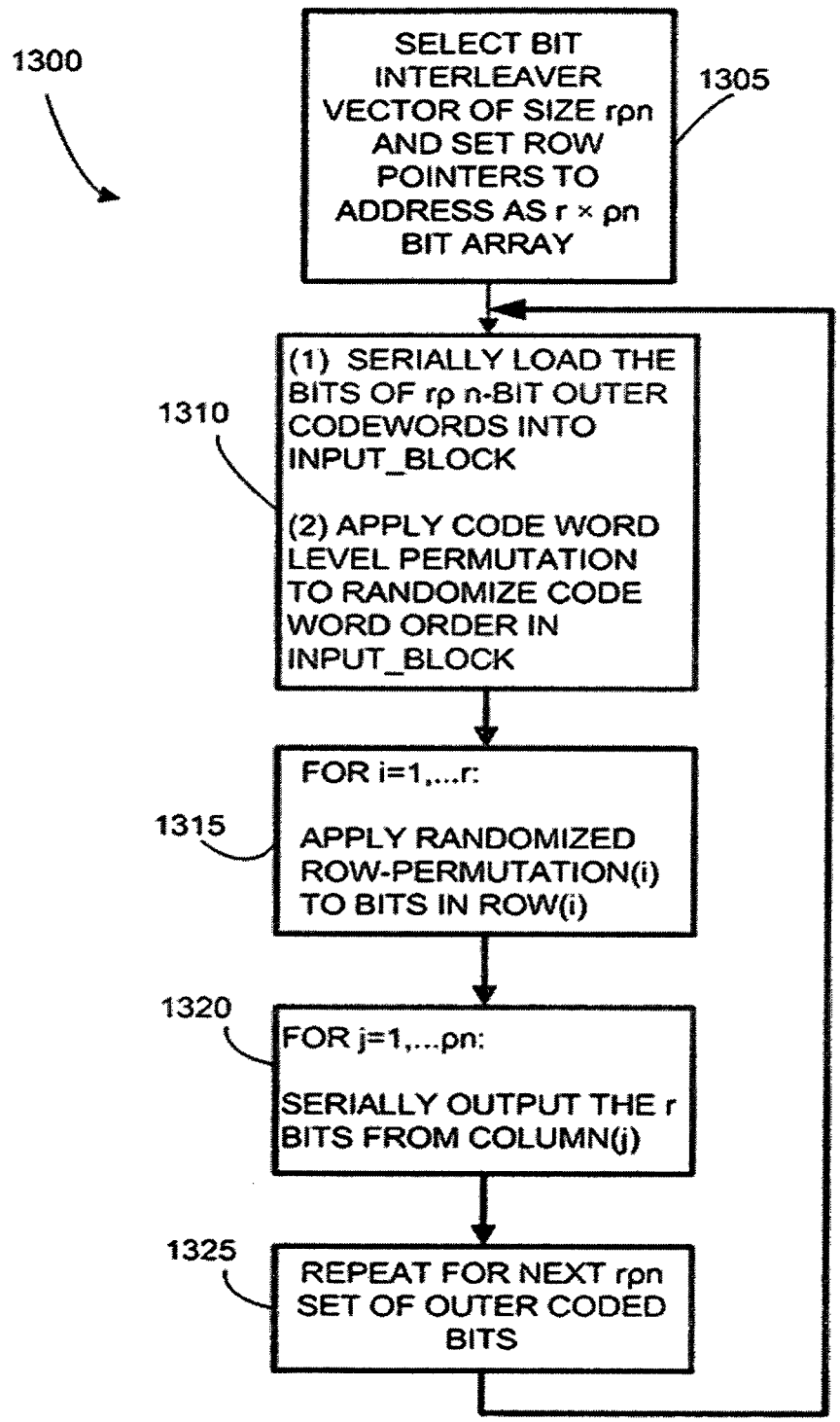
FIG. 13 is a flow chart that illustrates the operation of a constrained interleaver for operation with the inner-recursive-code based encoder of FIG. 4.

FIG. 13 illustrates the operations of a constrained interleaver 1300 designed to implement a constraint to jointly take into consideration the minimum distance and error coefficients of an SC-IRCCs. The constraint is implemented to force the permutation function rearrange the order of a set of N=rρn bits to be equivalent to performing a set of operations as described below. At 1305 a set of parameters as discussed below are determined for implementation of the constrained interleaver. A rectangular array data structure is configured, preferably using a vector of row pointers to implement row addressing and row swapping more efficiently. At 1310 an input block of outer encoded bits is formed. Also at 1310 a codeword-level permutation function is applied to randomize an ordering of rρ number of n-bit outer code words embedded in the input block. The rρn number of outer-encoded bits from the input block are loaded into a r×ρn array of bits, wherein the array has r rows and ρn columns, and the bits are serially loaded into the array in row-major order with ρ number of n-bit outer code words per row. Next at 1315 an $i^{th}$ pseudo-random row permutation function is applied to each row i, for i=1, 2, . . . r, wherein the $i^{th}$ pseudo-random permutation function pseudo-randomly rearranges the order of ρn coded bits in the $i^{th}$ row. At 1320 the bits are read out of the array in column major order.

Similar to the discussion made in connection with FIG. 8, if the same pseudo randomized permutation functions are used in each pass, then at step 1325 a new block of data is brought in and the constrained interleaving is repeated on the next input data block using the same set of codeword and column permutation functions.

As discussed above, at runtime, the constrained interleaver can be efficiently implemented using table lookups, using arrays of pointers and register indirect addressing and/or memory indirect addressing. The FIG. 13 can be used to identify the constrained interleaver's permutation function at design time. Forever after, the identified constrained interleaver's overall permutation and inverse permutation functions can then be implemented using respective passes of incrementing through a respective length-rρn vector of pointers to directly and efficiently at runtime.

To better understand the performance of SC-IRCC with constrained interleaving, it is helpful to consider the weight enumerating function (WEF) of the (n,k) outer block code in the form $$A(W, L) = 1 + \sum_{i=d_0}^{n} \sum_{u=1}^{k} a_{i,u} W^u L^i \quad (40)$$

which can also be written by only considering the weights of the codewords as $$A(L) = 1 + \sum_{i=d_0}^{n} c_i L^i \quad (41)$$

where, $$c_i = \sum_{u=1}^{k} a_{i,u}.$$

The same inner recursive convolutional code that was previously discussed with uniform interleaving is considered for the inner code with constrained interleaving.

Next consider the case when the number of non-zero codewords of the outer code, s (which equivalent to $n_0$ as discussed previously), is one, i.e., s=1. With constrained interleaving, when s=1, all "1"s of the interleaver are placed along the same row of the interleaver, and the corresponding weight of the interleaver l satisfies, $d_0 \le l \le n$. Further, according to constrained interleaving, this row is randomly selected among all r rows and the contents of the row are randomized among all nρ columns. Hence, the number of possible constrained interleavers when s=1 is given by $$N_1 = r \binom{n\rho}{l} \quad (42)$$

Note that there are $$\binom{rm}{l}$$

uniform interleavers when the interleaver weight is l [6].

Figure 2:
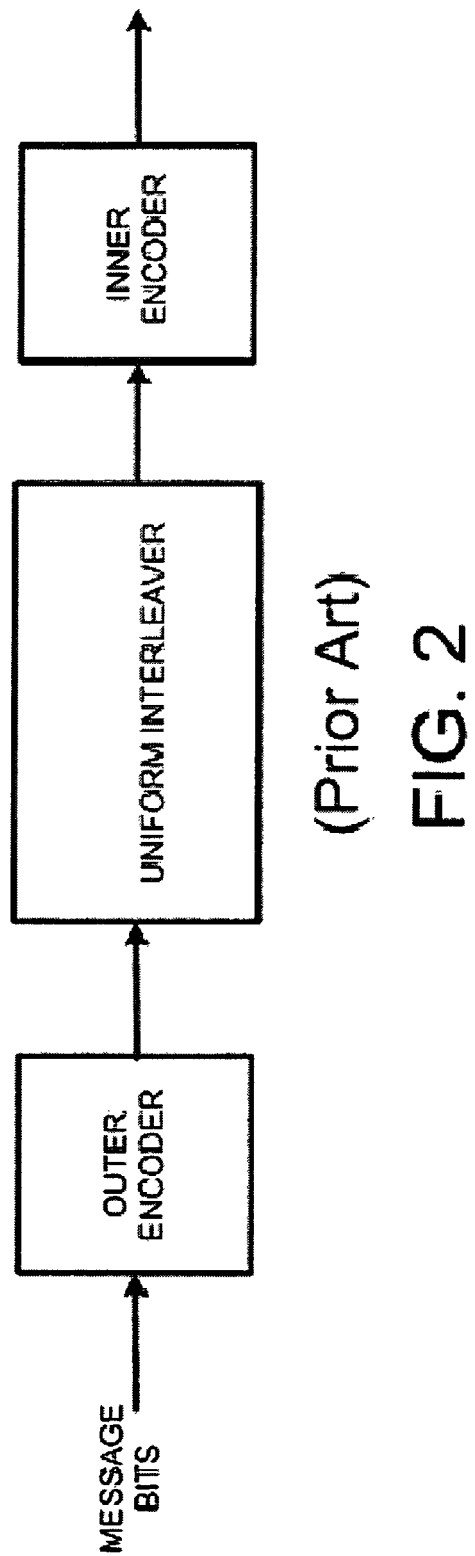
FIG. 2 illustrates a prior art encoder that generates a serially concatenated code.

As can be seen from the above, compared with uniform interleaving, constrained interleaving suffers in terms of number of possible interleavers. In order to reduce the gap between the number of interleavers of the two types of interleaving, equation (42) also suggests that it is desirable to employ as small of a value of r as possible, however, by ensuring that r is large enough to maintain the overall minimum weight of the concatenation at $d_f^0 d_f^i$. Despite the reduction in the number of interleavers, constrained interleaving eliminates all possible error events when s=1 except for the error event that occurs at the end of termination bits. It can be observed that the minimum weight of the concatenation when s=1 results when $l=d_0$ and when all of the $d_0$ "1"s of the interleaver are placed at the lower right corner of the r by rρn interleaver array as highlighted in FIG. 2, and any other arrangement of $d_0$"1"s can generate a very high distance of the concatenation. With the proper selection of r, this minimum weight is at least $d_f^0 d_f^i$. Denoting the maximum message weight of a minimum weight codeword of the outer code by $w_m$, and noticing that $c_{d_0}$ in equation (41) is the number of codewords of the outer code with minimum weight $d_0$, the contribution to error probability by the highlighted bits in FIG. 2 can be bounded as $$P_{e1} < \frac{w_m \rho c_{d_0}}{k \binom{m}{d_0}} Q\left(\sqrt{\frac{2 d_0 d_f^i R E_b}{N_0}}\right). \quad (43)$$

It is seen from equation (43) that in addition to maintaining the weight at the highest possible minimum distance of the concatenation, $P_{e1}$ also achieves interleaver gain. It is noted that the s=1 case with uniform interleaving can have $\alpha_M$ and $h(\alpha_M)$ in equations (38) and (39) with maximum possible $n_i$, and it can also have all other lower values of $n_i$ down to $n_i=1$ which are likely to have lower weights for the concatenation.

Next consider the general case of s ($1<s \leq r\rho$) non-zero codewords of the outer block code feeding coded bits into the interleaver. In order to focus on the worst case performance contributions, let us consider the case where each of these s codewords has the minimum weight $d_0$, generating a weight of $sd_0$ in the interleaver. The corresponding number of possible constrained interleavers can be found by considering the random distribution of s codewords among the rows and considering the randomization of the contents of the rows individually. Let us represent any kth distribution of the codewords among rows in the form of a sequence $$y_k = (y_1, y_2, \ldots, y_r), \quad 0 \leq y_j \leq \text{Min}(\rho, s) \tag{44}$$

where, $y_j$ represents the number of codewords placed in the $j^{th}$ row with $$\sum_{j=1}^{r} y_j = s.$$

Denoting the number of non-zero elements of $y_k$ by $t_k$, the number of possible constrained interleavers resulting from s nonzero outer codewords each with weight $d_0$ can be written as $$N_s = \sum_k \binom{r}{t_k} \prod_{j=1}^{r} \binom{n\rho}{y_j d_0}. \tag{45}$$

For example, $$N_1 = r\binom{n\rho}{d_0}, \quad N_2 = \binom{r}{2}\binom{n\rho}{d_0}\binom{n\rho}{d_0}u(r-2) + r\binom{n\rho}{2d_0}u(\rho-2) \tag{46}$$

are the numbers of constrained interleavers that result from one and two non-zero codewords of the outer code respectively, where u(.) is the unit step function. Focusing on the dependence on r, $\rho$, $d_0$ and n, it can be seen from equations (45) and (46) that $N_s$ is in the order of $r^s(n\rho)^{sd_0}$.

The contribution to the error rate in equation (35) made by s non-zero codewords of the outer code each with minimum weight $d_0$. Since the minimum input weight of an error event of the inner code is two, the maximum number of error events in the inner code is $n_{i,max} = d_0 \lfloor s/2 \rfloor$, where $\lfloor . \rfloor$ denotes the floor function. Further, when $s \geq 2$, the minimum number of error events of the inner code with constrained interleaving (without termination) is $d_0$. Next consider $n_i$ ($d_0 \leq n_i \leq n_{i,max}$) error events of the inner code each with minimum weight $h_m(j)$ corresponding to the input weight j, and denote the number of error events with input weight j by $x_j$, $j=2, 3, \ldots, s$. The values of $x_j$ can be represented in the form of an error event distribution sequence as $x=(0, x_2, \ldots, x_s)$. Note that (a) any $x_j$, and hence $n_i$ too, is either zero or an integer multiple of $d_0$ with a maximum possible value equal to $d_0 \lfloor s/2 \rfloor$, $$\sum_{j=2}^{s} x_j = n_i, \text{ and} \tag{b}$$

$$\sum_{j=2}^{s} jx_j = sd_0. \tag{c}$$

Let $p=n_i/d_0$, then the maximum value of p, $p_{max}=\lfloor s/2 \rfloor$. In order to find the contribution from s non-zero codewords of the outer code in equation (35), it is also necessary to find the number of ways n, error events with the associated error event distribution x can be arranged in the interleaver. For any given x, all $d_0 x_j$ error events are determined by the placement of $x_j$ codewords each with weight $d_0$. Hence, the number of ways $n_i$ error events with error event distribution x can be placed in the interleaver is $N_p$. Observing that the resulting weight of the coded sequence of the concatenation corresponding to these $n_i$ error events of the inner code is $$d_a = \sum_{j=2}^{s} x_j h_m(j), \tag{47}$$

the corresponding contribution to $P_{be}$ in equation (35) can be written as $$P_{e2}(s, x) < \frac{sw_m \rho c_{d_0}^s \binom{r\rho}{s} N_p}{rk\rho N_s} Q\left(\sqrt{\frac{2d_0 R E_b}{N_0}}\right). \tag{48}$$

Equations (47) and (48) can be used to find the significant contributions from all error events that result from s($>1$) non-zero codewords of the outer code excluding the error events that occur at the termination. When s>1, the contributions from error events due to termination have a higher distance and a higher interleaver gain than those in equation (43) when s=1, and hence, the contributions made by the error events when s>1, due to termination are negligible.

Note from equation (48) that, for given s, the lowest interleaver gain is achieved by the combination with $p=p_{max}$. Focusing on the dependence on $\rho$, r, and n, the order of the corresponding error coefficient with the lowest interleaver gain, $O(E_{coeff,cons})$, is $$O(E_{coeff, cons}) = \tag{49}$$

$$\begin{cases} \frac{sw_m c_{d_0}^s}{k} sw_m c_{d_0}^s r, \left(\frac{s-2}{2}\right) n^{-\frac{sd_0}{2}} \rho^{-\left(\frac{sd_0}{2}s+1\right)}, & s \text{ even} \\ \frac{sw_m c_{d_0}^s}{k} sw_m c_{d_0}^0 r, \left(\frac{s-3}{2}\right) n^{-\left[\frac{(s+1)d_0}{2}\right]} \rho^{-\left(\frac{d_0 s}{2}+\frac{d_0}{2}s+1\right)}, & s \text{ odd} \end{cases}$$

From the dependence on $\rho$ in equation (49), it is observed that the error rate variation in equation (48) achieves interleaver gain for all values of s when $d_0 \geq 2$. Hence, as with uniform interleaving, all error events with constrained interleaving with an inner recursive code achieve interleaver gain. In addition, it is also seen from equation (49) that it is desirable to use component codes for which $n^{d_0/2} > rc_{d_0}$, as this can decrease the error coefficient with increasing values of s. However, the latter condition may not be that important for many combinations of component codes due to the increase in the weight of the concatenation with increasing values of s.

One important contribution in equation (48) is the one that corresponds to the minimum weight of the concatenation, which with constrained interleaving is maintained at $d_0 d_f^i$. Note that the minimum weight of the inner code is $$d_f' = \underset{u}{\text{Min}}\, h_m(u) = h_m(\lambda),$$

where $\lambda$ is the input weight of the inner code that generates the minimum weight of the code. The minimum weight of the concatenation results from $s=\lambda$ non-zero outer codewords of the outer code each with weight $d_0$ when $p=1$. Hence, the contribution to $P_{be}$ corresponding to the minimum weight of the concatenation is given by $$P_{e3} < \frac{\lambda w_m c_{d_0}^\lambda \binom{r\rho}{s} N_1}{rk\rho N_s} Q\left(\sqrt{\frac{2d_0 d_f' RE_b}{N_0}}\right). \quad (50)$$

It is seen the error coefficient of the variation in equation (50) can decrease fast with increasing $\rho$ especially at higher values of $\lambda$.

The contributions in equations (43) and (49), the $P_{be}$ variation with constrained interleaving can be written as $$P_{e,constrained} < P_{e1} + \sum_{s \geq 2, x} P_{e2}(s, x). \quad (51)$$

It is noted that depending on the component codes, the interleaver size and the SNR, the error rate can be dominated by one of the variations in equation (51). It is likely that at very low error rates the variation with the lowest distance given by $P_{e3}$ in equation (50) dominates the overall performance. Similarly, at lower SNR values it is likely that the variation with the lowest interleaver gain (that is likely to be the term in equation (48) with $s=2$ and $p=p_{max}=1$) dominates the overall performance.

The number of rows of the interleaver, r, is selected to ensure that the overall minimum distance is strictly maintained at $d_0 d_f^i$. However, for a given interleaver size $N=r\rho n$, by sacrificing the minimum distance, it is possible to increase $\rho$ thereby increasing the interleaver gain. Hence, even though the selection of r, to guarantee the minimum distance at $d_0 d_f^i$ is a good starting value of r, depending on the desired error rates and component codes, it may be possible to improve performance by lowering the value of r, and sacrificing the minimum distance slightly. The final best value of r, can be numerically found using the bound in equation (51) depending on the application.

We next compare the performance of SC-IRCC with constrained interleaving to SC-IRCC implemented with uniform interleaving. It is recommended in the literature [6] that serial concatenation be used with odd values of $d_0$ with uniform interleaving. Hence, we compare SC-IRCC that uses constrained interleaving with uniform interleaving when $d_0$ is odd. In order to carry out the comparison, it is first necessary to develop the error rate variation of uniform interleaving with an outer block code and an inner recursive code. Even though in uniform interleaving it is not necessary to consider the interleaver in a row/column format, for comparison with constrained interleaving, we consider the same row/column format for the uniform interleaver too which is equivalent to a uniform interleaver with size $N=r\rho n$.

Consider $s \geq 1$ non-zero codewords of the outer code. Since uniform interleaving has no structure to control error events, in order to capture the significant contributions in equation (35), we consider all possible weights (not just weight $d_0$) of the s codewords. Let us consider s codewords with weights expressed in a sequence as $u=(u_1, u_2, \ldots, u_s); d_0 \leq u_j \leq n$. We can group these codewords into $e(\leq s)$ non-empty groups, $g_1, g_2, \ldots, g_e$ according to their weights so that weights of all codewords in group $g_j$ is the same which is denoted by $d(g_j)$ and the number of codewords in group $g_j$ is $z(g_j)(\geq 1)$. Note that $$\sum_{j=1}^{e} z(g_j) = s.$$

The corresponding interleaver weight is $$l = \sum_{j=1}^{s} u_j = \sum_{j=1}^{e} d(g_j) z(g_j).$$

The maximum number of error events of the inner code is $n_{i,max} = \lfloor l/2 \rfloor$, while the minimum number of error events is one in contrast to the minimum number of $d_0$ error events in constrained interleaving. Consider the case of $n_i (1 \leq n_i \leq n_{i,max})$ error events of the inner code each generating the minimum weight of the coded bits for that input weight, and denote the input weight of the jth error event by $q_j$. These input weights can be expressed in an error event distribution sequence as $q=(q_1, q_2, \ldots, q_{n_i})$, $0 \leq q_j \leq n_i$. Note that $$\sum_{j=1}^{n_i} q_j = l$$

and the weight of the coded sequence of the concatenation is $$d_{uni} = \sum_{j=1}^{n_i} h_m(q_j). \quad (52)$$

Hence, the contribution to $P_{be}$ made by s non-zero codewords of the outer code with error event distribution q is $$P_{ed} < \sum_{s \geq 1, u, q} \frac{\left(\sum_{k=1}^{s} w_{u_k}\right)\binom{r\rho}{s}\left(\prod_{k=1}^{s} c_{u_k}\right)\binom{r n \rho}{n_i} s!}{k\rho r \binom{r n \rho}{l}\left(\prod_{j=1}^{e} [z(e_j)]!\right)} Q\left(\sqrt{\frac{2 d_{uni} RE_b}{N_0}}\right). \quad (53)$$

The performance with uniform interleaving can be found by using equation (53) and summing over significant combinations of s, u and q. It can be seen that there are significant contributions with $s=1$. Recall that all regular merging events with $s=1$ are eliminated with constrained interleaving. In addition to generating smaller weights of the concatenation, the $s=1$ case can achieve the smallest possible interleaver gain too. It follows from equation (53) (and from equation (37)) that the minimum interleaver gain for given l is achieved with $n_i=n_{i,max}$. Hence, when $d_0$ is odd, the weight $d_{f,eff}{}^i(d_0+1)/2$ for the concatenation is generated from a single codeword (s=1) with weight $(d_0+1)$ of the outer code. It follows from equation (47) that in constrained interleaving a similar term with a weight of $d_0 d_{f,eff}{}^i$ results from two codewords (s=2) of the outer code. Clearly, the weight with constrained interleaving is higher than that with uniform interleaving. Further, even though for given values of s and l, the number of uniform interleavers is higher, the comparable terms of the two interleavers usually result from two different values of s, and hence, the actual comparison of the error coefficients can also favor constrained interleaving over uniform interleaving. For example, considering the dependence on r, ρ and n corresponding to the above two weights, it follows from equations (48) and (53) that the ratio of the error coefficients of constrained interleaving to uniform interleaving is on the order of $[r^{d_0+1)/2}n^{-(d_0-1)/2}\rho^{-(d_0-3)/2}]$. Hence, for smaller values of r, (compared with the product nρ) constrained interleaving can have smaller error coefficients in addition to the higher distances of the corresponding terms.

The focus in the design of serial concatenation with uniform interleaving is to achieve the maximum interleaver gain and not to remove terms that correspond to lower weights in equation (35). With that focus some of the lower weight terms can also end up achieving the lowest interleaver gain as can be seen from equation (38) for the case corresponding to s=1, l=$(d_0+1)$ and $n_i$=l/2 when $d_0$ is odd. Hence, these lower weight terms with minimum interleaver gain can dominate the overall error rate in equation (35). Constrained interleaving on the other hand removes lower weight terms and also achieves interleaver gain in the remaining terms. Even though the interleaver gains of the two types of interleavers at any given l, compare favorably for uniform interleaving, the interleaver gains of constrained interleaving at similar type of weights can be lower than those of uniform interleaving. Hence, constrained interleaving can perform better than uniform interleaving at the same interleaver size or can be used to improve the performance over that of uniform interleaving with smaller interleaver sizes.

Another inherent undesirable property of uniform interleaving is the existence of its error rate floor which can be an important consideration especially at low error rate applications such as in optical communications and in magnetic recording. The reason for the relatively high error rate floor is due to the presence of low weight codewords of the concatenation. Specifically, the minimum weight of the concatenation $h_m$ is the minimum of all $h_m(l)$, or any combinations of $h_m(l_i)$s with $$\sum_i l_i = l$$

that correspond to a valid weight of the interleaver l generated by the outer code. On the other hand, constrained interleaving achieves the highest possible minimum weight of the concatenation that has the corresponding error rate variation in equation (43). Hence, the performance gain of constrained interleaving over uniform interleaving can be even more significant at low error rates.

In addition to achieving performance gains, constrained interleaving also has other advantages over uniform interleaving due to a smaller interleaver size. The smaller interleaver size of constrained interleaving reduces the delay and the memory requirement of the decoder. It also reduces the computational complexity by reducing the number of iterations when iterative decoding is used. In order to minimize the number of iterations, it is desirable to employ a stopping criterion, among many that have been discussed in the literature to stop the iterations. These various stopping criteria decide to stop iterations based on the invariability of the decoded bits within a frame. The invariability of decoded bits is measured using various respective metrics. Since it is more likely to find variations in the decoded bits within a frame when the frame size is larger, the average number of iterations with a longer interleaver is higher than that with a shorter interleaver at the same error rates. This is supported by the numerical results reported in the literature. Hence, decoding with a constrained interleaver that has a smaller interleaver size, on average, requires a fewer number of iterations than decoding with a much larger uniform interleaver. Since the number of computations per bit in a single iteration is the same for decoding with both interleavers, the total decoding computational complexity with constrained interleaving is therefore lower than that with uniform interleaving. The exact amount of saving in complexity depends on the component codes, the sizes of the two interleavers, and the operating error rate.

The recovery of channel state information (CSI) can also be simpler with constrained interleaving. If the channel is a slow varying channel, a decision feedback equalizer (DFE) that neglects any variations of the channel within a frame and uses the decoded bits to estimate the channel for the next frame can be better constructed with a decoder that has a smaller interleaver size than with uniform interleaving. With a smaller interleaver size, the channel is more likely to remain constant over a frame, and the estimated channel parameters by the DFE are more likely to be the channel parameters for the next frame. A similar advantage can be found if joint channel estimation and decoding is employed. It is known that joint channel estimation and decoding is possible with iterative decoding by updating channel information along with extrinsic information during iterations. However, such joint channel estimators/decoders require a significantly large number of iterations. If joint channel estimation and decoding is used, compared with uniform interleaving, constrained interleaving with a smaller interleaver will require a lower number of iterations as it can stabilize the channel estimates and the decoded bits faster, thereby reducing the complexity. The difference in number of iterations between constrained and uniform interleaving is likely to be higher with joint channel estimation and decoding than with decoding only. However, if CSI is recovered using training sequences which can be done prior to decoding, the CSI recovery will be independent of the type of the interleaver.

So far we have been considering block codes for the outer code of the concatenation. We next discuss how trellis based convolutional codes can also be used as the outer code along with an inner recursive convolutional code. It is known that the outer code can be either recursive or non-recursive, and further non-recursive outer convolutional codes perform slightly better than recursive outer convolutional codes [6].

In case of outer convolutional codes, regardless of the type of the interleaver, the outer code should be terminated at the end of every block. In case of constrained interleaving, the coded bits of the outer code with the termination are used to fill up the r by m rectangular array. It is noted that, unlike selecting the value of m as a multiple of the codeword length as in case of outer block codes (ρn), the value of m can be arbitrarily selected in case of outer convolutional codes.

When extending constrained interleaving with outer block codes to outer convolutional codes, care should be taken due to the fact that error events can start from any bit, where as in case of block codes these errors are restricted to codewords of length n which have well defined starting and ending points. In order to accommodate for this change, it is necessary to modify the constrained interleaving procedure from that of outer block codes described in connection with FIG. 13. Specifically, constrained interleaving with outer convolutional codes can be implemented according to the following three actions:

1. Feed the coded bits of the outer code into the r by nρ array along rows starting from the first row.
2. Randomize the contents of the rows independently. This action should be modified from that of outer block codes. It can be done in two different methods, Method 1 and Method 2, depending on the selected scheme as discussed below.
3. Shuffle the r rows without changing the contents in them.
   *Shuffled_Rows=Rand(*Rows),
   where *Rows is the r-element vector of pointers to the rows of the constrained interleaver and *Shuffled_Rows is a vector of pointers to the randomized-ordered rows of the constrained interleaver after row shuffling.

Action 2 above can be implemented in two different ways depending on the construction of the concatenated code. One easy method to maintain the same randomization method used with outer block codes (810) is to remove the influence of the last bits of any row from the starting bits of the next row. This can be done by terminating every row separately which is referred to as Method 1 here. In this method action 2 above will be identical to action 2 with outer block codes 810.

It is also possible to use a different method without terminating rows individually which leads to Method 2. Method 2 focuses on separating the last several bits, say n bits, of any row from the first n bits of the next row to overcome their dependence without terminating every row separately. The value of n can be chosen to be the path memory length of the outer code which is the length of any non-zero coded sequence that has a weight of at least the minimum distance of the code. The last n bits and the first n bits of two different rows can be separated by first selecting a set of $m_{mid}$ columns placed in the middle of the r by nρ array and preserving the right hand side and the left hand side of it for the last n bits and the first n bits respectively during 810. In other words, during the 810, the last n bits of any row are randomized only over the columns right of the $m_{mid}$ identified columns. Similarly, the first n bits of every column are randomized only over the columns left of the $m_{mid}$ columns. However, other bits of any row are randomized over all columns. The value of $m_{mid}$, that depends on the inner code, should be selected to maintain the minimum distance of the concatenation at $d_0 d_f^i$. Even though this additional restriction on the first n and the last n bits of every row reduce the number of possible constrained interleavers, its impact diminishes with increasing values of m.

To help understand the performance of SC-IRCCs implemented with constrained interleaving, we present numerical results comparing constrained interleaving with uniform interleaving. Consider a (7,4) outer Hamming code with $d_0$=3 along with a 4-state recursive inner code with generating matrix $$G(D) = \left[ 1 \quad \frac{1+D^2}{1+D+D^2} \right]. \tag{54}$$

The code in equation (54) has $d_f^i$=5, $d_{f,eff}^i$=6 and $h_m(3)$=5. Analyzing the error events of the above inner code, it can be found that r=4 is sufficient to maintain the minimum distance of the concatenation with constrained interleaving at $d_0 d_f^i$=10 among all error events except for the error event that corresponds to the termination highlighted in FIG. 12 that has the error rate variation in equation (43). Depending on the application and the size of the interleaver, if the variation in equation (43) is negligible r=4 can be used, and if not r=8 should be used that guarantees the overall minimum distance at 15.

Figure 14:
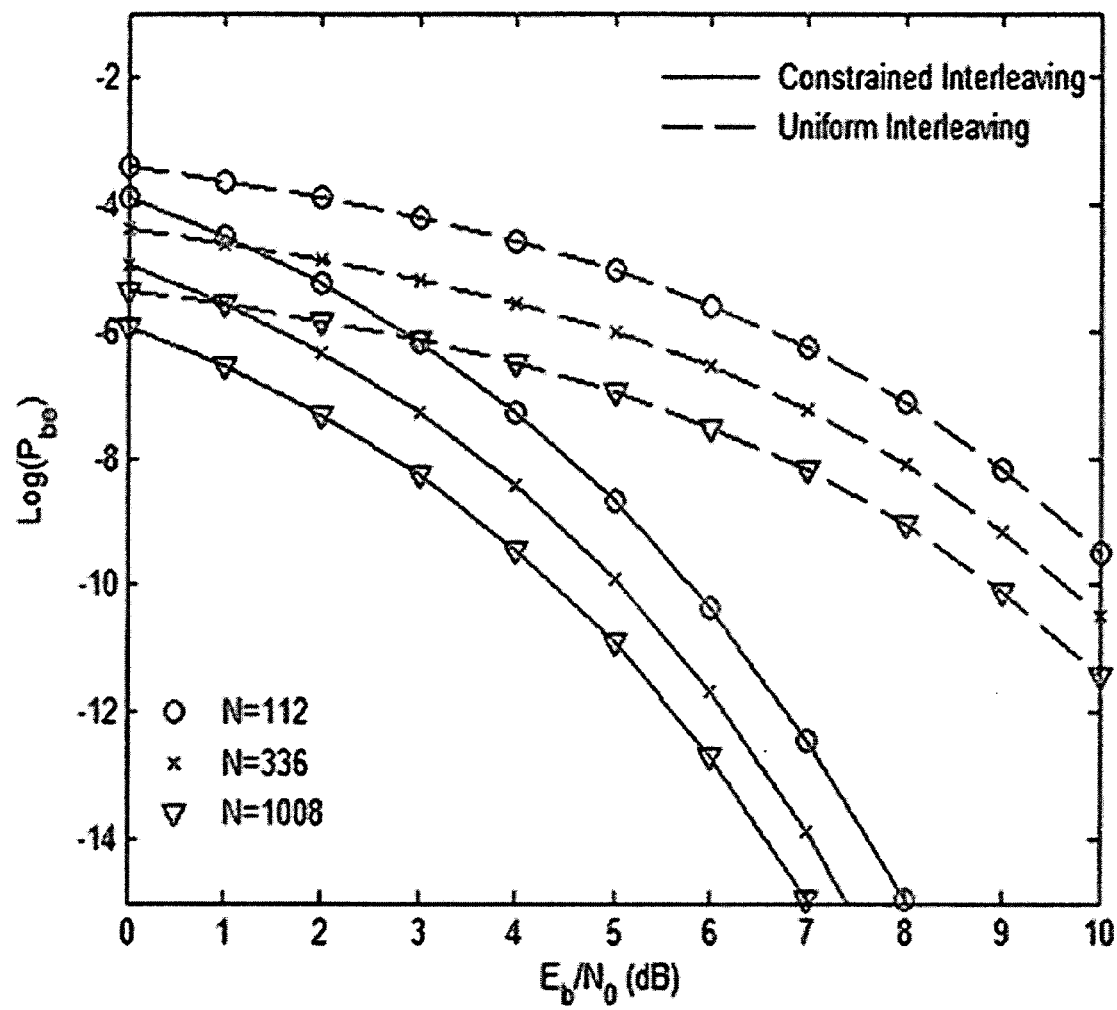
FIG. 14 shows bit error rate performance curves of uniform and constrained interleaving of an outer (7,4) Hamming code and a rate ½ inner recursive convolutional code when r=8 and with interleaver lengths of N=112 and N=336 and N=1008.

FIG. 14 shows the error rate variations of uniform and constrained interleaving of an SC-IRCC using an outer (7,4) Hamming code and a rate ½ inner recursive convolutional code when the interleaver lengths of are set to N=112 and N=336 and N=1008. Performance curves for three different interleaver sizes are shown. As can be seen, much lower error rates are reached by the concatenated code with the constrained interleaver than with a uniform interleaver of the same length. This allows much shorter interleavers to be used to reach a target bit error rate for a given signal to noise ratio in a practical implementation.

Figure 15:
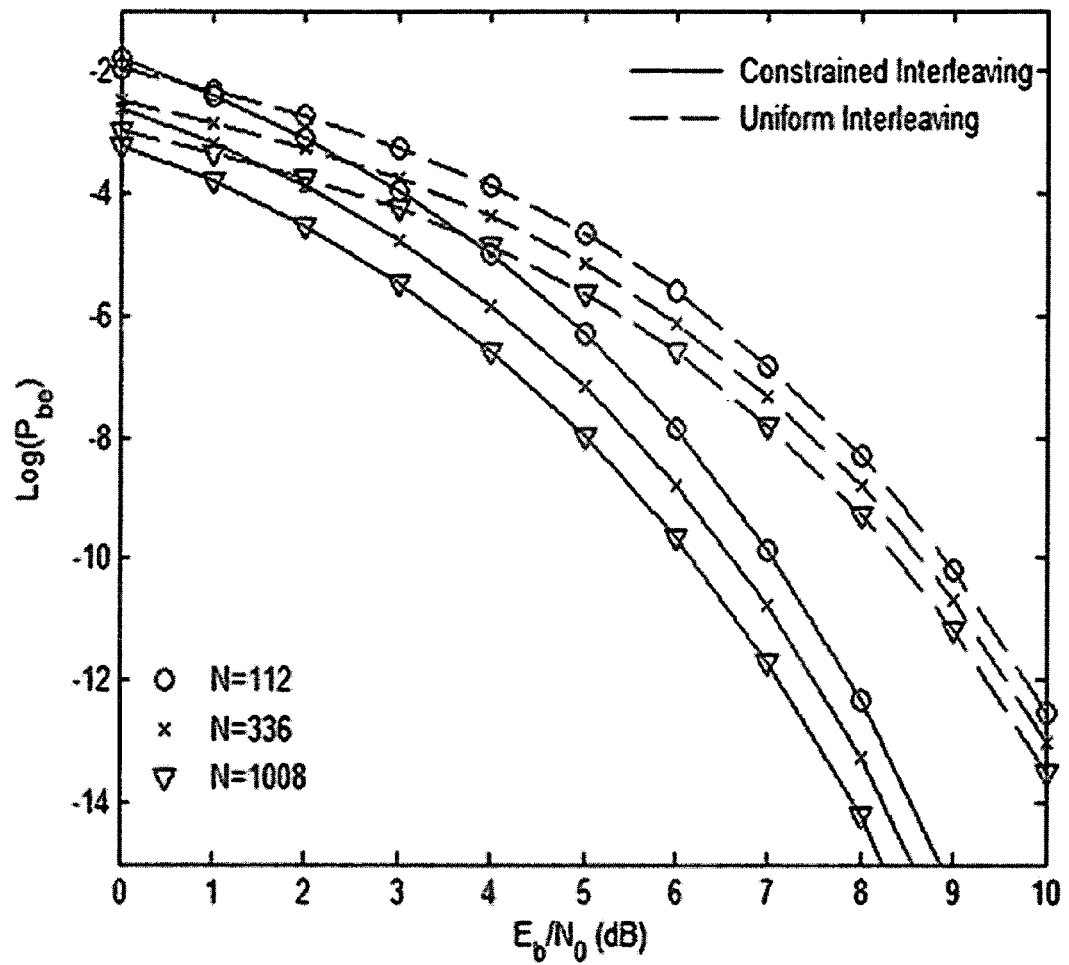
FIG. 15 shows bit error rate performance curves of constrained interleaving with a (7,6) outer SPC code and along with a rate ½ inner convolutional code and compares this to the same code implemented with uniform interleaving with interleaver lengths of N=112 and N=336 and N=1008.

FIG. 15 shows the error rate variations of constrained interleaving with a (7,6) outer SPC code and along with a rate ½ inner convolutional code of equation (54). FIG. 15 compares SC-IRCC implemented with uniform interleaving and with constrained interleaving when the interleaver lengths of are set to N=112 and N=336 and N=1008. In the literature full rate recursive inner codes have been used to improve the overall rate. It is seen from FIG. 15 that constrained interleaving performs better than uniform interleaving and constrained interleaving achieves interleaver gains that are similar or better than those with uniform interleaving. It is also seen that constrained interleaving can achieve better performance with a much smaller interleaver size, and the improvement becomes more significant at lower error rates.

Other embodiments use (8,7) and (4,3) SPC outer codes (k=7 and k=3) with rate ½ IRCCs with υ=2 and υ=3. This can be modulated by BPSK, 4-PAM or some other modulation format like QAM and transmitted over a channel. The constrained interleaving based structures as presented in FIGS. 4-6 for SC-IRCC are then applied to reduce the number of needed decoder iterations. The number of columns of the interleaver is left as an adjustable parameter than can be optimized for a given code, modulation type and channel and a value that optimizes performance is preferably selected. In order to ensure the maximum possible minimum distance, 8 rows when υ=2 and 11 rows when υ=3 can be used. The impact of reducing the number of rows to a point that sacrifices the minimum distance constraint can also be considered if the reduction in error coefficient offsets and surpasses the lost due to distance.

So far with constrained interleaving with IRCC targets an overall minimum distance of $d_0 d_f^i$. Due to the nature of recursive codes, by sacrificing interleaver gain, the minimum distance of the code can be further improved. For example, let us consider the serial concatenation of the (7,6) outer code with the IRCC given by (54) with constrained interleaving considered in FIG. 15. The error event with minimum distance with probability (50) is resulted by having two non-zero columns with (1 1 1) segments generated from three weight two SPC codewords placed on three rows. This error event can be prevented by further constraining the interleaver to not allow more than a single bit (in general ($d_0$−1) bits) from two different outer codewords to be placed along any single column of the array. This not only prevents the error events with $d_0d_f^i$, it also prevents all error events with distance $d_0h_m(j)$ of the concatenation for j≥2. Hence, with this extended constraint the minimum distance of the overall concatenation with the added constraints can be increased beyond $d_0d_f^i$ and the value it reaches can be controlled by the additional constraints put on the interleaver. The number of rows can be appropriately increased depending on the target minimum distance, or alternatively, additional constraints can be imposed to place coded bits of the same codeword of the outer code along the same row with a minimum separation of preselected number of rows between any two bits of that codeword.

The constrained interleaver with additional constraints can be implemented by first constructing the interleaver as described in FIG. 13 and checking for additional constraints. If all additional constraints are satisfied the interleaver is selected for application, and if not, additional work is required. The additional work can be listed as:

1. Randomly select a row from the interleaver found by FIG. 13 as that row of the new interleaver. Check for constraints. If all are satisfied move to step 2. If not, keep randomizing that row it until all constraints are satisfied. (There are constraints in this step only if a minimum column separation is required between coded bits of the same codeword)

2. Randomly select another row. Check for all individual and joint constraints with already selected rows. If all constraints are satisfied move to step 3. If not, keep randomizing the selected row again until all constraints are satisfied.

3. Repeat step 2 until all rows are selected.

The extended constraints reduce the available number of interleavers thereby reducing the interleaver gain. Hence, these additional constraints in constrained interleaving provide a tradeoff between the distance and the interleaver gain. The best tradeoff can be selected based upon numerical simulation studies that look for the best set of constraints to be used for a particular set of codes and/or modulation/mapping schemes, depending on the application.

Any or all of the constrained interleaving techniques as discussed herein can also be applied to parallel concatenation (such as turbo codes). However, this can only guarantee that the second constituent code can spread the error events. As a result, it cannot guarantee the product of the distances for the concatenation. Due to the improvement in the second constituent code, the constrained interleaving methods, apparatus, and systems presented herein can improve performance of parallel concatenated codes over uniform interleaving. In the case of the parallel concatenated codes, the additional constraints described in the above can also be used. This provides a means to improve interleavers such as those disclosed in U.S. Pat. No. 6,857,087 due to a higher interleaver gain and due to having a target overall minimum distance to control the design.

In the 4-PAM (16-QAM) case, this embodiment can be used to improve upon the rate ½ CTC that has been adopted in the WiMAX standard with an interleaver size of 960. For example, even though the above serially concatenated cases have slightly a lower rate (specifically, rate of the concatenation is k/[2(k+1)]) than the CTC, they perform significantly better with a shorter interleaver length and a lower decoding complexity.

It should be noted that the SC-IRCC approach with constrained interleaving is an attractive alternative to communication standards that use turbo codes such as 3GPP and 3GPP2. For example, much shorter interleavers and simpler codes can be used to achieve the same bit error rate performance. The BICM schemes used in 802.11a/g and 802.16 can also be replaced with a more efficient SC-IRCC coding scheme that makes use of constrained interleaving. All such system level embodiments are contemplated by the present invention. It is also contemplated that SC-BC and SC-IRCC can be used in the encoding of backbone optical links and for magnetic recording channels.

As discussed previously, the transmitter 300 can be implemented to generate improved trellis coded modulation schemes by selecting the inner code to be a non-recursive convolutional code (trellis code). When the mapper 320 is used, we call this improved form of trellis coded modulation SCITC (serial concatenation with inner trellis code).

For demonstration, we consider a SCITC scheme that employs an outer (n,k) block code with minimum Hamming distance $d_0$ and an inner trellis code constructed by memory υ convolutional code followed by a mapper as illustrated in FIG. 3. Denoting the raw MSED value of the inner trellis code corresponding to an interleaver weight u by $D_u^2$, the overall MSED of the concatenation with uniform interleaving can be written as $$D_{min,uni}^2 = \underset{u \ge d_0}{\text{Min}}\, D_u^2 = D_{u_m}^2 \tag{55}$$

where, $u_m$ is the value of u that minimizes $D_u^2$ in equation (55). It is seen from equation (55) that the impact of $d_0$ on the MSED is simply to prolong the error event that determines the minimum distance, and hence, its impact on the MSED is not usually that significant. In constrained interleaving with SCITC, the objective is to achieve the highest possible MSED for the concatenation while preserving the advantages of interleaving. The constrained interleaver is constructed using the method shown FIG. 13 and the related discussion. That is, the constrained interleaver for SCITC is implemented as the IRCC case described above. When the constrained interleaver 1300 is used, any codeword of the outer code have the freedom to be placed in any row, codewords have the freedom to get mixed up randomly, and coded bits of any codeword get placed along the same row of the interleaver.

When the value of r is large enough to ensure that the all non-zero coded bits of the outer code are pushed into different error events of the inner code with minimum distance, the concatenation can achieve the highest achievable MSED. Specifically, the constrained interleaving can achieve an overall MSED of $$D_{min,cons}^2 = d_0 \underset{u}{\text{Min}}\, D_u^2 = d_0 D_{u_{min}}^2 \tag{56}$$

for the concatenated code, where $u_{min}$ is the input weight that minimizes the MSED of the inner code. Due to the linear dependence of the MSED on $d_0$ in equation (56), the MSED with constrained interleaving can be significantly higher than that with uniform interleaving.

Consider the case where the SCITC is transmitted over an AWGN (additive white Gaussian noise) channel with power spectral density $N_0/2$. Our desire is to compare SCITC with constrained interleaving to the same SCITC, but implemented with uniform interleaving. We use the union bound approach as in (35) for the analysis and consider the contributions to the bit error rate, $P_{be}$, from the dominant terms in the bound. Throughout this analysis, the distance and the weight of the outer code refers to the Hamming distance and the Hamming weight while the distance of the inner code or of the concatenation refers to the Euclidean distance. For the analysis, we again consider the weight enumerating function (WEF) of the (n,k) outer block code in the form [6]:

$$A(L) = 1 + \sum_{i=d_0}^{n} c_i L^i \quad (57)$$

where, $c_i$ is the number of codewords with weight i.

Consider the impact of a single non-zero codeword of the outer code with minimum weight $d_0$. With constrained interleaving, all of the $d_0$ "1"s in the interleaver will be placed along a single row. Realizing that there are r ways to select a row and $$\binom{n\rho}{d_0}$$

ways to select columns on that row, the corresponding number of constrained interleavers can be written as $$N_1 = r\binom{n\rho}{d_0}. \quad (58)$$

In the inner code each of these "1"s can generate a separate error event with MSED $D_1^2$, making the total MSED of the concatenation $d_0 D_1^2$. Since there are $r\rho$ ways to select a single non-zero codeword of the outer code, and $N_1$ ways to have $d_0$ error events in the inner code, the corresponding contribution to $P_{be}$ resulting from a single non-zero codeword of the outer code with weight $d_0$ can be bounded as $$P_{e1,cons} \leq \frac{w_{d_0} c_{d_0}}{k} Q\left(\sqrt{\frac{d_0 D_1^2}{N_0}}\right) \quad (59)$$

where, $w_j$ denotes the maximum message weight of a codeword with weight j of the outer code. The inequality in equation (59) results from the fact that the message weight for some codewords with weight $d_0$ can be smaller than $w_{d_0}$. It is seen from equation (59) that $P_{e1,cons}$ does not achieve any interleaver gain.

Next compare equation (59) with the error rate variation of the corresponding case with uniform interleaving. Even though in uniform interleaving it is not necessary to consider the interleaver in a row/column format, for comparison with constrained interleaving, we consider the same row/column format for the uniform interleaver too is which is equivalent to a uniform interleaver with size $N=r n\rho$. When the interleaver weight is $d_0$, the inner code can have any l number of error events, where $1 \leq l \leq d_0$. The error rate variation when l=1 can be found by realizing that are $$\binom{r n\rho}{d_0}$$

uniform interleavers, and there are $r n\rho$ ways to have a single merging event in the inner code (as in the literature the length of the error events are neglected here). Hence, the corresponding contribution to $P_{be}$ is $$P_{e1,1,uni} \leq \frac{w_{d_0} c_{d_0} r}{k\binom{r n\rho}{d_0}} Q\left(\sqrt{\frac{D_{d_0}^2}{N_0}}\right) \quad (60)$$

Clearly, the variation in equation (60), has a lower distance but achieves interleaver gain for $d_0 \geq 2$ as the error coefficient can be lowered by increasing $\rho$. Similarly, when $l=d_0$, the contribution to $P_{be}$ is identical to equation (59). Hence, it is seen that uniform interleaving has lower weight terms that can achieve interleaver gain, and their effect can be made insignificant by increasing the size of the interleaver. However, the error rate with uniform interleaving cannot be lowered below that in equation (59). Hence, the performance with uniform interleaving is lower bounded by equation (59). It is further mentioned that the impact of multiple number of non-zero codewords can increase the distance but can have error coefficients that increase with increasing interleaver size. For example, when s non-zero codewords, each with weight $d_0$, generate $sd_0$ error events in the inner code, its contribution to $P_{be}$ with constrained and uniform interleaving are both given by $$P_{e2,uni} \leq \frac{s w_{d_0} c_{d_0}^s \binom{r\rho}{s}}{r\rho k} Q\left(\sqrt{\frac{s d_0 D_1^2}{N_0}}\right) \quad (61)$$

Clearly, the error coefficient in equation (61) increases with increasing $\rho$ for $s \geq 2$. Hence, in uniform interleaving, when the interleaver size is increased to reduce the impact of the lower weight terms, the contribution from these higher weight terms can become significant particularly at low to medium signal to noise ratio (SNR) values. Hence, constrained interleaving can achieve the best achievable performance with uniform interleaving with much smaller interleaver sizes. Using analysis similar to the SC-BC and SC-IRCC cases described above, it can also be shown that constrained interleaving also has error coefficients that increase with interleaver size. However, since constrained interleaving can perform well at smaller interleaver sizes the impact of contributions that have increasing error coefficients with interleaver size can be maintained at insignificant levels.

A similar analysis as performed hereinabove for the SC-IRCC case can be performed for the SC-IRCC case where the distance measure of the inner code is the Euclidian distance instead of the Hamming distance. Similar gains are achieved and it is recalled that modified trellis coded modulation schemes can be constructed using an IRCC and the transmitter 400. Such schemes are known to perform better than versions that use non-recursive convolutional codes and a mapper as the inner code. Our simulation studies have confirmed the analysis but the details of this analysis and the simulation results are not presented here due to their repetitive nature relative to what has already been presented hereinabove in the many other examples and cases.

With that in mind, we have considered the serial concatenation of a (10,9) outer SPC code that has $d_0=2$ with an inner (64,45) extended BCH code that has $d_i=8$ (see S. Lin and D. Costello, Jr., *Error Control Coding: Fundamentals and*

Figure 16:
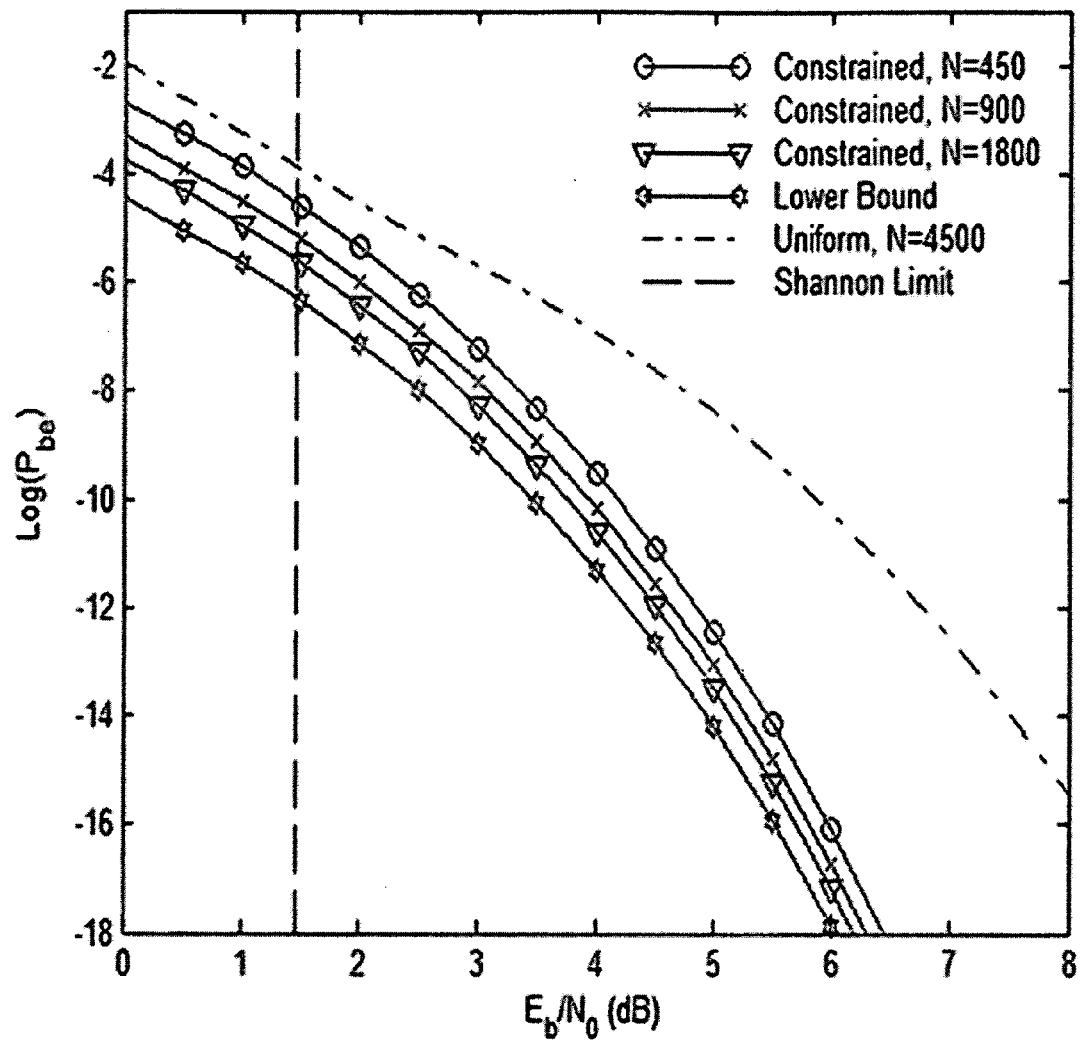
FIG. 16 shows the bit error rate performance curve of a serial concatenation of two block codes, an outer (10,9) SPC and an inner (64,45) extended BCH code; the Shannon limit is also plotted.

*Applications, 2$^{nd}$ Ed.*, Pearson Prentice-Hall, 2004.) This combination of component codes generates a concatenated code with rate R=0.6328. FIG. 16 shows the bit error rate performance curves of this SC-BC implemented with constrained and uniform interleaving. Note that constrained interleavers of size N=450, N=900, N=1800 all come much close to the lower bound than the same code using a uniform interleaver of length 4500.

For a base reference and comparison to other codes, the Shannon limit is also plotted in FIG. 16. The Shannon limit has been calculated by using the expression for the capacity C in one-dimensional signaling given by:

$$C = \frac{1}{2}\log_2\left(1 + \frac{E_b}{N_0}\right) \qquad (62)$$

The above equation calculates the minimum required SNR to reduce the error rate below any desired value when C is equal to the rate of the code R. That is, if C=R is plugged into equation (62), then after a simple manipulation, equation (62) can be written as:

$$\left(\frac{E_b}{N_0}\right)_{Shannon} = 10\log(2^{2R} - 1) \text{ (dB)}. \qquad (63)$$

Equation (63) gives a direct expression for the Shannon limit in terms of the code's rate. This limit helps one to determine the quality and power of the code and to compare it to other codes using the Shannon limit as a reference.

It is seen that from FIG. 16 that the SC-BC implemented with constrained interleaving performs significantly better than when the same SC-BC is implemented with uniform interleaving. It is seen that the performance of constrained interleaving approaches the lower bound as the interleaver size increases. Note that the size of the interleaver is 450ρ. Also note that the performance of the SC-BC implemented with constrained interleaving more or less meets the Shannon limit at error rates in the 10$^{-5}$ region and is within a dB of the Shannon limit even at error rates as low as 10$^{-8}$. Further, as expected, the gain of constrained interleaving over uniform interleaving increases as the error rate decreases. Hence, constrained interleaving is very attractive for optical communications (which target error rates around 10$^{-12}$) and for magnetic recording (which targets error rates around 10$^{-16}$) type applications.

An important use of the Shannon limit is to be able to compare the strength and quality of different types of codes. Many communication standards make use of Turbo codes. Some examples of communication standards that use Turbo codes are 3GPP CDMA cellular air interfaces as well as WiMAX OFDMA. For comparison purposes, we make reference to two more articles in the literature: [17] S. Benedetto and G. Montrosi, "Unveiling of turbo codes: Some results on parallel concatenated coding schemes", IEEE Trans. on Inform Theory, vol. 42, pp. 409-428, March 1996; and [18] U. Wachsmann, R. F. H. Fischer and J. B. Huber, "Multilevel Codes: Theoretical concepts and practical design rules", IEEE Trans. on Inform Theory, vol. 45, 1361-1391, July 1999.

The performance curves of FIG. 16 show that the performance of serial concatenated codes with constrained interleaving can be closer to the Shannon limit than turbo codes [17] and multi-level codes [18] while maintaining a shorter interleaver. For example, see FIG. 15 of [17] that presents results of a rate ⅓ turbo code for different memory lengths and interleaver sizes. It follows from equation (63) that the Shannon limit when R=⅓ is −2.31 dB. It can be seen from FIG. 15 that while the SC-BC performs effectively at the Shannon limit at an error rate of 10$^{-5}$, the best Turbo code (16-state version with length N=1000 interleaver) presented in FIG. 15 of [17] is about 2.5 dB from the Shannon limit at the same error rate of 10$^{-5}$. From FIG. 16, and by drawing a horizontal line at the 10$^{-8}$ error rate, it is seen that the SC-BC with a constrained interleaver of size N=450 is roughly 2 dB away from the Shannon limit. The best turbo code shown in FIG. 15 of [17] is roughly 2.31+2.5=4.81 dB away from the Shannon limit at the same error rate of 10$^{-8}$. Hence, it is seen that an SC-BC with constrained interleaving can be designed to significantly perform better than turbo codes with respect to the Shannon Limit.

Similarly, FIG. 10 of [18] shows that multilevel codes that employ long interleavers (like 20,000 bits) are also about 1 to 1.5 dB away from the Shannon limit at error rates around 10$^{-5}$. Hence, it is seen that an SC-BC with constrained interleaving can be designed to significantly perform better than multilevel codes with respect to the Shannon Limit.

As discussed above, SC-IRCCs can achieve interleaver gain well below the lower bound that limits interleaver gain in SC-BC's. Hence, compared to SC-BCs, SC-IRCCs may be implemented with component codes with lower minimum distance and still produce good results. Further, in order to increase the interleaver gain, it is desirable to increase the number of columns m=nρ of the interleaver array. This implies that when designing SC-IRCCs for use with constrained interleaving, it is desirable to use inner codes for which the minimum required number of rows r is low. As an example, consider an SC-IRCC implemented using a (15,10) extended Hamming code with $d_0$=4 as the outer code, and a rate ⅔ punctured recursive convolutional code with memory υ=2 as the inner code. The minimum distance of this concatenation can be maintained at $d_0 d_f^i$ with constrained interleaving by employing r=4 rows in the interleaver array. The rate ⅔ inner code is constructed starting with a rate ½ recursive convolutional code and using the puncturing pattern (1011). Such high rate punctured convolutional codes are documented in the literature [10,11].

Figure 17:
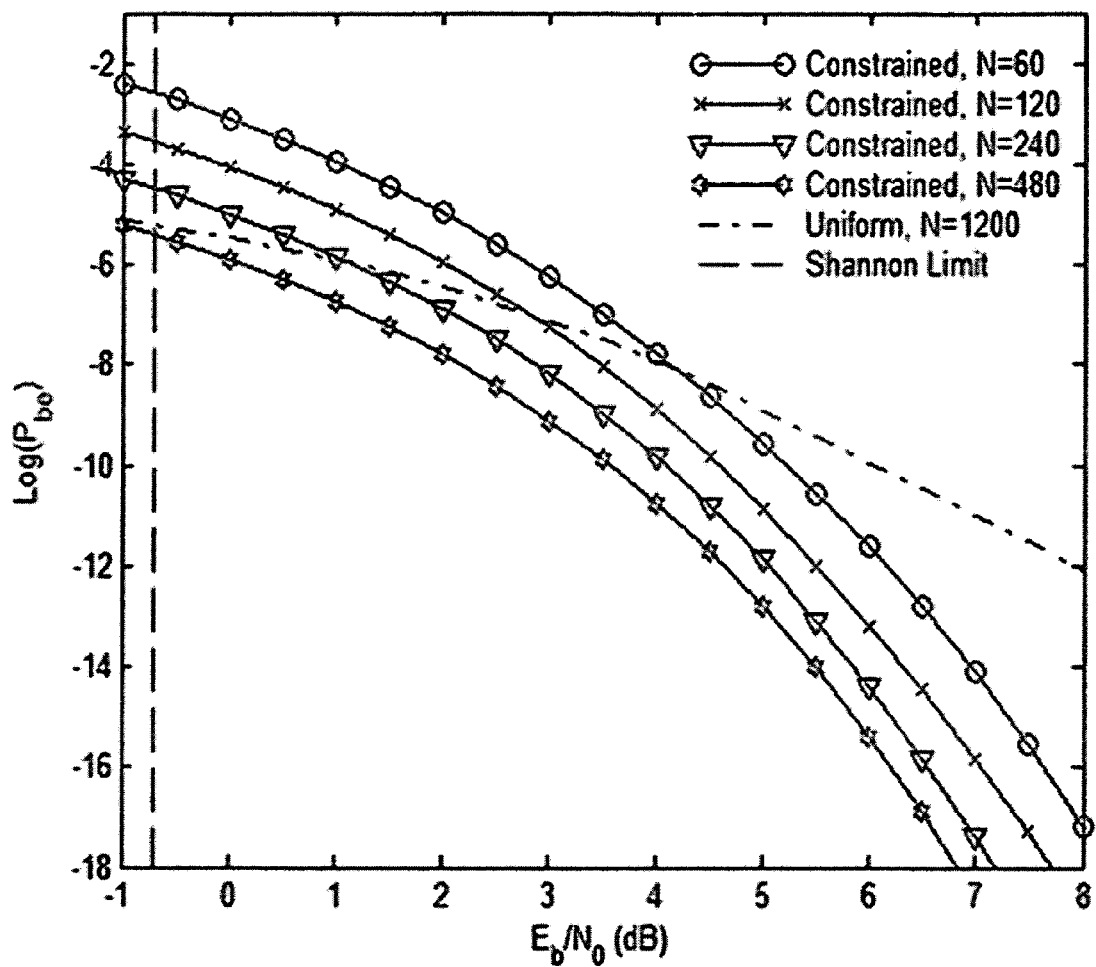
FIG. 17 shows the bit error rate performance curve of a serial concatenation of an outer (15,10) extended Hamming code and an inner code that is a rate ⅔ punctured recursive convolutional code with 4 states; the Shannon limit is also plotted.

FIG. 17 shows the bit error rate performance curve of a serial concatenation of an outer (15,10) extended Hamming code and an inner code that is a rate ⅔ punctured recursive convolutional code with 4 states. The Shannon limit is also plotted. Again it is noticed that the SC-IRCC with constrained interleaving achieves interleaver gain. Also, this SC-IRCC performs significantly better than when implemented with uniform interleaving. Importantly, this SC-IRCC performs much closer to the Shannon limit at the 10$^{-5}$ error rate than Turbo codes and multilevel codes as discussed in [17,18] with a much shorter interleaver.

The best Turbo code reported in [17] uses 16 states and interleaver length of N=1000 to get to within 4.81 dB of the Shannon limit at the 10$^{-8}$ error rate. This can be compared to the SC-IRCC of FIG. 17 that uses an inner code with only two states and an interleaver of length N=120 to similarly get to within 4.81 dB of the Shannon limit. Alternatively, if improved performance is desired, this same SC-IRCC with its 2 state inner code can be used with an interleaver of length N=240 to perform within about 2.8 dB of the Shannon limit at the 10$^{-8}$ error rate.

At this point some design methods are presented for the design of serial concatenated codes that are targeted for implementation with a constrained interleaver. In the design of SC-BC's, the objective is to try to achieve the performance lower bound of the concatenation. As it is seen from equation (8), the lower bound is determined by the product of the minimum distances $d_o d_i$, while the error coefficient $\lambda_2$ depends on the number of codewords of the outer code with minimum distance $d_0$. For two selected block codes, while the product of $d_o d_i$ does not depend on which code is selected as the outer or the inner code, the error coefficient $\lambda_2$ can be lowered by selecting the code that has the lower number of codewords with minimum distance as the outer code. Usually smaller codes have lower number of codewords with minimum distance. Therefore it is most often desirable to employ the smaller code as the outer code in serial concatenation of block codes with constrained interleaving. In general, the design approach is to select the component codes to provide a desired $d_o d_i$ and to minimize the error coefficient $\lambda_2$. However, if the interleaver gain is the biggest focus, it is possible to employ the bigger code as the outer code and the smaller code as the inner code.

In addition, the constrained-interleaved SC-BC approach can be applied to non-binary codes like non-binary BCH codes (BCH=BCH code's inventor's initials) and RS (Reed-Solomon) codes. The most desirable way to handle non-binary codes is to do the coding on non-binary symbols and then convert the coded symbols back to binary bits for interleaving and transmission. The transmission can however be done by mapping bits on to higher order symbols through a mapper. As discussed before with block codes, non-binary codes which are usually powerful codes can be preferably used as the inner code. For example, if a powerful RS code is used as an inner code its minimum distance can be doubled by employing an outer SPC code and employing constrained interleaving thereby targeting a 3 dB gain. However, by targeting the interleaver gain the RS code can be used as the outer code and the SPC can be used as the inner code. In this configuration, preferably the codewords of the RS code can be converted back into bits and constrained interleaved. However, if desired, the interleaving can also be done on symbols. Interleaving on bits increases the number of columns and thereby increases the interleaver gain. This class of SC-BCs designed using constrained interleaving have potential applications in high speed communications such as in systems that follow the ITU G.709 standard.

Non-binary codes can also be used with constrained interleaving with inner recursive convolutional codes to generate attractive SC-IRCCs. Some specific design methods can be summarized as follows:
1. Use a powerful RS outer code with a full rate IRCC. This does not change the minimum distance of the RS code but due to the IRCC it can achieve interleaver gain.
2. Use a powerful RS outer code with high rate IRCC. This can increase the minimum distance and achieve interleaver gain. High rate recursive convolutional codes are found in the literature, e.g., see [10] or [19] F. Daneshgaran, M. Laddomada and M. Mondin, "An extensive search for good punctured rate k/(k+1) recursive convolutional codes for serially concatenated convolutional codes", IEEE Trans. Inform. Theory, vol. 50, pp. 208-217, January 2004; or [20] A. G. Amat, G. Montrosi and S. Benedetto, "Design and Decoding of optimal high-rate convolutional codes", IEEE Trans. Inform. Theory, vol. 50, pp. 267-881, May 2004.

In bit-interleaved coded modulation (BICM), coded bits are interleaved and mapped on to a transmitted symbol. Hence, there is no inner code, and the BICM mapper/modulator acts as the inner code in comparison with serially concatenated codes. Iterative decoding can be used with BICM by running iterations between the decoder and the demodulator. It is known that BICM can perform well over fading channels. Constrained interleaving can be preferably employed with BICM. When the interleaver array is formed as with serial concatenation, the coded bits can be fed along columns to the mapper. Hence, if 8-PSK is used for transmission, the interleaver array can be constructed with 3 rows (r=3) by ensuring that the coded bits of the outer code are placed in different columns. For example, if the code has minimum distance of 4, it will be guaranteed that at least 4 symbols will be different for any two transmitted sequences. In BICM applications with constrained interleaving, the constrained interleaver can be preferably constructed similar to that in SC-BC shown in FIG. 8. The optimal mapping of symbols with constrained interleaving can very well be different from that with random interleaving. Hence, it is necessary to optimize the mapping with each selected code with constrained interleaving. For example, SPC outer codes (with minimum distance 2), or Hamming codes (with minimum distance 3), or shortened Hamming codes (with minimum distance 4), or any other code can be combined with BICM using the SC-BC with constrained interleaving to improve performance.

Low-density-parity-check (LDPC) codes and related encoding and decoding thereof are known in the literature, for example, see: [21] R. M. Tanner, D. Sridhara, A. Sridharan, T. E. Fuja, D. J. Costello, "LDPC block and convolutional codes based on circulant matrices", IEEE Trans. on Inform. Theory, vol. 50, pp. 2966-2984, December 2004; [22] M. Esmeili and M. Gholami, "Geometrically-structured maximum-girth LDPC block and convolutional codes", IEEE Journal on Selected Areas in Communications, vol. 27, pp. 831-845, August 2009; [23] J. Kang, Q. Huang, L. Zhang, B. Zhou and S. Lin, "Quasi-cyclic LDPC codes: An algebraic construction", IEEE Trans. on Commun., vol. 58, pp. 1383-1396, May 2010; [24] Y. Han and W. E. Ryan, "Low-floor decoders for LDPC codes", IEEE Trans. on Commun., vol. 57, pp. 1663-1673, June 2009; [25] M. Lentmaier, A. Sridharan, D. J. Costello, Jr. and K. Zigangiro, "Iterative decoding threshold analysis for LDPC convolutional codes," IEEE Transactions on Inform. Theory, Vol. 56, No. 10, October 2010, pp. 5274-5289.

Constrained interleaving can also be applied to serial concatenation that involves LDPC codes. These could include a concatenation of two LDPC codes or a concatenation of an LDPC code with any other code. In the latter case, the LDPC code can be the inner or the outer code of the concatenation. For example, if a SPC outer code is used with an inner LDPC code the minimum distance of the LDPC code can be doubled with constrained interleaving and the performance of the resulting SC-BC can approach the performance lower bound given by equation (8). If two LDPC codes are concatenated with constrained interleaving, the code structure will be similar to 2-D SPC codes, and the resulting concatenation can achieve a high distance and approach the bound in equation (8). Similarly, with constrained interleaving, if an LDPC code is used as an outer code with an inner recursive convolutional code, in addition to increasing the minimum distance, the concatenation can also achieve interleaver gain. Hence, shorter and less powerful LDPC codes can be effectively used by concatenating with other codes and using constrained interleaving to generate powerful concatenated codes. In the literature LDPC convolutional codes are also known [25]. Similar to using an inner IRCC, a recursive implementation of a LDPC convolutional code can be efficiently used as an inner code along with an outer code with constrained interleaving.

It is known that LDPC codes can be decoded by considering variable nodes (also known as bit nodes) and check nodes of the code. Reviewing the literature [21-24], the variable nodes are the nodes that correspond to the coded bits while check nodes are those constructed according to the parity check equations of the code. Hence, for a (q,k) LDPC code, there are q variable nodes and a number of check nodes is equal to the number of independent parity check equations which can be derived for the given code. The Tanner graph of the LDPC code is then constructed by connecting the corresponding variable nodes to each of the check nodes according to the parity check equation of that check node.

LDPC codes are usually decoded by first assigning the soft estimates of the variable nodes from the received signals. Then the soft estimates of the check nodes are obtained using those of the variable nodes and following the connections on the Tanner graph. Then decoding is continued by running iterations between variable nodes and check nodes by exchanging extrinsic information until the stopping criterion is met or the highest allowable number of iterations is reached. In LDPC codes the stopping criterion is met when all parity check equations are satisfied. This iterative algorithm for decoding LDPC codes is referred to as the sum product algorithm (SPA) in the literature (for example, see the text book by Lin & Costello as cited in the background section herein).

Let us now focus on a serially concatenated code with a LDPC code used as a component code. For example, following the notations herein used with SC-BC, let us consider an (q,k) outer code concatenated with an (n,k) inner code and using constrained interleaving. As explained before, such an interleaver can be constructed in a q×m rectangular 2-dimensional (2-D) array. The received signal corresponding to a frame can be arranged in a n×m array with each column corresponding to a codeword of the inner code, while the coded bits of the codewords of the outer code are scattered throughout the interleaver according to the permutation policy used in the constrained interleaver. This follows the initial decoding processing as described in further detail in connection with block 515 of FIG. 5 above.

Such a code can be decoded by first loading the received sequence in an n×m array corresponding to the transmitted sequence. Then decoding can be done by directly employing the decoder shown in FIG. 5 by individually decoding the inner and the outer codes and exchanging extrinsic information through the interleaver/de-interleaver. However, noticing that the component LDPC code (when used as the inner or outer code) requires iterations within it, this direct method increases complexity. Instead, the concatenated code can be more efficiently decoded by moving to the other code after a fixed number, such as one or more iterations of the LDPC code using the updated extrinsic information of the q×m array. This way the iterations of the LDPC code will be guided by the influence of the other code.

For example, consider iterative decoding of an SPC outer code with an LDPC inner code. The multiple codewords of the inner LDPC code in the q×m interleaver array are decoded using the Tanner graph of the LDPC code. After the first iteration of all inner codewords, extrinsic information is available for all array elements in the q×m array. This extrinsic information can then be used by the codewords of the outer SPC code to decode the outer code and to further update the extrinsic information of the interleaver array. Then this further updated extrinsic information can be used to run the next iteration of the LDPC decoder. Hence, in this method the outer code can be used within iterations of the LDPC code to guide the LDPC iterations. In general, when a LDPC code is used as a component code, it is possible to move to the next code after each iteration of the LDPC decoder thereby using the other code to guide the iterations of the LDPC code. This method reduces the decoding complexity compared with a direct implementation of the decoder structure of FIG. 5 where the LDPC codes are iterated until a stopping criterion is met each pass through the decoder 5. This modified decoding method can be used when at least one component code is decoded as a LDPC code.

The above decoding policy leads to the first proposed decoding algorithm, SC-LDPC Decoding Algorithm I, which can be used when at least one component code of a serial concatenation is decoded as a LDPC code. The decoding steps involved in the SC-LDPC Decoding Algorithm I can be listed as follows:

SC-LDPC Decoding Algorithm I

1. Load the received samples in an n×m array
2. Soft decode the inner code starting with the received bit metrics and using the soft decoder 515.

(a) If the inner code is a regular block code soft decode the inner code. If BCJR iterations are used, run one forward and one backward pass through the BCJR algorithm. If the regular block code is being decoded as a LDPC code, run one iteration between variable nodes and check nodes.

(b) If the inner code is the LDPC code, run one iteration (or some other fixed number of iterations) of that LDPC code decoder. In the case of an LDPC decoder, as is known in the literature (see [21]-[24]), one iteration means one update of the check nodes and coming back to variable nodes once.

Perform the appropriate operation (a) or (b) on each of the m inner codewords to obtain extrinsic information of all q×m interleaver array bits.

3. De-interleave the extrinsic information 520 to prepare for decoding of the outer code.
4. Soft decode the outer code.

(a) If the outer code is the LDPC code, run one iteration (or some other fixed number of iterations) of the soft decoder 525, using LDPC decoder. This iteration involves one update of the check nodes and coming back to variable nodes in the Tanner graph once.

(b) If the outer code is a regular block code, soft decode the outer code. If BCJR iterations are used, run one forward and one backward pass through the BCJR algorithm. If the regular block code is being decoded as a LDPC code, run one iteration between variable nodes and check nodes.

Perform the appropriate operation (a) or (b) on each of the m outer codewords to obtain updated extrinsic information of all q×m interleaver array bits.

5. Run iterations until the stopping unit 530 stops them.
6. If a next iteration through the decoder 500 is needed, constrained-interleave the extrinsic information at 535 to reorder the input to the inner decoder 515 for the next iteration.

In the above steps that involve decoding of m codewords, all m codewords can be optionally decoded in parallel to speed up decoding.

When both component codes are decoded as LDPC codes, a further modification is possible, leading to a second decoding algorithm which is referred to as the SC-LDPC Decoding Algorithm II. In such cases it is possible to consider the check nodes of the both component codes as a single set of check nodes. By doing so, both component codes can be decoded simultaneously. Then iterations can be run between variable nodes and the entire set of check nodes of all codewords of both inner and outer codes simultaneously. As a result the concatenated code is decoded similar to decoding of a single LDPC code. Therefore, this further modified decoding method will reduce the complexity to a level of decoding a single LDPC code with a number of check nodes equal to the sum of check nodes of the two component codes. As stated before, block codes can be decoded as LDPC codes. Hence, this method can be used not only when both component codes are LDPC codes but also when both component codes are decoded as LDPC codes, i.e., even when one or both component codes are block codes. For example, SPC codes can be decoded as LDPC codes, so SC-LDPC Decoding Algorithm II could be applied to a concatenation of an LDPC code with an SPC code.

In serial concatenation with constrained interleaving, the variable nodes can be arranged preferably in the n×m 2-D array as described earlier and more specifically in connection with block 515 of FIG. 5. In such a situation, as stated before, every column represents codewords of the inner codeword, while the coded bits of the m codewords of the outer code are scattered across the n×m array in accordance with the permutation policy used in the interleaver. Hence, every column represents a set of variable nodes of the inner code while the set of variable nodes of the outer code of each of the outer codewords can be identified in the n×m array in accordance with the permutation function implemented by the interleaver. The corresponding check nodes of both inner code and the outer code are then formed for each of the m codewords of the outer code and also for the codewords of the inner code. Then iterations can be run simultaneously between the entire set of n×m array of variable nodes and the entire set of check nodes both from the inner and the outer code. The iterations can be run until the stopping criterion is satisfied or until the maximum allowable number of iterations is reached. In case of LDPC decoding the stopping criterion can simply be when all parity check equations of every codeword of both inner and outer codes are satisfied, or stop when the highest allowable number of iterations is reached. The steps involved in the SC-LDPC Decoding Algorithm II can be listed as:

SC-LDPC Decoding Algorithm II

1. Load the received bit metrics on to the n×m 2-D variable node array.
2. Run iterations of between the variable nodes and check nodes for all codewords of both inner and outer codes. Check if the stopping criterion is satisfied at the end of each iteration. Run iterations until the stopping criterion is met or the maximum number of iterations is reached.

The method and apparatus of the LDPC Decoding Algorithm II follow FIG. 5 where the soft decoders 515, 525 are implemented as LDPC soft decoders. These LDPC soft decoders are configured using variable nodes and check nodes configured as described above and as outlined in the examples and discussion below.

As an example, consider the serial concatenation of an outer SPC with an inner LDPC with constrained interleaving for high speed applications like in optical communications. The decoder can be efficiently implemented by laying out the n×m 2-D variable nodes, and placing the check nodes of both the LDPC code and the SPC code around the variable nodes. For high speed applications it is desirable to directly connect the check nodes to the corresponding variable nodes. Hence, the check nodes of the SPC codes act simply as few extra check nodes in the decoding. Specifically, since SPC codes have only one check node, the increase in the number of check nodes is only m. Hence, the increase in decoding complexity due to concatenation is minimal in this example. The connections to these SPC codes should be done based on the interleaver as the corresponding coded bits of SPC codes are scattered through the array due to interleaving. Decoding in this example is preferably performed using the SC-LDPC Decoding Algorithm II as described above.

The use of the constrained interleaver creates a natural environment to place the variable nodes and check nodes on a 2-D array. The resulting 2-D layout of the variable nodes and the check nodes in both of the above LDPC Decoding Algorithms I and II make the resulting Tanner graph of the concatenation a 2-D Tanner graph. However, depending on the application any desired number of dimensions can be used by rearranging the placement of the variable and check nodes in any desirable manner while maintaining the same connections. For example, it is also known that at high speed communications, such as in optical communications, the most efficient way to decode LDPC codes is to hard wire the appropriate connections between variable nodes and check nodes. In such situations, in order to shorten the connections from the variable nodes to check nodes, the structure of the Tanner graph can be modified in a desirable manner depending on the application using any desirable number of dimensions. It is known in the literature, once the lengths of the connections from variable nodes to check nodes increase they can cause issues which are referred to as networking issues in the literature. As noted above in the discussion of the SC-LDPC Decoding Algorithm I, different embodiments can be constructed that either move to the next decoder after a single iteration or move to the next decoder after a maximum number of allowable iterations has been performed. For example, if the LDPC decoder satisfies its own set of parity check equations after a single iteration, it can move to the next decoder. If not, it can run more iterations up to a pre-selected maximum number of iterations before moving into the next decoder.

It should be noted that even though the above LDPC Decoding Algorithms I and II are described with serially concatenated codes that use constrained interleaving, they are stand-alone inventive algorithms that can be used with serially concatenated codes that use uniform or any other type of interleaving or no interleaving at all. Likewise, these two decoding algorithms can also be used even with parallel concatenation of codes with at least one LDPC code or at least one code that employs LDPC decoding.

Like other serially concatenated codes with constrained interleaving, serial concatenation of LDPC codes with constrained interleaving with another code can significantly improve the performance of LDPC codes. This allows shorter less powerful LDPC codes to be used as component codes in the concatenation to thereby produce simpler and more powerful concatenated codes. Due to shorter LDPC component codes in the concatenation, the resulting Tanner graph can be smaller than that of an individual long LDPC code thereby reducing or eliminating the networking problems that are present with LDPC codes. Further, it is also known that iterative decoding of long LDPC codes experience undesirable error floors. The focus in the literature to combat the floor problems in LDPC codes has primarily on post-processing techniques [24]. However, as explained earlier in connection with SC-BC's, serial concatenation with constrained interleaving can eliminate these undesirable error floors. That is, the same properties of SC-BCs that solved the error floor problem apply to SC-LDPCs. Shorter LDPC codes serially concatenated with other codes using constrained interleaving can achieve high distances and generate powerful concatenated codes. These codes can be iteratively decoded efficiently, eliminate the error floor problems, and also reduce or eliminate the networking problems present with long LDPC codes.

In serial concatenation, LDPC codes can be used as outer codes where the inner code is an IRCC. Such a SC-IRCC configuration with constrained interleaving is particularly advantageous in that it can achieve a very high distance and at the same time a significant interleaver gain. Hence, this combination can be an attractive combination for many applications and embodiments as discussed hereinabove. SC-IRCCs with an LDPC outer code can be decoded by using the SC-LDPC decoding algorithm I described above. In addition, recursive implementation of LDPC convolutional codes can be used as inner codes of a SC-IRCC with constrained interleaving. In this case, LDPC Decoding Algorithm II can be used to decode the SC-IRCC that uses the LDPC as an outer code.

Although the present invention has been described with reference to specific embodiments, other embodiments may occur to those skilled in the art without deviating from the intended scope. Figures showing block diagrams also identify corresponding methods as well as apparatus. All "transmitted signals" shown in the Figures can be applied to various types of systems, such as cable modem channels, digital subscriber line (DSL) channels, individual orthogonal frequency division multiplexed (OFDM) sub-channels, and the like. Systems can be configured whereby a transmitter sends information to a receiver, for example on a wireless OFDM channel used in WiFi and WiMAX systems. In general, more than two component codes can be concatenated together, and embodiments can be created that mix parallel and serial concatenation to form mixed parallel/serial concatenated codes. In such cases the constrained interleaving can be performed on any component-encoded or concatenated encoded bit stream to be interleaved within the mixed encoder structure to satisfy a constraint that is designed to jointly optimize or otherwise improve bit error rate performance by jointly increasing a measure of minimum distance and reducing the effect of one or more dominant error coefficients of the mixed encoded bit stream. The concepts presented herein can be extrapolated to these higher order cases by induction. The present invention can generate coded schemes that eliminate the undesirable error floor effects present in known serial and parallel concatenated codes. This attractive property makes serial concatenated codes with constrained interleaving a potential coding scheme for low error rate applications such as in optical communications and in magnetic recording. Hence it is noted that all such embodiments and variations are contemplated by the present invention.

What we claim is:

1. A communications apparatus comprising:
a constrained interleaver configured to rearrange an ordering of a sequence of N=rm input bits in accordance with a permutation function in order to produce a permuted sequence of output bits, wherein N and m are positive integers, m>1, and the rearrangement of the ordering in accordance with the permutation function is equivalent to performing the following operations:
applying a word-level pseudo-random permutation function to pseudo-randomly rearrange an ordering of a plurality of multi-bit words embedded in the sequence of N=rm input bits;
loading the N=rm number of input bits into a r×m array of bits, wherein the r×m array has r rows and m columns, and the bits are serially loaded into the r×m array of bits along rows,
applying an $i^{th}$ pseudo-random row permutation function to each row i, for i=1, 2, . . . r, wherein the $i^{th}$ pseudo-random row permutation function pseudo-randomly rearranges an ordering of m bits in the $i^{th}$ row,
reading bits out of the r×m array along r-bit columns to form the permuted sequence of output bits.

2. The communications apparatus of claim 1, wherein m=ρn, where ρ and n are positive integers, and each multi-bit word corresponds to an n-bit word, whereby there are ρ number of n-bit words per row.

3. The communications apparatus of claim 1, wherein each of the plurality of multi-bit words corresponds to a multi-bit codeword associated with a corresponding component code.

4. The communications apparatus of claim 1, wherein the serially loaded bits into the r×m array of bits along rows corresponds to a row-major order.

5. The communications apparatus of claim 1, wherein the reading bits out of the r×m array along r-bit columns corresponds to a column-major order.

6. The communications apparatus of claim 1, wherein the reading bits out of the r×m array along r-bit columns is performed from top to bottom in each r-bit column during the reading of the bits out of the r×m array.

7. The communications apparatus of claim 1, wherein each of the permutation function, the word-level pseudo-random permutation function, and the $i^{th}$ pseudo-random row permutation function, for i=1, 2, . . . q, corresponds to a respective pseudo randomization that is predetermined prior to a runtime, wherein the runtime corresponds to a time when the constrained interleaver performs the rearrangement of the ordering in accordance with the permutation function.

8. The communications apparatus of claim 7, further comprising:
at least one vector of pointers configured for use, at the runtime, to facilitate the rearrangement of the ordering in accordance with the permutation function.

9. The communications apparatus of claim 8, wherein the at least one vector of pointers is used to facilitate table lookup operations.

10. The communications apparatus of claim 1, further comprising:
an outer encoder configured to transform a sequence of input bits to the sequence of N=rm input bits, wherein the sequence of N=rm input bits is encoded in accordance with an outer code, and the outer code is a member of the group consisting of a block code, a LDPC (Low Density Parity Check) code, a convolutional code transformed to a block code, and a non-recursive convolutional code;
an inner encoder configured to transform the permuted sequence of output bits to a sequence of inner-encoded bits, wherein the sequence of inner-encoded bits is encoded in accordance with an inner code;
wherein the outer code has a minimum Hamming distance of $d_o$ and the inner code has a minimum Hamming distance of $d_i$;
whereby the sequence of inner-encoded bits constitutes a serially-concatenated sequence of bits that incorporates coding from both the inner code and the outer code in accordance with a serially-concatenated code that has a minimum Hamming distance of $d_{sc}$, and $d_i < d_{sc} \leq d_o d_i$.

11. The communications apparatus of claim 10, wherein the value of the integer r is selected to be high enough to enforce $d_{sc} = d_o d_i$.

12. The communications apparatus of claim 10, wherein the sequence of input bits corresponds to a sequence of input message bits, and the sequence of N=rm input bits corresponds to a sequence of r×m encoded bits.

13. The communications apparatus of claim 10, wherein the outer code is a block code and the block code is a non-binary code which is a member of the group consisting of a BCH code and a Reed-Solomon (RS) code.

14. The communications apparatus of claim 10, wherein the convolutional code transformed to a block code includes one or more termination bits.

15. The communications apparatus of claim 14, wherein the one or more termination bits comprises a complete set of termination bits, whereby the convolutional code transformed to a block code is an equivalent block code where the convolutional code is terminated.

16. The communications apparatus of claim 10, further comprising:
a signal mapper configured to map the sequence of inner-encoded bits to a transmission signal.

17. The communications apparatus of claim 10, further comprising:
a signal mapper configured to map a sequence of encoded bits to a transmission signal, wherein the encoded bits include coding from at least both the inner encoder and the outer encoder.

18. The communications apparatus of claim 17, wherein the transmission signal is a member of the group consisting of an optical communication signal and a wireless communication signal.

19. The communications apparatus of claim 18, wherein the communications apparatus is a member of the group consisting of a headend system configured to communicate with a plurality of user devices, a user device configured to communicate with the headend system, a peer-to-peer communication device, an optical communications device, an optical communications device configured to support a backbone link, an optical communications device configured to support backbone Internet traffic, a cellular communications headend system, a cellular mobile communications device, and a mobile user data enabled communications device.

20. The communications apparatus of claim 1, further comprising:
an outer encoder configured to transform a sequence of input bits to the sequence of r×m input bits, wherein the sequence of N=rm input bits is encoded in accordance with an outer code, and the outer code is a member of the group consisting of a block a code, a LDPC (Low Density Parity Check) code, a convolutional code transformed to a block code, and a non-recursive convolutional code;
an inner encoder configured to transform the permuted sequence of output bits to a sequence of inner-encoded bits, wherein the sequence of inner-encoded bits is encoded in accordance with an inner code; and
wherein the outer code has a minimum Hamming distance of $d_o$ and the inner code has a minimum Hamming distance of $d_i$;
whereby the sequence of inner-encoded bits constitutes a serially-concatenated sequence of bits that incorporates coding from both the inner code and the outer code in accordance with a serially-concatenated code that has a minimum Hamming distance of $d_{sc}$,
wherein the value of the integer r is selected to be high enough to enforce $d_{sc} = d_0 d_i$; and
wherein each $i^{th}$ pseudo-random row permutation function for i=1, 2, . . . r includes a further constraint that enforces a limit on the number of columns of the r×m array of bits that can share bits from at least one codeword on the $i^{th}$ row and at least one second codeword on at least one different row, to thereby further enforce $d_{sc} > d_0 d_i$.

21. The communications apparatus of claim 20, wherein the number of columns of the r×m array of bits that can share bits from the at least one codeword on the $i^{th}$ row and the at least one second codeword on at the least one different row is limited to $d_0 - 1$.

22. The communications apparatus of claim 20, wherein the permutation function is further equivalent to performing the following additional operations:
(i) randomly selecting a row and checking to see whether at least one individual constraint is met, wherein the individual constraint requires that a minimum column separation is satisfied between coded bits of the at least one codeword on the selected row;
(ii) randomly selecting another row and checking to see whether the at least one of the individual constraint is met and also checking whether a plurality of joint constraints is met with already selected rows, wherein the joint constraint identifies to not allow two or more bits from two different outer codewords to be placed along any single column of the r×m array, and when both the individual and when all of the joint constraints are met, to move to action (iii), if not, keep randomizing the selected row again until all of the joint constraints are met; and
(iii) repeat action (ii) until all rows are selected.

23. The communications apparatus of claim 20, further comprising:
a signal mapper configured to map a sequence of encoded bits to a transmission signal, wherein the encoded bits include coding from at least both the inner encoder and the outer encoder.

24. The communications apparatus of claim 23, wherein the communications apparatus is a member of the group consisting of a headend system configured to communicate with a plurality of user devices, a user device configured to communicate with the headend system, a peer-to-peer communication device, an optical communications device, an optical communications device configured to support a backbone link, an optical communications device configured to support backbone Internet traffic, a cellular communications headend system, a cellular mobile communications device, and a mobile user data enabled communications device.

25. The communications apparatus of claim 23, wherein the transmission signal is an optical communication signal.

26. The communications apparatus of claim 23, wherein the transmission signal is a wireless communication signal.

27. The communications apparatus of claim 1, further comprising:
an outer encoder configured to transform a sequence of input bits to the sequence of N=rm input bits, wherein the sequence of N=rm input bits is encoded in accordance with an outer code, the outer code is a member of the group consisting of a block code, a LDPC (Low Density Parity Check) code, a convolutional code transformed to a block code, and a non-recursive convolutional code, and the outer code has a minimum Hamming distance of $d_o$.

28. The communications apparatus of claim 27, further comprising:
a Bit-Interleaved Coded Modulation (BICM) mapper configured to receive respective groups of bits from the permuted sequence of output bits and to transform each respective group of bits into a respective BICM transmit symbol, to thereby form a sequence of BICM transmit symbols.

29. The communications apparatus of claim 28, wherein each respective BICM transmit symbol corresponds to an r-bit BICM transmit symbol.

30. The communications apparatus of claim 29, whereby at least $d_o$ number of the r-bit BICM transmit symbols differ between any two different transmitted sequences of the r-bit BICM transmit symbols.

31. The communications apparatus of claim 30, wherein each r-bit BICM transmit symbol is drawn from a $2^r$-ary constellation, and a mapping policy performed by the BICM mapper of the r-bit columns is optimized to take into account the permutation function of the constrained interleaver and at least one property of the outer code in order to minimize a measure of bit error probability.

32. The communications apparatus of claim 28, wherein communications apparatus is further configured to use the sequence of BICM transmit symbols to produce a transmission signal, and the transmission signal is a member of the group consisting of a wireless communication signal and an optical communication signal.

33. The communications apparatus of claim 32, wherein the transmission signal is a member of the group consisting of a phase-shift keyed (PSK) signal, a quadrature amplitude modulated (QAM) signal, and an orthogonal frequency division multiplexed (OFDM) signal, a multidimensional trellis coded modulation signal, and multidimensional coded modulation signal.

34. The communications apparatus of claim 1, further comprising:
a signal conditioning unit coupled to receive a received signal and configured to produce therefrom a vector of bit metrics, wherein the received signal is a received version of a transmitted signal that was serially-concatenated encoded by a serially-concatenated encoder that coupled an outer encoded bit stream via a second constrained interleaver to an inner encoder, wherein the second constrained interleaver implements the permutation function.

35. The communications apparatus of claim 34, further comprising:
a first decoder function configured to decode its input to generate a vector of inner-code extrinsic information, wherein the first decoder function decodes in accordance with the inner code and the input is initially the vector of bit metrics and subsequently an interleaved vector of outer-code extrinsic information along with the vector of bit metrics;
a first constrained deinterleaver function that is configured to deinterleave the vector of inner-code extrinsic information in accordance with an inverse permutation function that is the inverse of the permutation function, wherein the first constrained deinterleaver function produces a deinterleaved vector of inner-code extrinsic information; and
a second decoder function configured to decode the deinterleaved vector of inner-code extrinsic information to generate a vector of outer-code extrinsic information, wherein the second decoder function decodes in accordance with the outer code.

36. The communications apparatus of claim 35, further comprising:
a stopping criterion function configured to determine whether a measure of the outer-code extrinsic information has successfully passed a convergence test or whether a maximum number of iterations has been reached;
wherein the constrained interleaver is configured to interleave the vector of outer-code extrinsic information in accordance with the permutation function, wherein the constrained interleaver produces an interleaved vector of outer-code extrinsic information;
wherein the receiver apparatus is configured to apply iterative decoding to iteratively apply the first and second soft decoders until stopping criterion function indicates to stop iterations, and once the convergence test has been met, to then provide a decoded bit sequence produced by the second decoder function.

37. The communications apparatus of claim 36, wherein the a first decoder function and the a second decoder function are both configured to apply soft decoding operations.

38. The communications apparatus of claim 35, further comprising:
a second constrained deinterleaver function configured to deinterleave the vector of bit metrics in accordance with the inverse permutation function, wherein the second constrained deinterleaver function produces a deinterleaved vector of bit metrics;
wherein the second decoder function is further configured to decode the deinterleaved vector of inner-code extrinsic information along with the deinterleaved vector of bit metrics to generate the vector of outer-code extrinsic information.

39. The communications apparatus of claim 38, further comprising:
a stopping criterion function configured to determine whether a measure of the outer-code extrinsic information has successfully passed a convergence test or whether a maximum number of iterations has been reached;
wherein the constrained interleaver is configured to interleave the vector of outer-code extrinsic information in accordance with the permutation function, wherein the constrained interleaver produces an interleaved vector of outer-code extrinsic information;
wherein the receiver apparatus is configured to apply iterative decoding to iteratively apply the first and second soft decoders until stopping criterion function indicates to stop iterations, and once the convergence test has been met, to then provide a decoded bit sequence produced by the second decoder function.

40. The communications apparatus of claim 39, wherein the a first decoder function and the a second decoder function are both configured to apply soft decoding operations.

41. A communications apparatus comprising:
a constrained interleaver configured to rearrange an ordering of a sequence of N=rρn input coded symbols in accordance with a permutation function in order to produce a permuted sequence of N=rρnm coded output bits, wherein each coded symbol comprises m bits, and N, r, ρ, n and m are positive integers and the rearrangement of the ordering in accordance with the permutation function is equivalent to performing the following operations:
applying an n-coded-symbol codeword level permutation function to randomize an ordering of rρ number of n-coded symbol codewords embedded in the sequence of N=rρn input coded symbols;
loading rρn number of input coded symbols from the sequence of N=rρn input coded symbols into a r×ρn array of coded symbols, wherein the r×ρn array has r rows and ρn columns, and the coded symbols are serially loaded into the r×ρn array of coded symbols along rows with ρ number of n-coded symbol codewords per row, to provide ρnm coded bits in the $i^{th}$ row, applying an $i^{th}$ pseudo-random row permutation function to each row i, for i=1, 2, ... r, wherein the $i^{th}$ pseudo-random row permutation function pseudo-randomly rearranges an ordering of the ρnm coded bits in the $i^{th}$ row, reading rρnm coded bits out of the r×ρn array along r-bit columns to form the permuted sequence of N=rρnm coded output bits.

42. The communications apparatus of claim 41, wherein each of the permutation function, the n-coded-symbol codeword level permutation function, and the $i^{th}$ pseudo-random row permutation function, for i=1, 2, ... q, corresponds to a respective pseudo randomization that is predetermined prior to a runtime, wherein the runtime corresponds to a time when the constrained interleaves performs the rearrangement of the ordering in accordance with the permutation function.

43. The communications apparatus of claim 42, further comprising:
at least one vector of pointers con figured for use, at the runtime, to facilitate the rearrangement of the ordering in accordance with the permutation function.

44. The communications apparatus of claim 43, wherein the at least one vector of pointers is used to facilitate table lookup operations.

45. The communications apparatus of claim 41, wherein the input coded symbols are coded symbols of a non-binary code, and the non-binary code is a member of the group consisting of a BCH code and a Reed-Solomon (RS) code.

46. The communications apparatus of claim 41, wherein the input coded symbols are coded symbols of a Reed-Salomon (RS) code and a first plurality of the input coded symbols correspond to message symbols and a second plurality of the coded symbols correspond to parity symbols.

47. The communications apparatus of claim 41, wherein each of the $i^{th}$ pseudo-random row permutation function for i=1, 2, ... r, pseudo-randomly rearranges an ordering of the ρnm coded bits in the $i^{th}$ row in groups of m-bit coded symbols by pseudo-randomly rearranging the order of the ρn coded symbols in the $i^{th}$ row.

48. The communications apparatus of claim 47, wherein the reading the rρnm coded bits out of the r×ρn array along r-bit columns to form the permuted sequence of N=rρnm coded output bits comprises reading groups of m-bit coded symbols out of the array along r-bit columns to form a permuted sequence of N=rρn output coded symbols.

49. The communications apparatus of claim 41, further comprising:
an outer encoder configured to transform a sequence of input message bits to the sequence of N=rρn input coded symbols;
an inner encoder configured to transform the permuted sequence of N=rρnm coded output bits to a sequence of inner-encoded bits, wherein the sequence of inner-encoded bits is encoded in accordance with an inner code;
wherein the outer code has a minimum Hamming distance of $d_o$ and the inner code has a minimum Hamming distance of $d_i$;
whereby the sequence of inner-encoded bits constitutes a serially-concatenated sequence of bits that incorporates coding from both the inner code and the outer code in accordance with a serially concatenated code that has a minimum Hamming distance of $d_{sc}$, and $d_i < d_{sc} \leq d_o d_i$.

50. The communications apparatus of claim 49, wherein the value of the integer r is selected to be high enough to enforce $d_{sc} = d_o d_i$.

51. The communications apparatus of claim 50, wherein each $i^{th}$ pseudo-random row permutation function for i=1, 2, ... r includes a further constraint that enforces a limit on the number of columns of the r×ρn array of bits that can share bits from at least one codeword on the $i^{th}$ row and at least one second codeword on at least one different row, to thereby further enforce $d_{sc} > d_o d_i$.

52. The communications apparatus of claim 41, further comprising:
a Bit-Interleaved Coded Modulation (BICM) mapper configured to receive respective groups of bits from the permuted sequence of N=rρnm coded output bits and to transform each respective group of bits into a respective BICM transmit symbol, to thereby form a sequence of BICM transmit symbols.

53. The communications apparatus of claim 52, wherein each respective BICM transmit symbol corresponds to an r-bit BICM transmit symbol.

54. The communications apparatus of claim 41, wherein the input coded symbols are coded symbols of a non-binary code, and the non-binary code is a member of the group consisting of a BCH code and a Reed-Solomon (RS) code.

55. The communications apparatus of claim 41, further comprising:
a signal conditioning unit coupled to receive a received signal and configured to produce therefrom a vector of bit metrics, wherein the received signal is a received version of a transmitted signal that was serially-concatenated encoded by a serially-concatenated encoder that coupled an outer encoded bit stream via a second constrained interleaver to an inner encoder, wherein the second constrained interleaver implements the permutation function.

56. The communications apparatus of claim 55, further comprising:
a first decoder function configured to decode its input to generate a vector of inner-code extrinsic information, wherein the first decoder function decodes in accordance with the inner code and the input is initially the vector of bit metrics and subsequently an interleaved vector of outer-code extrinsic information along with the vector of bit metrics;
a first constrained deinterleaver function that is configured to deinterleave the vector of inner-code extrinsic information in accordance with an inverse permutation function that is the inverse of the permutation function, wherein the first constrained deinterleaver function produces a deinterleaved vector of inner-code extrinsic information; and
a second decoder function configured to decode the deinterleaved vector of inner-code extrinsic information to generate a vector of outer-code extrinsic information, wherein the second decoder function decodes in accordance with the outer code.

57. A communications apparatus, comprising:
an outer encoder configured to transform a sequence of input bits to a sequence of outer encoded bits, wherein the sequence of outer-encoded bits is encoded in accordance with an outer code that is a member of the group consisting of an LDPC (low density parity check) code, a block code and a non-recursive convolutional code;
a constrained interleaver that is configured to implement a permutation function to permute the order of the outer-encoded bits to produce a constrained-interleaved sequence of outer-encoded bits, wherein the permutation function corresponds to a reordering of the outer-encoded bits subject to a set of pre-defined constraints;

an inner encoder configured to transform the constrained-interleaved sequence of outer-encoded bits to a sequence of inner-encoded bits, wherein the sequence of inner-encoded bits is encoded in accordance with an inner code; and whereby the sequence of inner-encoded bits constitutes a serially-concatenated sequence of bits that incorporates coding from both the inner code and the outer code in accordance with a serially-concatenated code that has a minimum distance of $d_{sc}$;

wherein the outer code has a minimum distance of $d_o$ and the inner code has a minimum distance of $d_i$; and wherein the set of pre-defined constraints serve to prevent any error event with weight less than $d_{sc} > d_o d_i$ from occurring within serially-concatenated sequence of bits.

58. The communications apparatus of claim 57, wherein the set of pre-defined constraints includes at least one inter-row constraint.

59. The communications apparatus of claim 57, wherein the permutation function is pseudo randomly selected from among all the possible permutation functions that meet the set of pre-defined constraints.

60. The communications apparatus of claim 57, wherein the inner code is a recursive convolutional code.

61. The communications apparatus of claim 57, wherein:
the outer code is member of the group consisting of a block code and a non-recursive convolutional code;
the inner code is a recursive convolutional code; and
the set of pre-defined constraints is implemented to force the permutation function to rearrange the order of a set of $N=r\rho n$ bits to be equivalent to performing the following operations:
applying a codeword-level permutation function to randomize an ordering of $r\rho$ number of n-bit outer code words embedded in an input block;
loading $r\rho n$ number of outer-encoded bits from the input block into a $r \times \rho n$ array of bits, wherein the array has r rows and $\rho n$ columns, and the bits are serially loaded into the array in row-major order with p number of n-bit outer code words per row,
applying an $i^{th}$ pseudo-random row permutation function to each row i, for i=1, 2, ... r, wherein the $i^{th}$ pseudo-random permutation function pseudo-randomly rearranges the order of $\rho n$ coded bits in the $i^{th}$ row,
reading the bits out of the array in column major order.

62. The communications apparatus of claim 61, wherein the set of pre-defined constraints include at least one inter-row constraint.

63. The communications apparatus of claim 57, wherein:
the outer code is member of the group consisting of a block code and a non-recursive convolutional code;
the inner code is a recursive convolutional code; and
the constraint is implemented to force the permutation function to rearrange the order of a set of $N=r\rho n$ bits by performing the following operations:
applying a codeword-level permutation function to randomize an ordering of $r\rho$ number of n-bit outer code words embedded in an input block;
loading $r\rho n$ number of outer-encoded bits from the input block into a $r \times \rho n$ array of bits, wherein the array has r rows and $\rho n$ columns, and the bits are serially loaded into the array in row-major order with $\rho$ number of n-bit outer code words per row,
applying an $i^{th}$ pseudo-random row permutation function to each row i, for i=1, 2, ... r, wherein the $i^{th}$ pseudo-random permutation function pseudo-randomly rearranges the order of $\rho n$ coded bits in the $i^{th}$ row.

64. The communications apparatus of claim 57, wherein $d_{sc}$, $d_0$ and $d_i$ are representative of Hamming distances.

65. The communication apparatus of claim 57, further comprising:
a signal mapper.

66. The communication apparatus of claim 57, further comprising:
a signal mapper configured to map the sequence of inner-encoded bits to a transmission signal.

* * * * *